(12) United States Patent
Ito et al.

(10) Patent No.: US 12,119,612 B2
(45) Date of Patent: Oct. 15, 2024

(54) LIGHT EMITTING ELEMENT, METHOD FOR MANUFACTURING LIGHT EMITTING ELEMENT, AND METHOD FOR DESIGNING PHASE MODULATION LAYER

(71) Applicant: HAMAMATSU PHOTONICS K.K., Hamamatsu (JP)

(72) Inventors: Akio Ito, Hamamatsu (JP); Yoshitaka Kurosaka, Hamamatsu (JP); Masahiro Hitaka, Hamamatsu (JP); Kazuyoshi Hirose, Hamamatsu (JP); Tadataka Edamura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 615 days.

(21) Appl. No.: 17/414,070

(22) PCT Filed: Dec. 11, 2019

(86) PCT No.: PCT/JP2019/048566
§ 371 (c)(1),
(2) Date: Jun. 15, 2021

(87) PCT Pub. No.: WO2020/129787
PCT Pub. Date: Jun. 25, 2020

(65) Prior Publication Data
US 2022/0037849 A1    Feb. 3, 2022

(30) Foreign Application Priority Data

Dec. 17, 2018    (JP) ................................. 2018-235289

(51) Int. Cl.
*H01S 3/10*    (2006.01)
*H01S 5/0236*    (2021.01)
(Continued)

(52) U.S. Cl.
CPC ............ *H01S 5/026* (2013.01); *H01S 5/0236* (2021.01); *H01S 5/04254* (2019.08);
(Continued)

(58) Field of Classification Search
CPC .... H01S 5/026; H01S 5/0236; H01S 5/04254; H01S 5/04256; H01S 5/11; H01S 5/34333; H01S 5/2214; H01S 5/04257
See application file for complete search history.

(56) References Cited

U.S. PATENT DOCUMENTS 9,991,669 B2    6/2018  Hirose et al.
2007/0008998 A1*  1/2007  Ohta ....................... H01L 33/32
                                                          372/43.01
(Continued)

FOREIGN PATENT DOCUMENTS

CN    103988379 A    8/2014
JP    2007-019277 A    1/2007
(Continued)

OTHER PUBLICATIONS

Yoshitaka Kurosaka et al., "Effects of non-lasing band in two-dimensional photonic-crystal lasers clarified using omnidirectional band structure", Optics Express, vol. 20, No. 19, 2012, p. 21773-p. 21783.
(Continued)

*Primary Examiner* — Kinam Park
(74) *Attorney, Agent, or Firm* — Faegre Drinker Biddle & Reath LLP

(57) ABSTRACT

The light-emitting element of an embodiment outputs a clear optical image while suppressing light output efficiency reduction, and includes a substrate, a light-emitting unit, and a bonding layer. The light-emitting unit has a semiconductor stack, including a phase modulation layer, between first and second electrodes. The phase modulation layer has a base
(Continued)

layer and modified refractive index regions, and includes a first region having a size including the second electrode, and a second region. Each gravity center of the second region's modified refractive index region is arranged by an array condition. The light from the stack is a single beam, and regarding a first distance from the substrate to the stack's front surface and a second distance from the substrate to the stack's back surface, a variation amount of the first distance along a direction on the substrate is smaller than a variation amount of the second distance.

13 Claims, 39 Drawing Sheets

(51) Int. Cl.
   *H01S 5/026* (2006.01)
   *H01S 5/042* (2006.01)
   *H01S 5/11* (2021.01)
   *H01S 5/343* (2006.01)
   *G06F 30/10* (2020.01)

(52) U.S. Cl.
   CPC ............ *H01S 5/04256* (2019.08); *H01S 5/11* (2021.01); *H01S 5/34333* (2013.01); *G06F 30/10* (2020.01); *H01S 5/3436* (2013.01)

(56) References Cited

U.S. PATENT DOCUMENTS

| 2013/0343415 | A1* | 12/2013 | Hori ...................... H01S 5/185 |
| | | | 372/38.05 |
| 2014/0348193 | A1* | 11/2014 | Noda .................... H01S 5/1218 |
| | | | 372/45.01 |
| 2018/0026419 | A1* | 1/2018 | Hirose ................ H01S 5/18394 |
| | | | 353/22 |
| 2018/0109075 | A1 | 4/2018 | Kurosaka et al. |
| 2019/0181613 | A1* | 6/2019 | Kurosaka .................. H01S 5/11 |
| 2019/0252856 | A1* | 8/2019 | Hirose .................... H01S 5/187 |

FOREIGN PATENT DOCUMENTS

| JP | 2014-027264 A | 2/2014 |
| JP | 2018-164049 A | 10/2018 |
| WO | WO-2016/148075 A1 | 9/2016 |
| WO | WO-2018/030523 A1 | 2/2018 |
| WO | WO 2018/047717 A1 | 3/2018 |

OTHER PUBLICATIONS

Yong Liang et al., "Three-dimensional coupled-wave analysis for square-lattice photonic crystal surface emitting lasers with transverse-electric polarization: finite-size effects", Optics Express, vol. 20, No. 14, 2012, p. 15945-p. 15961.

International Preliminary Report on Patentability mailed Jul. 1, 2021 for PCT/JP2019/048566.

* cited by examiner

*Fig.12A*

| A2 | A1 |
|---|---|
| A3 | A4 |

ORIGINAL IMAGE

*Fig.12B*

| A4 | A3 |
|---|---|
| A2 ROTATION | A1 ROTATION |
| A1 | A2 |
| A3 ROTATION | A4 ROTATION |

OBTAINED BEAM PATTERN

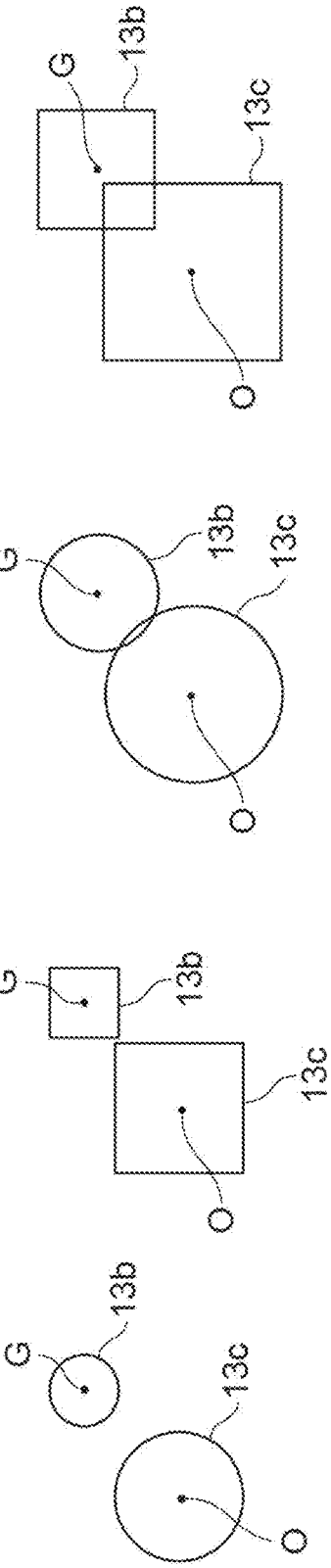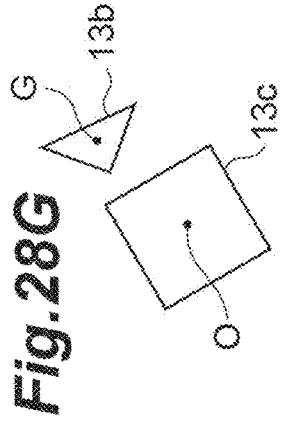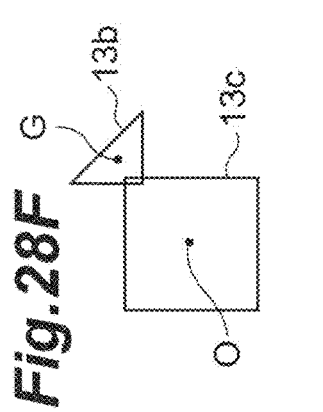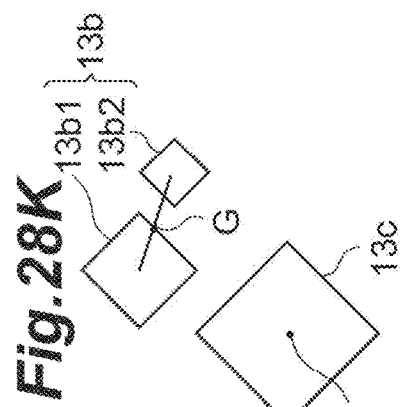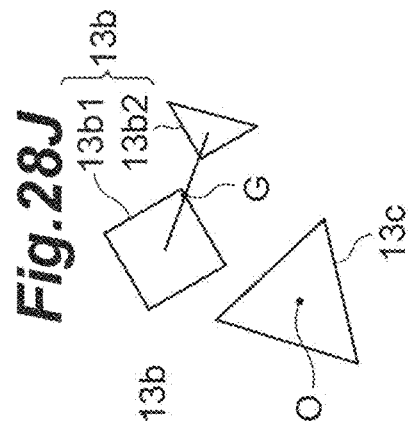

LIGHT EMITTING ELEMENT, METHOD FOR MANUFACTURING LIGHT EMITTING ELEMENT, AND METHOD FOR DESIGNING PHASE MODULATION LAYER

TECHNICAL FIELD

The present invention relates to a light-emitting element, a manufacturing method for a light-emitting element, and a phase modulation layer designing method.

BACKGROUND ART

A semiconductor light-emitting element that outputs a discretionary optical image by controlling the phase distribution and intensity distribution of light outputted from a plurality of two-dimensionally arrayed light-emitting points has been studied. One of the structures of such semiconductor light-emitting element is a structure having a phase modulation layer optically coupled with an active layer. The phase modulation layer has a base layer and a plurality of modified refractive index regions different in refractive index from the base layer. When a virtual square lattice is set in a plane perpendicular to the thickness direction of the phase modulation layer, the barycentric position of each modified refractive index region is shifted from the lattice point position of the virtual square lattice according to an optical image to be outputted. Such a semiconductor light-emitting element is called static-integrable phase modulating (S-iPM) laser, and outputs light for forming a two-dimensional optical image of a discretionary shape along a normal direction of the main surface of a substrate provided with a phase modulation layer or a tilt direction intersecting the normal direction, or both the normal direction and the tilt direction. Patent Document 1 describes a technique relating to an S-iPM laser.

CITATION LIST

Patent Literature

Patent Document 1: U.S. Pat. No. 9,991,669

Non-Patent Literature

Non-Patent Document 1: Y. Kurosaka et al., "Effects of non-lasing band in two-dimensional photonic-crystal lasers clarified using omnidirectional band structure," Opt. Express 20, 21773-21783 (2012)

Non-Patent Document 2: Y. Liang et al., "Three-dimensional coupled-wave analysis for square-lattice photonic crystal surface emitting lasers with transverse-electric polarization: finite-size effects," Optics Express 20, 15945-15961 (2012)

SUMMARY OF INVENTION

Technical Problem

As a result of examining a conventional light-emitting element, the inventors have found the following problems. That is, as described above, in the S-iPM laser, the two-dimensional, discretionary-shaped optical image is outputted in the normal direction of the main surface of the substrate or the tilt direction intersecting with the normal direction, or both the normal direction and the tilt direction. Therefore, an optical image is outputted from either the front surface of the semiconductor stack including the phase modulation layer formed on the substrate or the back surface of the substrate. For example, when the back surface of the substrate is flatter (less uneven) than the front surface of the semiconductor stack, the back surface of the substrate is selected as the optical image output surface. This is because the less uneven the optical image output surface is, the clearer the optical image becomes. In a certain example, a phase modulation layer is formed by first forming a semiconductor layer as a base layer, forming a plurality of holes in the semiconductor layer by etching or the like, and then forming another semiconductor layer (e.g., cladding layer) on the base layer (semiconductor layer) so as to cover the holes. At this time, unevenness is generated on the surface of another semiconductor layer due to the influence of the plurality of holes. The unevenness impairs the flatness of the front surface of the semiconductor stack. For example, in such a case, the back surface of the substrate is selected as the optical image output surface.

However, since the substrate is in general much thicker than the semiconductor stack, light absorption sometimes occurs remarkably depending on the relationship between the material of the substrate and the light-emission wavelength. If the light absorption in the substrate is large, the light output efficiency with respect to the supplied power is reduced.

The present invention has been made to solve the above-described problems, and an object of the present invention to provide a light-emitting element, a manufacturing method for the light-emitting element, and a phase modulation layer designing method that are capable of outputting a clear optical image while suppressing reduction in light output efficiency.

Solution to Problem

In order to solve the above-described problems, a light-emitting element according to an embodiment of the present invention includes, as an aspect, a substrate having a main surface, a light-emitting unit, and a bonding layer provided between the substrate and the light-emitting unit. The bonding layer bonds the main surface of the substrate and the light-emitting unit. The light-emitting unit outputs light for forming an optical image along a normal direction of the main surface or a tilt direction intersecting the normal direction, or both the normal direction and the tilt direction. The light-emitting unit has a semiconductor stack having a back surface and a front surface positioned on the opposite side of the bonding layer with respect to the back surface, a first electrode in contact with the back surface of the semiconductor stack, and a second electrode in contact with the front surface of the semiconductor stack. The semiconductor stack includes a first cladding layer of a first conductivity type, a second cladding layer of a second conductivity type, an active layer, and a phase modulation layer. The first cladding layer is provided between the back surface and the front surface. The second cladding layer is provided between the first cladding layer and the front surface. The active layer and the phase modulation layer are each provided between the first cladding layer and the second cladding layer. Therefore, the phase modulation layer is positioned between the first cladding layer and the active layer or between the active layer and the second cladding layer.

The phase modulation layer includes a base layer and a plurality of modified refractive index regions each having a refractive index different from the refractive index of the base layer. The phase modulation layer includes a first region that is set to have a size including at least a second electrode when viewed from the thickness direction from the front surface to the back surface of the semiconductor stack, and a second region other than the first region, in an effective area where light (signal light) contributing to the formation of an optical image is outputted. On a virtual square lattice set on the reference plane of the phase modulation layer orthogonal to the thickness direction, each of the plurality of modified refractive index regions is associated with any one of the lattice points of the virtual square lattice. In particular, the center of gravity of each specific modified refractive index region positioned in the second region is arranged on the reference plane according to a first array condition or a second array condition. Here, the first array condition is defined in such a manner that the center of gravity of each specific modified refractive index region is separated from the associated lattice point by a predetermined distance, and a rotation angle around the associated lattice point, which is defined by the angle formed by the line segment extending from the associated lattice point to the center of gravity and the virtual square lattice, is individually set according to the phase distribution for forming the optical image. On the other hand, the second array condition is defined in such a manner that the center of gravity of each specific modified refractive index region is positioned on a straight line passing through a corresponding lattice point in a tilting state with respect to the virtual square lattice, and the distance from the associated lattice point to the center of gravity is individually set according to the above-mentioned phase distribution.

In addition, the light forming the optical image is outputted from the front surface of the semiconductor stack, and the optical image is completed as a single beam pattern including only the light components having passed through the second electrode from the second region. In a specific region on the main surface of the substrate overlapping the effective area when viewed along the thickness direction, the variation amount of a first distance from the main surface to the front surface of the semiconductor stack at a plurality of first points aligned along a first straight line on the main surface is smaller than the variation amount of a second distance from the main surface to the back surface of the semiconductor stack at the plurality of first points. Furthermore, the variation amount of the first distance (distance from the main surface to the front surface) at a plurality of second points aligned along a second straight line on the main surface intersecting the first straight line is smaller than the variation amount of the second distance (distance from the main surface to the back surface) at the plurality of second points.

Advantageous Effects of Invention

According to the light-emitting element, the manufacturing method for the light-emitting element, and the phase modulation layer designing method according to the present embodiment, it is possible to output a clear optical image while suppressing reduction in light output efficiency.

BRIEF DESCRIPTION OF DRAWINGS

FIGS. 12A and 12B are views for explaining a point of attention in a case where a general discrete Fourier transform (or fast Fourier transform) is used for calculation when the arrangement of each modified refractive index region 13b is determined.

FIGS. 28A to 28K are views showing other examples of planar shapes of the modified refractive index region 13b on the X-Y plane.

DESCRIPTION OF EMBODIMENTS

Figure 1:
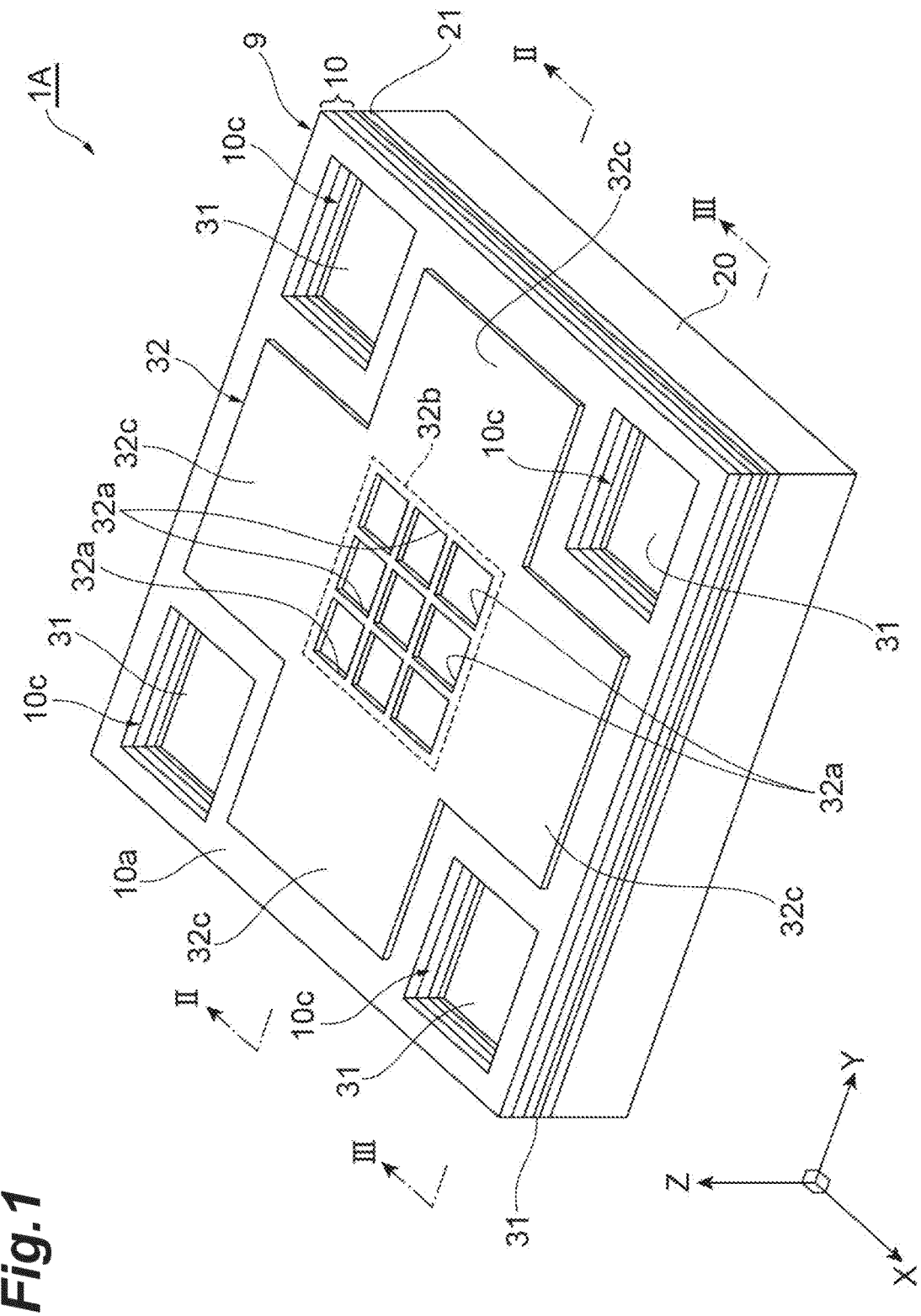
FIG. 1 is a perspective view showing an appearance of a light-emitting element 1A according to an embodiment of the present invention.

[Description of Embodiments of Invention of this Application]

First, contents of the embodiments of the invention of this application will be individually listed and described.

(1) A light-emitting element according to an embodiment of the present invention includes, as an aspect, a substrate having a main surface, a light-emitting unit, and a bonding layer provided between the substrate and the light-emitting unit. The bonding layer bonds the main surface of the substrate and the light-emitting unit. The light-emitting unit outputs light for forming an optical image along a normal direction of the main surface or a tilt direction intersecting the normal direction, or both the normal direction and the tilt direction. The light-emitting unit has a semiconductor stack having a back surface and a front surface positioned on the opposite side of the bonding layer with respect to the back surface, a first electrode in contact with the back surface of the semiconductor stack, and a second electrode in contact with the front surface of the semiconductor stack. The semiconductor stack includes a first cladding layer of a first conductivity type, a second cladding layer of a second conductivity type, an active layer, and a phase modulation layer. The first cladding layer is provided between the back surface and the front surface. The second cladding layer is provided between the first cladding layer and the front surface. The active layer and the phase modulation layer are each provided between the first cladding layer and the second cladding layer. Therefore, the phase modulation layer is positioned between the first cladding layer and the active layer or between the active layer and the second cladding layer.

The phase modulation layer includes a base layer and a plurality of modified refractive index regions each having a refractive index different from the refractive index of the base layer. The phase modulation layer includes the first region that is set to have a size including the entire part positioned in the effective area of the second electrode when viewed from the thickness direction from the front surface to the back surface of the semiconductor stack, and the second region other than the first region, in an effective area where light contributing to the formation of an optical image is outputted. Note that the outline of the effective area is given by an envelope surrounding all the second regions. Therefore, in the effective area, the part of the second electrode and the first region completely coincide with each other or the part of the second electrode appears to be included in the first region when viewed from the thickness direction. On a virtual square lattice set on the reference plane of the phase modulation layer orthogonal to the thickness direction, each of the plurality of modified refractive index regions is associated with any one of the lattice points of the virtual square lattice. In particular, the center of gravity of each specific modified refractive index region positioned in the second region is arranged on the reference plane according to a first array condition or a second array condition. Here, the first array condition is defined in such a manner that the center of gravity of each specific modified refractive index region is separated from the associated lattice point by a predetermined distance, and a rotation angle around the associated lattice point, which is defined by the angle formed by the line segment extending from the associated lattice point to the center of gravity and the virtual square lattice, is individually set according to the phase distribution for forming the optical image. On the other hand, the second array condition is defined in such a manner that the center of gravity of each specific modified refractive index region is positioned on a straight line passing through a corresponding lattice point in a tilting state with respect to the virtual square lattice, and the distance from the associated lattice point to the center of gravity is individually set according to the above-mentioned phase distribution.

In addition, the light forming the optical image is outputted from the front surface of the semiconductor stack, and the optical image is completed as a single beam pattern including only the light components having passed through the second electrode from the second region. Here, the flatness of the back surface of the semiconductor stack is lower than the flatness of the front surface. Specifically, in a specific region on the main surface of the substrate overlapping the effective area when viewed along the thickness direction, the variation amount of a first distance from the main surface to the front surface of the semiconductor stack at a plurality of first points aligned along a first straight line on the main surface is smaller than the variation amount of a second distance from the main surface to the back surface of the semiconductor stack at the plurality of first points. Furthermore, the variation amount of the first distance (distance from the main surface to the front surface) at a plurality of second points aligned along a second straight line on the main surface intersecting the first straight line is smaller than the variation amount of the second distance (distance from the main surface to the back surface) at the plurality of second points. Note that in the present description, the "variation amount of distance" is defined by the difference (absolute value) between the maximum value and the minimum value of distance data measured at a plurality of locations aligned along a specific direction.

In the light-emitting element having the structure described above, each gravity center of the plurality of modified refractive index regions is arranged on the reference plane (X-Y plane) according to the above-described first array condition or second array condition. According to such a structure, as the S-iPM laser, light for forming an optical image of a discretionary shape along a normal direction of the main surface of the substrate or a tilt direction intersecting the normal direction, or both the normal direction and the tilt direction can be outputted. In the light-emitting element, the front surface of the semiconductor stack is flatter than the back surface, and the substrate is bonded to the back surface side of the semiconductor stack via the bonding layer. Therefore, light for forming an optical image is outputted from the front surface of the relatively flat semiconductor stack, whereby a clear optical image is obtained. Furthermore, optical image formation light is outputted from the front surface of the semiconductor stack, whereby light absorption in the substrate is reduced, and as a result, reduction in light output efficiency can be suppressed.

In the light-emitting element, the phase modulation layer includes the first region overlapping with the second electrode (coinciding with the second electrode or has a size including the entire second electrode) when viewed from the thickness direction, and the second region other than the first region. Then, the optical image is completed as a single beam pattern including only the light components having passed through the second electrode from the second region. Thus, without using light outputted from the first region of the phase modulation layer shielded by the second electrode, it is possible to complete an optical image using only light from the second region not shielded by the second electrode. That is, it is possible to effectively suppress deterioration of the quality of the optical image due to the second electrode blocking a part of the light outputted from the phase modulation layer.

Note that "the optical image is completed as a single beam pattern including only the light components having passed through the second electrode from the second region of the phase modulation layer" means that a desired optical image is obtained as a single beam pattern only by the modified refractive index region included in the second region without using the modified refractive index region included in the first region. In other words, the arrangement of the modified refractive index region included in the first region is not reflected in the optical image obtained from the light-emitting element. In other words, the optical image formed in a state where the second electrode is provided and the optical image formed in a state where the second electrode is not provided (state where the current is supplied by a means other than the second electrode) coincide with each other.

(2) As an aspect of the present embodiment, the active layer preferably includes Ga, In, and P as compositions. A GaAs substrate, for example, is preferably used as the substrate (growth substrate) on which the semiconductor stack is formed. The GaAs remarkably absorbs light in a wavelength region of, for example, 650 to 710 nm generated in this active layer. Therefore, in a case where the light-emitting element is completed without removing each layer of the semiconductor stack on the GaAs substrate on which each layer of the semiconductor stack is formed (epitaxially grown), when the optical image is outputted from the back surface side of the GaAs substrate, the optical output efficiency is significantly reduced. Since the flatness of the growth surface of the semiconductor stack is low, the clarity of the optical image is impaired when the optical image is outputted from the semiconductor stack side. On the other hand, in the light-emitting element according to the present embodiment, light for forming an optical image is outputted from the flat front surface (i.e., surface opposite to the growth surface) side of the semiconductor stack, a clear optical image can be efficiently obtained even when the active layer includes Ga, In, and P as compositions.

(3) As an aspect of the present embodiment, the bonding layer preferably includes a resin. This configuration enables the first electrode formed on the back surface of the semiconductor stack having a low flatness (much unevenness) and the main surface of the substrate to be firmly bonded without any gap.

(4) As an aspect of the present embodiment, the planar shape of the second electrode when viewed along the thickness direction may include a plurality of openings. As an aspect of the present embodiment, the planar shape of the second electrode when viewed along the thickness direction may include a plurality of slits. When the second electrode has at least one of these planar shapes, the optical image can be taken out from the front surface of the semiconductor stack while bringing the current density in the active layer closer to equal. In the light-emitting element, the optical image is completed as a single beam pattern including only the light components having passed through the second electrode from the second region. Therefore, even when the second electrode has such a planar shape, it is possible to effectively suppress deterioration of the quality of the optical image due to the second electrode blocking a part of the light outputted from the phase modulation layer.

(5) As an aspect of the present embodiment, the planar shape of the second electrode when viewed along the thickness direction may be a lattice shape, a stripe shape, a concentric shape, a radial shape, or an interdigitated shape. When the second electrode has any planar shape of these planar shapes, the second electrode can be uniformly and evenly arranged on the front surface (optical image output surface) of the semiconductor stack. Thus, the optical image can be taken out from the front surface of the semiconductor stack while bringing the current density in the active layer more uniform. In the light-emitting element, the optical image is completed as a single beam pattern including only the light components having passed through the second electrode from the second region. Therefore, even when the second electrode has such a planar shape, it is possible to effectively suppress deterioration of the quality of the optical image due to the second electrode blocking a part of the light outputted from the phase modulation layer.

(6) As an aspect of the present embodiment, the light-emitting element may have a recess portion extending from the front surface to the first electrode. This configuration can expose the first electrode on the bottom surface of the recess portion, thereby facilitating electrical connection to the first electrode sandwiched between the semiconductor stack and the substrate.

(7) As an aspect of the present embodiment, it is preferable that the center of gravity of each modified refractive index region positioned in the first region among the plurality of modified refractive index regions is arranged on the associated lattice point, or that the rotation angle around the associated lattice point is individually set to an angle irrelevant to the formation of the optical image in a state of being separated from the associated lattice point by a predetermined distance. Since the light outputted from the first region is shielded by the second electrode, the center of gravity of each modified refractive index region positioned in the first region may be arranged in any manner. However, this arrange facilitates the formation of the phase modulation layer. According to the findings of the present inventor, the closer the center of gravity of the plurality of modified refractive index regions is to the lattice point of the virtual square lattice, the lower the current (oscillation threshold current) necessary for laser oscillation can be. Therefore, the center of gravity of each modified refractive index region positioned in the first region is arranged on the lattice point of the virtual square lattice, whereby the oscillation threshold current can be effectively reduced.

(8) As an aspect of the present embodiment, the first region and the part of the second electrode positioned in the effective area when viewed from the thickness direction satisfy a relationship in which the width of the first region defined along the direction orthogonal to the thickness direction is larger than the width of the part of the second electrode. With this configuration, the second electrode is avoided from shielding the light from the second region even if the formation position of the second electrode deviates slightly from the design position, and as a result, it is possible to suppress deterioration of the quality of the optical image.

(9) As an aspect of the present embodiment, it is preferable that the semiconductor stack further includes a contact layer provided between the second cladding layer and the second electrode in a state of being in contact with the second electrode.

(10) The manufacturing method according to the present embodiment, as an aspect, manufactures a light-emitting element having the structure described above. In particular, when the light-emitting element to be manufactured has a semiconductor stack that does not include a contact layer, the manufacturing method according to the present embodiment includes a first step of preparing a growth substrate, a second step of growing the semiconductor stack, a third step of forming the first electrode, a fourth step of attaching the substrate, a fifth step of removing the growth substrate, and a sixth step of forming the second electrode. Note that in the second step, layers constituting the semiconductor stack are sequentially grown on the growth substrate so that the second cladding layer comes into contact with the growth substrate. In the third step, the first electrode is formed on the semiconductor stack so that the semiconductor stack is sandwiched between the growth substrate and the first electrode. In the fourth step, the main surface of the substrate is bonded to the first electrode via the bonding layer. The fifth step is performed after the fourth step. In the sixth step, the second electrode is formed on the front surface of the semiconductor stack so that the semiconductor stack is sandwiched between the first electrode and the second electrode.

As described above, in the formation of the phase modulation layer, unevenness is generated on the upper surface of the phase modulation layer, and the unevenness may affect the flatness of the growth surface (corresponds to the back surface in this aspect) of the semiconductor stack. On the other hand, the surface (corresponds to the front surface in this aspect) opposite to the growth surface of the semiconductor stack takes over the flatness of the front surface of the growth substrate. In this manufacturing method, after the first electrode is bonded to the main surface of the substrate via the bonding layer, the growth substrate is removed. This exposes the flat surface on the side opposite to the growth surface of the semiconductor stack. By using this flat surface as the optical image output surface, it is possible to output a clear optical image while suppressing reduction in light output efficiency.

(11) When the light-emitting element to be manufactured has a semiconductor stack that does not include a contact layer, the manufacturing method includes, as an aspect, the first step of preparing a growth substrate, the second step of growing the semiconductor stack, the third step of forming the first electrode, the fourth step of attaching the substrate, the fifth step of removing the growth substrate, and the sixth step of forming the second electrode. Note that in the second step, layers constituting the semiconductor stack are sequentially grown on the growth substrate so that the contact layer comes into contact with the growth substrate. In the third step, the first electrode is formed on the semiconductor stack so that the semiconductor stack is sandwiched between the growth substrate and the first electrode. In the fourth step, the main surface of the substrate is bonded to the first electrode via the bonding layer. In the fifth step, the growth substrate is removed by etching by using the contact layer as an etch stop layer. In the sixth step, the second electrode is formed on the front surface of the semiconductor stack so that the semiconductor stack is sandwiched between the first electrode and the second electrode. In this method, the contact layer is used as an etch stop layer when removing the growth substrate used for growing the semiconductor stack. Therefore, it is possible to accurately remove the growth substrate while leaving the flat front surface of the semiconductor stack.

(12) As a method for designing the phase modulation layer of the light-emitting element having the structure as described above, in an aspect of the design method of the present embodiment, under a predetermined constraint condition, the position of the center of gravity of each modified refractive index region positioned in the second region among the plurality of modified refractive index regions is calculated by iterative calculation based on the optical image to be formed. The constraint condition is defined in such a manner that the position of the center of gravity of each modified refractive index region positioned in the first region among the plurality of modified refractive index regions has a certain rotation angle on the associated lattice point or around the associated lattice point in a state of being away from the associated lattice point by a predetermined distance. Thus, by performing iterative calculation while constraining the position of the center of gravity of each modified refractive index region positioned in the first region, it is possible to easily calculate the arrangement of the center of gravity of the modified refractive index region so that the optical image can be completed only by the second region.

Thus, each aspect listed in this [Description of Embodiments of Invention of This Application] column is applicable to each of all remaining aspects or to all combinations of these remaining aspects.

[Details of Embodiments of Invention of this Application]

A specific structure of the light-emitting element according to the present embodiment will be described below in detail with reference to the accompanying drawings. Note that the present invention is not limited to these examples, but is shown by the claims, and is intended to include all modified examples within the meaning and scope equivalent of the claims. In the description of the drawings, identical elements are given identical reference numerals and redundant description is omitted.

Embodiments of the light-emitting element, the manufacturing method for the light-emitting element, and the phase modulation layer designing method according to the present embodiment will be described below in detail with reference to the accompanying drawings. In the description of the drawings, identical elements are given identical reference numerals and redundant description is omitted.

Figure 2:
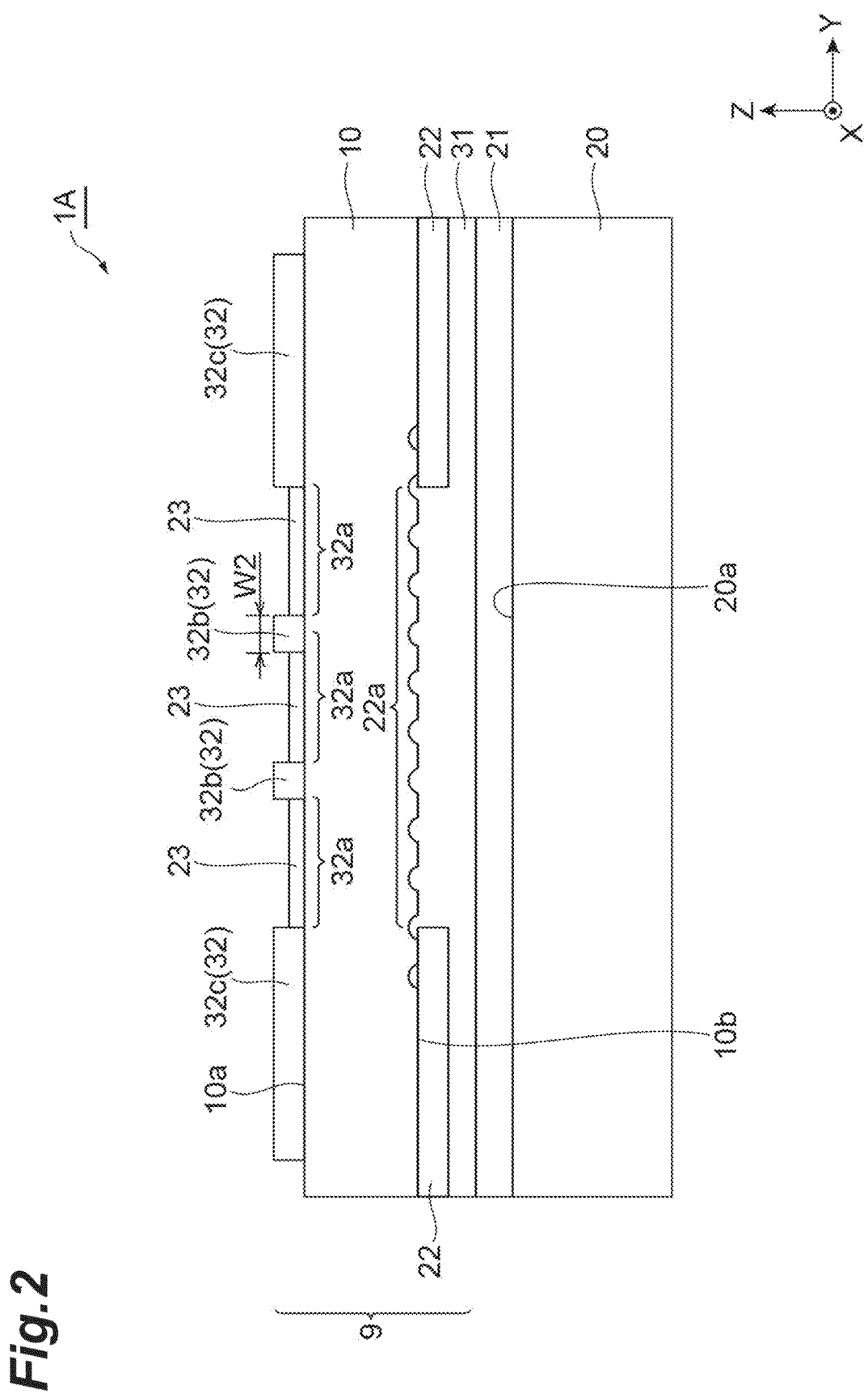
FIG. 2 is a view schematically showing a cross section along a line II-II of the light-emitting element 1A shown in FIG. 1.
Figure 3:
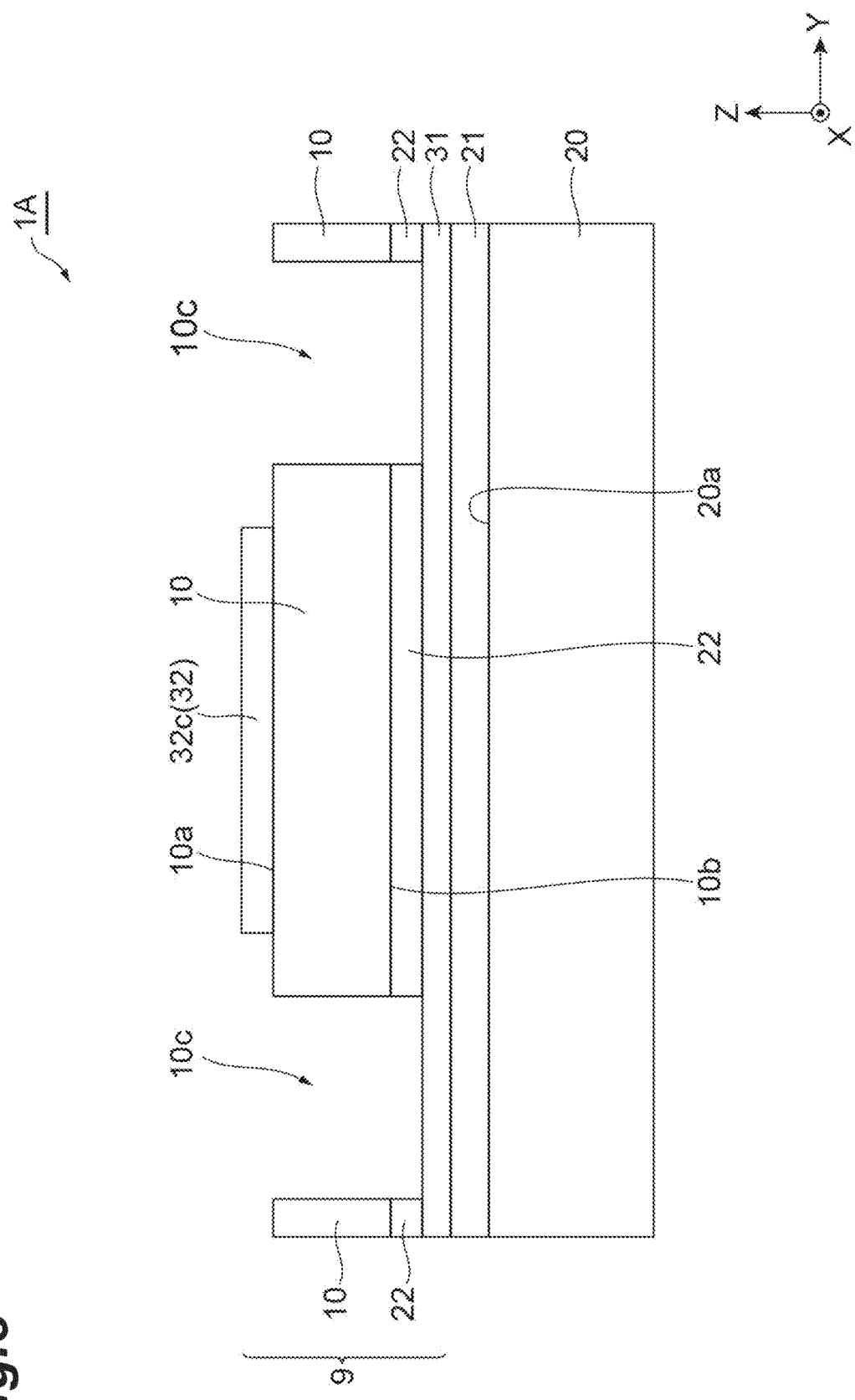
FIG. 3 is a view schematically showing a cross section along a line of the light-emitting element 1A shown in FIG. 1.

FIG. 1 is a perspective view showing an appearance of the light-emitting element 1A according to an embodiment of the present invention. FIG. 2 is a view schematically showing a cross section along the line II-II of the light-emitting element 1A shown in FIG. 1. FIG. 3 is a view schematically showing a cross section along the line III-III of the light-emitting element 1A shown in FIG. 1. Note that an XYZ orthogonal coordinate system in which an axis extending along the thickness direction of the light-emitting element 1A is a Z-axis is defined. This light-emitting element 1A has a planar shape such as a rectangle or a square, and has one side along the X-axis direction and the other side along the Y-axis direction. The light-emitting element 1A includes a substrate 20 (support substrate) having a main surface 20a, a light-emitting unit 9 provided on the main surface 20a of the substrate 20, and a bonding layer 21 that bonds the main surface 20a and the light-emitting unit 9 to each other. The light-emitting unit 9 includes a semiconductor stack 10, a first electrode 31 provided on a back surface 10b of the semiconductor stack 10, and a second electrode 32 provided on a front surface 10a of the semiconductor stack 10. The light-emitting unit 9 is an S-iPM laser that forms a standing wave along a discretionary direction defined on a plane parallel to the X-Y plane and outputs a phase-controlled plane wave in the Z-axis direction. As will be described later, the light-emitting unit 9 outputs light forming a two-dimensional optical image of a discretionary shape along a normal direction (i.e., Z-axis direction) of the main surface 20a of the substrate 20 or a tilt direction intersecting the normal direction, or both the normal direction and the tilt direction. After passing through a plurality of openings 32a formed in the second electrode 32 from the front surface 10a of the semiconductor stack 10, the light forming the optical image is outputted to the outside of the light-emitting element 1A.

Figure 4:
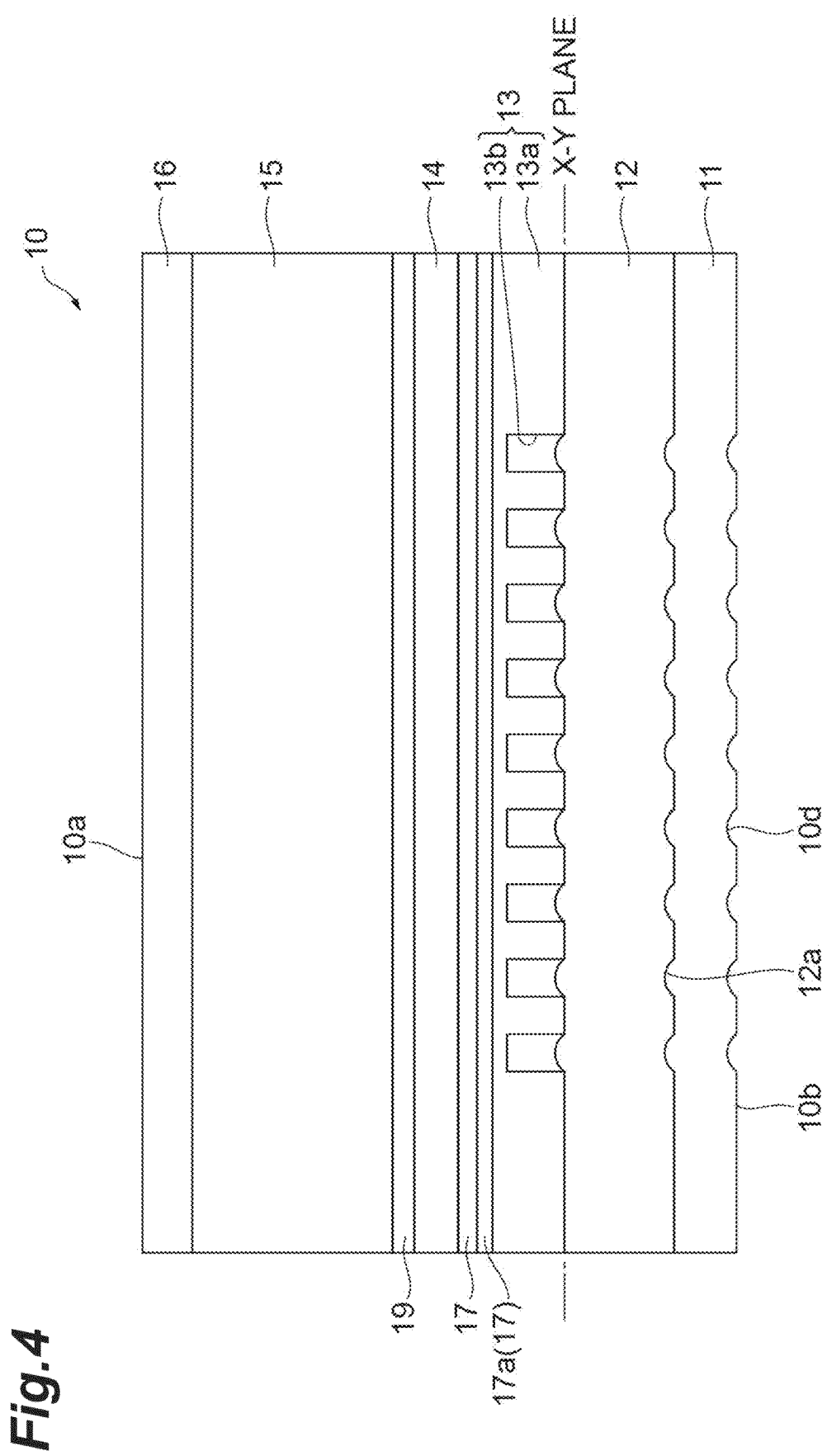
FIG. 4 is a schematic view showing an example of a cross-sectional structure of a semiconductor stack 10.

FIG. 4 is a schematic view showing an example of the cross-sectional structure of the semiconductor stack 10. As shown in FIG. 4, the semiconductor stack 10 includes a lower cladding layer (first cladding layer) 12 of a first conductivity type (e.g., p-type), an active layer 14 provided on the lower cladding layer 12, and an upper cladding layer (second cladding layer) 15 of a second conductivity type (e.g., n-type) provided on the active layer 14. That is, the active layer 14 is provided on the main surface 20a of the substrate 20 and is sandwiched between the lower cladding layer 12 and the upper cladding layer 15. The semiconductor stack 10 further includes a lower contact layer (first contact layer) 11 and an upper contact layer (second contact layer) 16. The lower contact layer 11 is provided on the side opposite to the active layer 14 with respect to the lower cladding layer 12, and constitutes the back surface 10b of the semiconductor stack 10 on the lower cladding layer 12 side. The lower contact layer 11 is positioned between the lower cladding layer 12 and the first electrode 31 (see FIG. 2). In the present embodiment, the lower contact layer 11 is in contact with the lower cladding layer 12. The upper contact layer 16 is provided on the upper cladding layer 15, positioned between the upper cladding layer 15 and the second electrode 32 (see FIG. 2), and constitutes the front surface 10a of the semiconductor stack 10 on the upper cladding layer 15 side. In the present embodiment, the upper contact layer 16 is in contact with the upper cladding layer 15. These layers 11 to 16 can be comprised of, for example, a compound semiconductor such as a GaAs semiconductor, an InP semiconductor, and a nitride semiconductor. The energy band gap of the lower cladding layer 12 and the energy band gap of the upper cladding layer 15 are larger than the energy band gap of the active layer 14.

The semiconductor stack 10 further includes the phase modulation layer 13 optically coupled with the active layer 14. In the present embodiment, the phase modulation layer 13 is provided between the active layer 14 and the lower cladding layer 12. The thickness direction of the phase modulation layer 13 coincides with the Z-axis direction. The phase modulation layer 13 may be provided between the upper cladding layer 15 and the active layer 14. If necessary, a light guide layer may be provided between the active layer 14 and the lower cladding layer 12, and/or between the active layer 14 and the upper cladding layer 15. In the present embodiment, a light guide layer 17 is provided between the active layer 14 and the lower cladding layer 12, and a light guide layer 19 is provided between the active layer 14 and the upper cladding layer 15. In this case, the phase modulation layer 13 is provided between the lower cladding layer 12 and the light guide layer 17, or between the upper cladding layer 15 and the light guide layer 19. The light guide layer 17 positioned between the active layer 14 and the lower cladding layer 12 may include a carrier barrier layer 17a for efficiently confining carriers in the active layer 14.

The phase modulation layer 13 includes a base layer 13a including a first refractive index medium, and a plurality of modified refractive index regions 13b including a second refractive index medium having a refractive index different from that of the first refractive index medium. The plurality of modified refractive index regions 13b exist in the base layer 13a in a state of being arranged on the X-Y plane that is a reference plane. The arrangement of the plurality of modified refractive index regions 13b includes a substantially periodic structure. Where the equivalent refractive index of the mode is n, a wavelength $\lambda_0$ $(=(\sqrt{2})a \times n$, a is the lattice spacing) selected by the phase modulation layer 13 is included in the light-emission wavelength range of the active layer 14. The phase modulation layer 13 can select a band end wavelength in the vicinity of the wavelength $\lambda 0$ among the light-emission wavelengths of the active layer 14 and output it to the outside. The laser light entering the phase modulation layer 13 forms a predetermined mode in accordance with the arrangement of the modified refractive index regions 13b in the phase modulation layer 13, and is outputted to the outside from the front surface 10a of the semiconductor stack 10 as a laser beam having a desired pattern.

As will be described later, the modified refractive index region 13b is a hole formed in the base layer 13a, for example. In the formation of the phase modulation layer 13, the base layer 13a is grown first. Subsequently, a plurality of holes are formed in the base layer 13a by etching or the like, and then the plurality of holes are covered by growing the lower cladding layer 12 on the base layer 13a. Therefore, a plurality of depressions 12a are formed in the growth surface of the lower cladding layer 12 due to the presence of the plurality of holes. More specifically, smooth unevenness is formed in the entire region of the growth surface provided with the plurality of holes. The order of the width and depth of the plurality of depressions 12a coincides with the order of the wavelength of the optical image to be outputted. Since the plurality of depressions 12a are taken over when the lower contact layer 11 is grown, the back surface 10b of the semiconductor stack 10 includes a plurality of depressions 10d. On the other hand, since the upper contact layer 16 grows before the phase modulation layer 13 is formed, the front surface of the upper contact layer 16, i.e., the front surface 10a of the semiconductor stack 10 takes over the flatness of the main surface of the growth substrate. Therefore, the front surface 10a of the semiconductor stack 10 is flatter than the back surface 10b (free from depressions).

In a certain example, the semiconductor stack 10 is a compound semiconductor layer composed of a group III element and a group V element. In one example, the lower contact layer 11 is a GaAs layer. The lower cladding layer 12 is an AlGaInP layer. The active layer 14 has a multiple quantum well structure (barrier layer: AlGaInP/well layer: GaInP). In the phase modulation layer 13, the base layer 13a is an AlGaInP layer, and the modified refractive index region 13b is a hole. The upper cladding layer 15 is an AlGaInP layer. The upper contact layer 16 is a GaInP layer. In this case, for example, a GaAs substrate is used as the growth substrate.

In one example, each layer constituting the semiconductor stack 10 has the following composition and thickness (layer width along the Z-axis direction). In this example, the light-emission wavelength of the active layer 14 is in the range of 600 to 710 nm, for example, 675 nm.

Lower contact layer 11: p-type GaAs, 200 nm

Lower cladding layer 12: p-type $(Al_{0.7}Ga_{0.3})_{0.5}In_{0.5}P$, 800 nm

Phase modulation layer 13 (base layer 13a): i-type AlGaInP, 220 nm

Carrier barrier layer 17a: i-type $(Al_{0.7}Ga_{0.3})_{0.5}In_{0.5}P$, 20 nm

Light guide layer 17: i-type AlGaInP, 50 nm

Active layer 14: has a multiple quantum well structure in which well layers including i-type GaInP and barrier layers including i-type AlGaInP are alternately stacked; thickness of the well layer 10 nm; thickness of the barrier layer 10 nm; and 3 periods Light guide layer 19: i-type AlGaInP, 60 nm Upper cladding layer 15: n-type $(Al_{0.6}Ga_{0.4})_{0.5}In_{0.5}P$, 2000 nm Upper contact layer 16: n-type GaInP, 200 nm In AlGaInP, the energy band gap and refractive index can be easily changed by changing the composition ratio of Al. In AlGaInP, when the composition ratio of Al having a relatively small atomic radius is decreased (increased), the energy band gap positively correlated with this becomes small (large). That is, the Al composition ratio of the lower cladding layer 12 and the upper cladding layer 15 is larger than the Al composition ratio of the light guide layer 17, the light guide layer 19, and the barrier layer of the active layer 14. The Al composition ratio of the cladding layer is set to, for example, 0.2 to 1.0, and the Al composition ratio of the light guide layer 17, the light guide layer 19, and the barrier layer of the active layer 14 is set to, for example, 0 to 0.3.

In another example, the semiconductor stack 10 includes, for example, an InP compound semiconductor. In one example, the lower contact layer 11 is a GaInAsP layer, a GaInAs layer, or an InP layer. The lower cladding layer 12 is an InP layer. The active layer 14 has a multiple quantum well structure (barrier layer: GaInAsP/well layer: GaInAsP). In the phase modulation layer 13, the base layer 13a is GaInAsP or InP, and the modified refractive index region 13b is a hole. The upper cladding layer 15 is an InP layer. In yet another embodiment, the lower contact layer 11 is a GaInAs or InP layer. The lower cladding layer 12 is an InP layer. The active layer 14 has a multiple quantum well structure (barrier layer: AlGaInAs/well layer: AlGaInAs). In the phase modulation layer 13, the base layer 13a is an AlGaInAs layer or an InP layer, and the modified refractive index region 13b is a hole. The upper cladding layer 15 is an InP layer. In these cases, for example, an InP substrate is used as the growth substrate. These material systems can be applied to optical communication wavelengths in the 1.3/1.55 μm band, and can also output light having an eye-safe wavelength longer than 1.4 μm.

In yet another example, the semiconductor stack 10 includes, for example, a nitride compound semiconductor. In one example, the lower contact layer 11 is a GaN layer. The lower cladding layer 12 is an AlGaN layer. The active layer 14 has a multiple quantum well structure (barrier layer: InGaN/well layer: InGaN). In the phase modulation layer 13, the base layer 13a is a GaN layer, and the modified refractive index region 13b is a hole. The upper cladding layer 15 is an AlGaN layer. In this case, for example, a GaN substrate is used as the growth substrate.

The conductivity types of the lower contact layer 11 and the lower cladding layer 12 and the conductivity types of the upper cladding layer 15 and the upper contact layer 16 are opposite to each other. In one example, the lower contact layer 11 and the lower cladding layer 12 are p-type, and the upper contact layer 16 and the upper cladding layer 15 are n-type. If provided between the active layer 14 and the lower cladding layer 12, the phase modulation layer 13 may have the same conductivity type as that of the lower cladding layer 12. On the other hand, if provided between the active layer 14 and the upper cladding layer 15, the phase modulation layer 13 may have the same conductivity type as that of the upper cladding layer 15. The impurity concentration is, for example, $1\times10^{16}$ to $1\times10^{21}/cm^3$. The active layer 14 is intrinsic (i-type) to which no impurity is intentionally added, and the impurity concentration thereof is $1\times10^{16}/cm^3$ or less. Note that the impurity concentration of the phase modulation layer 13 may be intrinsic (i-type) as in the above-described example when it is necessary to suppress the effect of loss due to light absorption via the impurity level.

In the structure described above, the modified refractive index region 13b is a hole, but the modified refractive index region 13b may be formed by embedding a semiconductor having a refractive index different from the refractive index of the base layer 13a in the hole. In that case, for example, a hole in the base layer 13a may be formed by etching, and a semiconductor may be embedded in the hole by using the metal organic chemical vapor deposition method, the sputtering method, or the epitaxial method. For example, when the base layer 13a includes AlGaInP, the modified refractive index region 13b may include GaInP. After the modified refractive index region 13b is formed by embedding a semiconductor in the hole of the base layer 13a, a semiconductor identical to that in the modified refractive index region 13b may be further deposited thereon. Even in the case where the modified refractive index region 13b is formed in this manner, since unevenness occurs on the back surface 10b of the semiconductor stack 10, the front surface 10a becomes flatter than the back surface 10b. If the modified refractive index region 13b is a hole, an inert gas such as argon or nitrogen or a gas such as hydrogen or air may be sealed in the hole.

FIGS. 1 to 3 will be referred again. The second electrode 32 is provided on the upper contact layer 16 and is in ohmic contact with the upper contact layer 16. The second electrode 32 may be comprised of a material containing chromium (Cr) and titanium (Ti), and has a stack structure of, for example, a Ti layer and an Au layer. The material of the second electrode 32 is only required to realize ohmic coupling and not limited to them.

The second electrode 32 of the present embodiment includes the current supply unit 32b (see FIG. 1) provided in a region including the center of the front surface 10a of the semiconductor stack 10, and one or a plurality of bonding pad units 32c extending from the periphery of the current supply unit 32b toward the peripheral edge portion of the front surface 10a of the semiconductor stack 10. In the example shown in FIG. 1, the second electrode 32 includes a pair of bonding pad units 32c sandwiching the current supply unit 32b along the X-axis direction and a pair of bonding pad units 32c sandwiching the current supply unit 32b along the Y-axis direction, and has a substantially cross planar shape. Each bonding pad unit 32c has a rectangular planar shape. Each bonding pad unit 32c is electrically connected via a bonding wire to a wiring pattern of the wiring substrate on which the light-emitting element 1A is mounted. Note that the number, shape, and formation position of the bonding pad units 32c are discretionary and are not limited to those in the example shown in FIG. 1.

The current supply unit 32b has a square lattice planar shape, and has the plurality of openings 32a arrayed two-dimensionally on a plane parallel to the X-Y plane. Although FIG. 1 illustrates nine openings 32a, the number and array of the openings 32a are discretionary. The planar shape of each opening 32a of the second electrode 32 is a quadrilateral such as a square. The area of each opening 32a is in the range of, for example, 100 μm² to 10000 μm². A part of the second electrode 32 is provided in the vicinity of a center portion of the light-emitting unit 9 as viewed from the light output direction. The second electrode 32 may have another planar shape such as a stripe shape, and in that case, the second electrode 32 has the plurality of openings 32a arrayed in one-dimensionally on a plane parallel to the X-Y plane. The light outputted from the phase modulation layer 13 passes through the plurality of openings 32a of the second electrode 32. As the light passes through the plurality of openings 32a of the second electrode 32, the light from the phase modulation layer 13 is suitably outputted from the front surface 10a side of the semiconductor stack 10 without being blocked by the second electrode 32.

The upper contact layer 16 may have a planar shape similar to that of the second electrode 32. That is, the planar shape of the upper contact layer 16 viewed from the light output direction may be the same square lattice shape as that of the second electrode 32, and the upper contact layer 16 may have a plurality of openings communicated with the plurality of openings 32a of the second electrode 32. As light passes through the opening of the upper contact layer 16, light absorption in the upper contact layer 16 is avoided, and light output efficiency is enhanced. In this case, the front surface 10a of the semiconductor stack 10 includes the upper cladding layer 15 exposed from the opening of the upper contact layer 16. If light absorption in the upper contact layer 16 is acceptable, the upper contact layer 16 may cover the entire surface on the upper cladding layer 15 without having an opening, as shown in FIG. 4.

The front surface 10a (front surface of the upper contact layer 16 or the front surface of the upper cladding layer 15 if the upper contact layer 16 is provided with an opening) of the semiconductor stack 10 exposed from the opening 32a of the second electrode 32 is covered with an antireflection film 23. Thus, reflection of light on the front surface 10a of the semiconductor stack 10 is reduced, and light output efficiency is enhanced. The antireflection film 23 is comprised of, for example, a dielectric single layer film such as silicon nitride (e.g., SiN) or silicon oxide (e.g., $SiO_2$), or a dielectric multilayer film. As the dielectric multilayer film, for example, a film in which two or more types of dielectric layers selected from a group of dielectric layers such as titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), and zirconium oxide ($ZrO_2$) are stacked can be used. For example, A film having a thickness of $\lambda/4$ is stacked with an optical film for light having a wavelength $\lambda$.

The first electrode 31 is provided in a layer shape between the substrate 20 and the semiconductor stack 10 and is in contact with the back surface 10b of the semiconductor stack 10. The first electrode 31 is in ohmic contact with the lower contact layer 11 of the semiconductor stack 10. The first electrode 31 is comprised of a material containing Ti, Cr, and Au, and has a stack structure of, for example, a Ti layer and an Au layer. An insulation layer 22 is provided between the first electrode 31 and the semiconductor stack 10. An opening 22a is formed in the center portion of the insulation layer 22 on a plane parallel to the X-Y plane, and the first electrode 31 and the semiconductor stack 10 come into contact with each other via the opening 22a. In other words, the contact between the region of the first electrode 31 excluding the center portion and the semiconductor stack 10 is prevented by the insulation layer 22. This allows the drive current to concentrate in the vicinity of the center portion of the semiconductor stack 10. The insulation layer 22 can be comprised of, for example, silicon nitride (e.g., SiN), silicon oxide (e.g., $SiO_2$), or the like.

As shown in FIGS. 1 and 3, the semiconductor stack 10 and the insulation layer 22 have one or a plurality of recess portions 10c extending from the front surface 10a to the first electrode 31. The planar shape of the recess portion 10c is, for example, a rectangular shape. In the examples shown in FIGS. 1 and 3, the semiconductor stack 10 has four recess portions 10c formed at the four corners of a square (or rectangular) surface 10a. The bottom surfaces of these recess portions 10c are formed by the first electrode 31, and the first electrode 31 is partially exposed from the semiconductor stack 10 by these recess portions 10c. The exposed portion of the first electrode 31 is electrically connected via a bonding wire to the wiring pattern of the wiring substrate on which the light-emitting element 1A is mounted. Note that the number, shape, and formation position of the recess portions 10c are discretionary and are not limited to those in the examples shown in FIGS. 1 and 3.

The bonding layer 21 and the substrate 20 are positioned on the back surface 10b side with respect to the semiconductor stack 10. The material and thickness of the substrate 20 are not particularly limited as long as the material and thickness have sufficient mechanical strength. As an example, the thickness of the substrate 20 is 50 μm to 500 μm, and in one example, 200 μm. Any solid material such as a semiconductor, a dielectric, and a metal can be adopted as the material of the substrate 20. In one example, the material of the substrate 20 is InP. The bonding layer 21 is an adhesive containing a resin, for example. In one example, the bonding layer 21 includes a resin. As the resin constituting the bonding layer 21, for example, Cyclotene (registered trademark) can be employed. The thickness of the bonding layer 21 is, for example, 10 μm to 100 μm, and in one example, 15 μm. In the present embodiment, since the first electrode 31 is formed in a layer shape on the entire back surface 10b, the bonding layer 21 is in contact with only the first electrode 31. However, when the first electrode 31 is partially provided on the back surface 10b, the bonding layer 21 may be in contact with the first electrode 31 and the semiconductor stack 10.

When the light-emitting element 1A operates, a drive current is supplied from the outside of the light-emitting element 1A via the bonding wire between the exposed portion of the first electrode 31 in the recess portion 10c and the bonding pad unit 32c of the second electrode 32. The drive current flows between the center portion of the first electrode 31 and the current supply unit 32b of the second electrode 32. At this time, light is generated in the active layer 14 by recombination of electrons and holes in the active layer 14. Electrons and holes contributing to this light emission, and the generated light are efficiently confined between the lower cladding layer 12 and the upper cladding layer 15. A part of the light generated in the active layer 14 enters the phase modulation layer 13 and forms a predetermined mode corresponding to the lattice structure inside the phase modulation layer 13. The laser light outputted from the phase modulation layer 13 is outputted from the upper cladding layer 15 to the outside through the plurality of openings 32a of the second electrode 32. At this time, the zero-order light of the laser light is outputted in a direction (Z-axis direction) perpendicular to the main surface 20a. On the other hand, the signal light of the laser light is outputted in a discretionary direction including a direction (normal direction) perpendicular to the main surface 20a and a tilt direction intersecting the normal direction. It is mainly signal light that forms a desired optical image. The signal light is mainly +1st-order light and −1st-order light.

Figure 5:
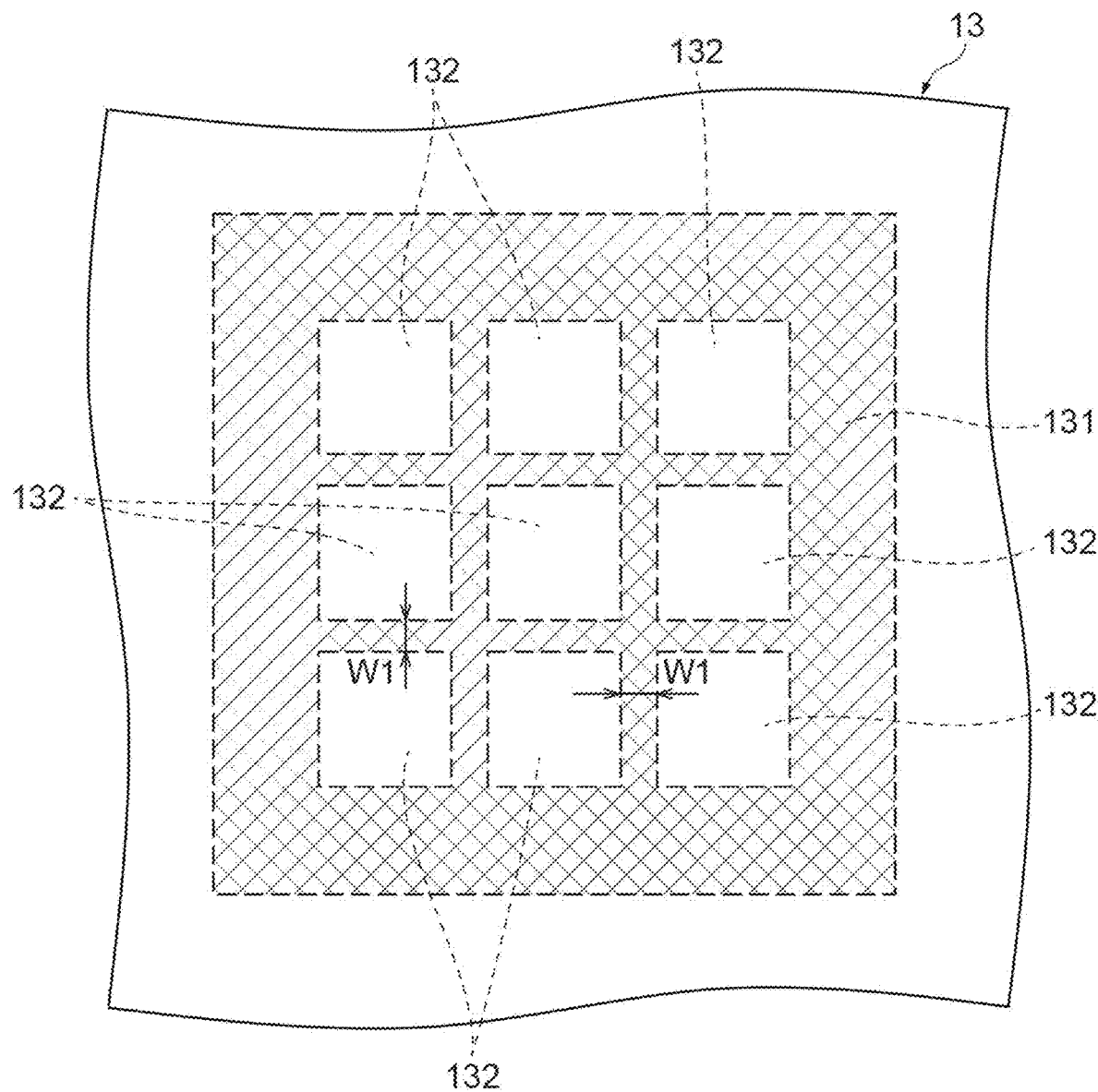
FIG. 5 is a plan view showing the vicinity of a center portion of a phase modulation layer 13 (portion overlapping a current supply unit 32b).

FIG. 5 is a plan view showing the vicinity of the center portion of the phase modulation layer 13 (portion overlapping the current supply unit 32b that is an effective area where signal light forming an optical image is outputted). The effective area of the phase modulation layer 13 includes the first region 131 and a plurality of second regions 132. The first region 131 is a region (that may have a size including the entire second electrode 32) that overlaps the second electrode 32 as viewed from the thickness direction (i.e., Z-axis direction) of the phase modulation layer 13. The second region 132 is a region excluding the first region 131. However, the existence range of the second region 132 is limited to the vicinity of the center portion of the phase modulation layer 13, and does not include a portion of the phase modulation layer 13 positioned outside the second electrode 32 (around the bonding pad unit 32c). The portion of the phase modulation layer 13 positioned outside the second electrode 32 may be included in the first region 131 because the portion does not contribute to light emission.

For example, when the second electrode 32 has a square lattice planar shape, the first region 131 near the center portion (effective area) of the phase modulation layer 13 also has a square lattice planar shape. In this case, the second region 132 overlaps the opening 32a of the second electrode 32 (exposed from the opening 32a). The planar shape of the first region 131 and the position specified on the X-Y plane may coincide with or may not completely coincide with the planar shape of the second electrode 32 and the position on the X-Y plane. For example, a width W1 in the direction perpendicular to the longitudinal direction of each portion of the first region 131 may be larger or may be smaller than a width W2 in the direction perpendicular to the longitudinal direction of each portion of the second electrode 32 (see FIG. 2).

Figure 6:
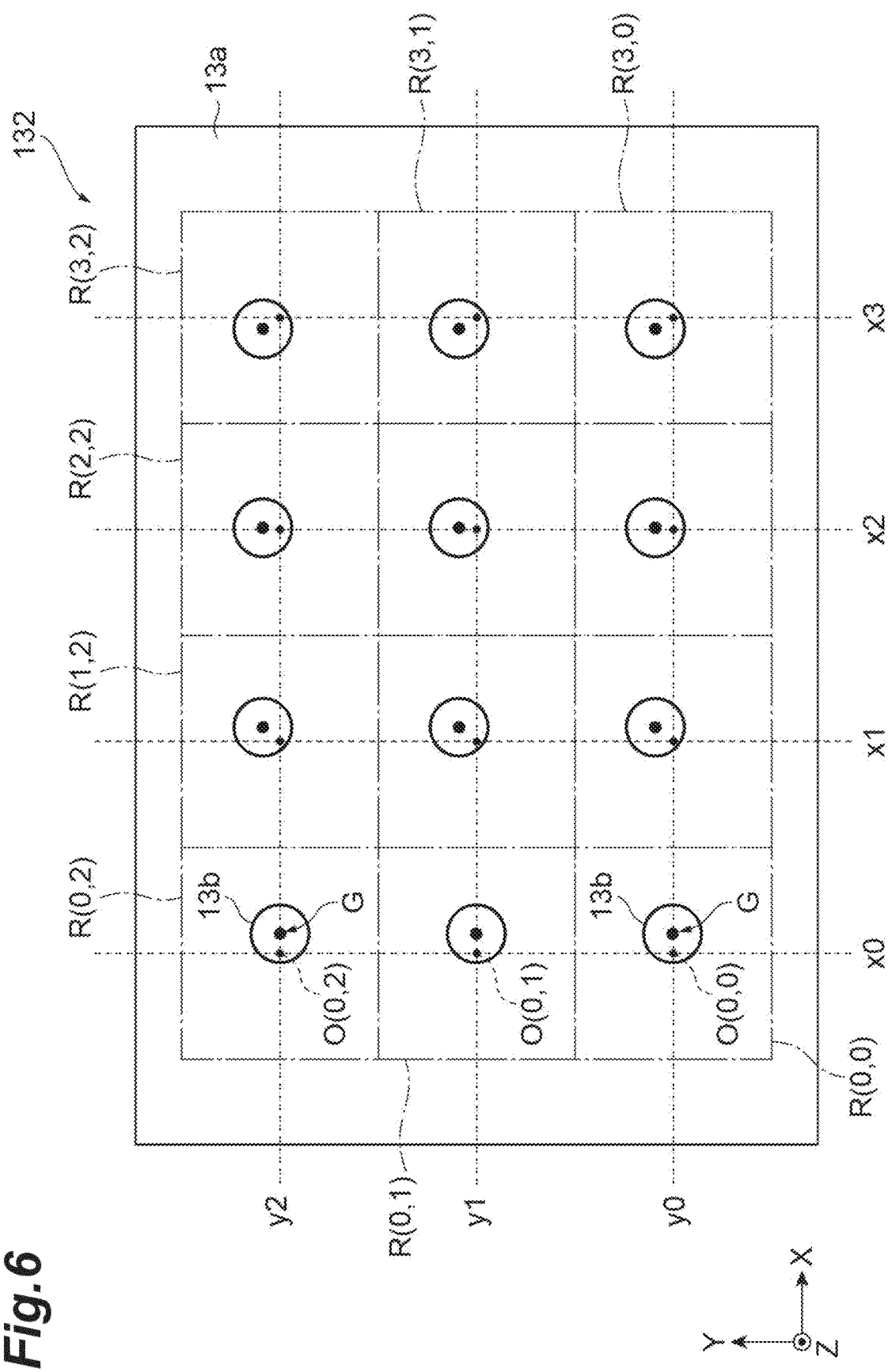
FIG. 6 is a plan view showing the configuration of a second region 132 of the phase modulation layer 13.

FIG. 6 is a plan view showing the configuration of the second region 132 of the phase modulation layer 13. The second region 132 includes the base layer 13a including the first refractive index medium, and the modified refractive index region 13b including the second refractive index medium having a refractive index different from that of the first refractive index medium. Here, a virtual square lattice is set on the reference plane (X-Y plane) of the phase modulation layer 13. One side of the square lattice is parallel with the X-axis, and the other side is parallel with the Y-axis. At this time, each intersection of a plurality of columns (x0 to x3) along the X-axis and a plurality of rows (y0 to y2) along the Y-axis becomes a lattice point O of the square lattice. The square unit constituent region R centered on the lattice point O can be set two-dimensionally on the X-Y plane. Assuming that the XY coordinates of each unit constituent region R are given by the barycentric position of each unit constituent region R, the barycentric position of each unit constituent region R coincides with the lattice point O of the virtual square lattice. The plurality of modified refractive index regions 13b are provided, for example, one by one in each unit constituent region R. The planar shape of the modified refractive index region 13b is circular, for example. The lattice point O may be positioned outside the modified refractive index region 13b or included inside the modified refractive index region 13b. In each unit constituent region R, the center of gravity G of the modified refractive index region 13b is arranged away from the lattice point O closest to this.

Figure 7:
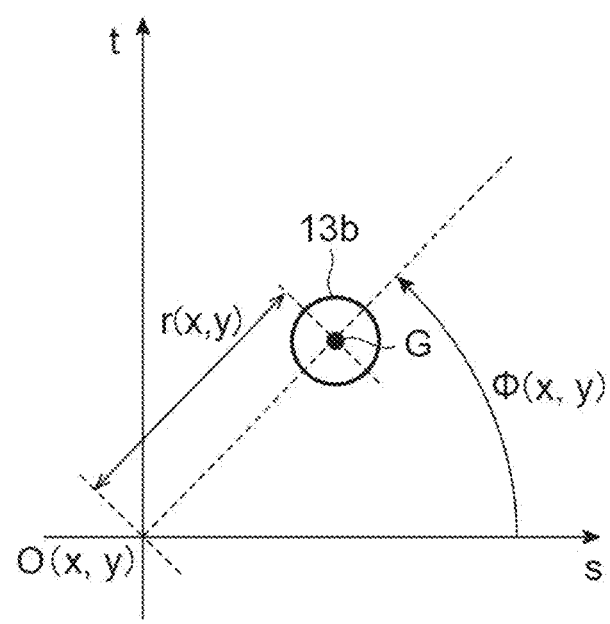
FIG. 7 is an enlarged view of a part (unit constituent region R) of the phase modulation layer 13.

FIG. 7 is an enlarged view of a part (unit constituent region R (x, y)) of the phase modulation layer 13, and the position in the unit constituent region R (x, y) is specified by an s-axis parallel to the X-axis and a t-axis parallel to the Y-axis. As shown in FIG. 7, each modified refractive index region 13b has the center of gravity G Here, the angle formed by the vector from the lattice point O (x, y) toward the center of gravity G and the X-axis is defined as φ (x, y). When the rotation angle φ (x, y) is 0°, the orientation of the vector connecting the lattice point O (x, y) and the center of gravity G coincides with the positive direction of the X-axis. Let the length of the vector connecting the lattice point O (x, y) and the center of gravity G be r (x, y). In one example, r (x, y) is constant (over the entire phase modulation layer 13) regardless of the values of the x component and y component.

As shown in FIG. 7, in the second region 132, the orientation of the vector connecting the lattice point O (x, y) and the center of gravity G, i.e., the rotation angle φ (x, y) around the lattice point O (x, y) of the center of gravity G in the modified refractive index region 13b is individually set according to a phase pattern corresponding to a desired optical image. The rotation angle distribution φ constituted by the phase pattern, i.e., the rotation angle φ (x, y) has a specific value for each unit constituent region R determined by the values of the x component and the y component, but is not necessarily expressed by a specific function. That is, the rotation angle distribution φ is determined by extracting a phase distribution from a complex amplitude distribution obtained by performing inverse Fourier transformation of a desired optical image. When the complex amplitude distribution is obtained from a desired optical image, the reproducibility of the target output beam pattern is improved by applying a repetition algorithm such as the Gerchberg-Saxton (GS) method commonly used at the time of calculation of hologram generation.

Figure 8:
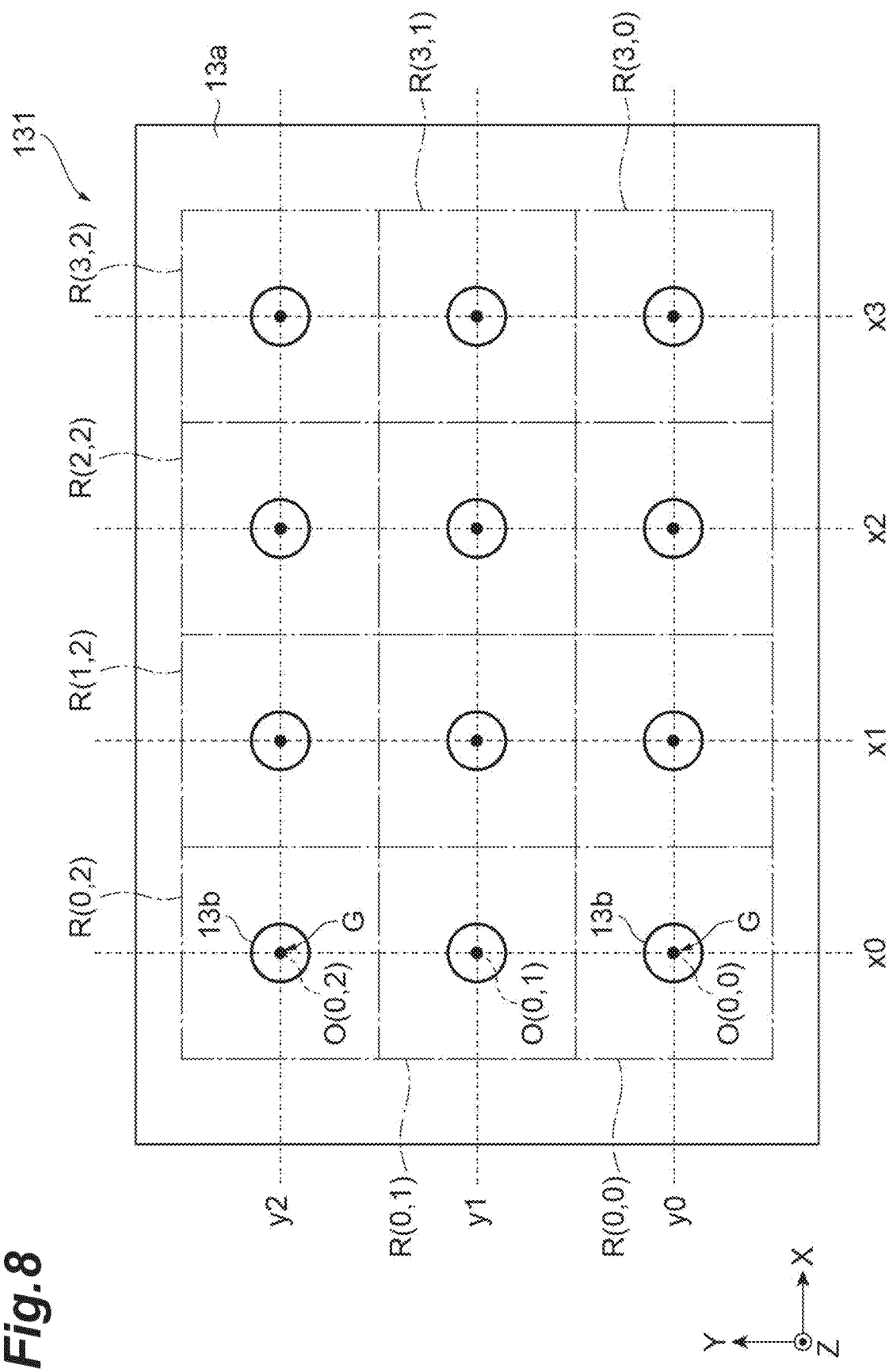
FIG. 8 is a plan view showing a configuration example of a first region 131 of the phase modulation layer 13.

FIG. 8 is a plan view showing the configuration example of the first region 131 of the phase modulation layer 13. Similar to the second region 132, the first region 131 includes the base layer 13a including the first refractive index medium, and the modified refractive index region 13b including the second refractive index medium having a refractive index different from that of the first refractive index medium. One of the plurality of modified refractive index regions 13b is provided in the unit constituent region R (x, y) (one modified refractive index regions 13b is associated with the lattice point O (x, y)). The planar shape of the modified refractive index region 13b is circular, for example. In the first region 131, unlike the second region 132, in the unit constituent region R (x, y), the center of gravity G of the modified refractive index region 13b is arranged on the lattice point O (x, y) in the unit constituent region R (x, y). In other words, the position of the center of gravity G of each modified refractive index region 13b coincides with the associated lattice point O (x, y). Thus, since the first region 131 has a structure as a normal photonic crystal laser, it contributes only to the zero-order light and not to the signal light forming an optical image. In the present embodiment, only the light components having been outputted from the second region 132 of the phase modulation layer 13 and passed through the second electrode 32 complete a desired optical image without omission of information as a single beam pattern.

Figure 9:
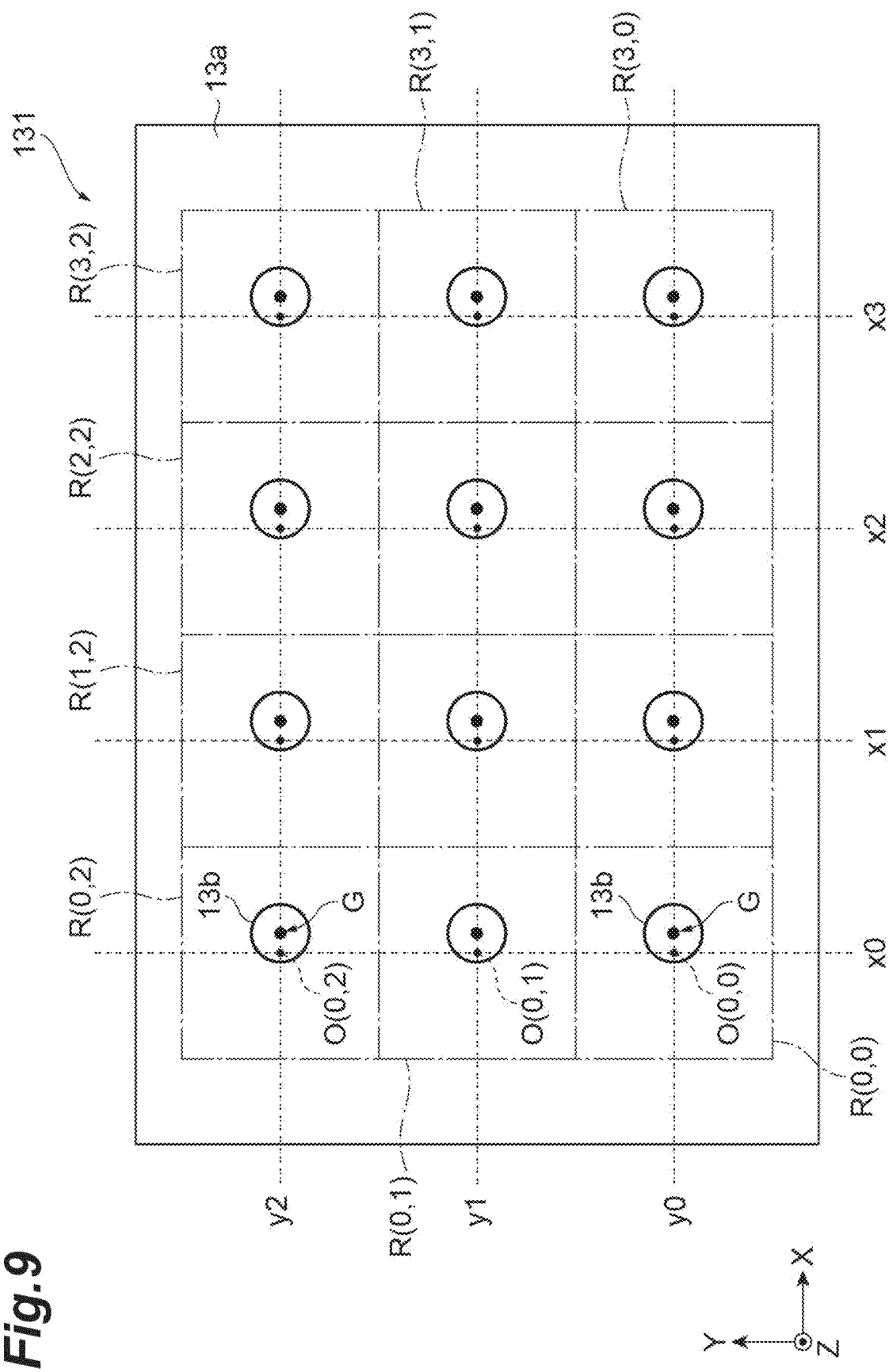
FIG. 9 is a plan view showing another configuration example of the first region 131 of the phase modulation layer 13.

FIG. 9 is a plan view showing another configuration example of the first region 131 of the phase modulation layer 13. As shown in FIG. 9, in the first region 131, the center of gravity G of the modified refractive index region 13b may be arranged away from the closest lattice point O (x, y) in the associated unit constituent region R (x, y). In that case, r (x, y) and the rotation angle φ (x, y) around the lattice point O (x, y) shown in FIG. 7 are set to be constant (throughout the entire first region 131) regardless of the values of the x component and y component or irrelevant to the optical image. Even in such a case, a desired optical image without omission of information is completed only by the second region 132.

In the second region 132 of the phase modulation layer 13, the rotation angle at coordinates (x, y) constituting the rotation angle distribution φ is designed so that all phases of 0 to 2π (rad) are included to the same degree. In other words, for each modified refractive index region 13b, a vector OG from the lattice point O (x, y) of the square lattice toward the center of gravity G of the associated modified refractive index region 13b is obtained, and the vectors OG are added over the entire phase modulation layer 13, whereby the vector OG approaches zero. This means that, on average, the modified refractive index region 13b is on the lattice point O of each associated square lattice. That is, as a whole, a two-dimensional distribution Bragg diffraction effect similar to that when each modified refractive index region 13b is arranged on the associated lattice point O is obtained, and hence the formation of the standing wave becomes easy and threshold current reduction for oscillation can be expected. Here, in the case where the center of gravity G of each modified refractive index region 13b is arranged so as to coincide with the associated lattice point O as shown in FIG. 8 in each unit constituent region R positioned in the first region 131 of the phase modulation layer 13, the two-dimensional Bragg diffraction effect similar to that when the modified refractive index region 13b is arranged on the lattice point O in the entire phase modulation layer 13 is obtained by combining with the above-described second region 132. As a result, the formation of the standing wave become easy, and it can be expected to be able to further reduce the threshold current for oscillation.

Figure 10:
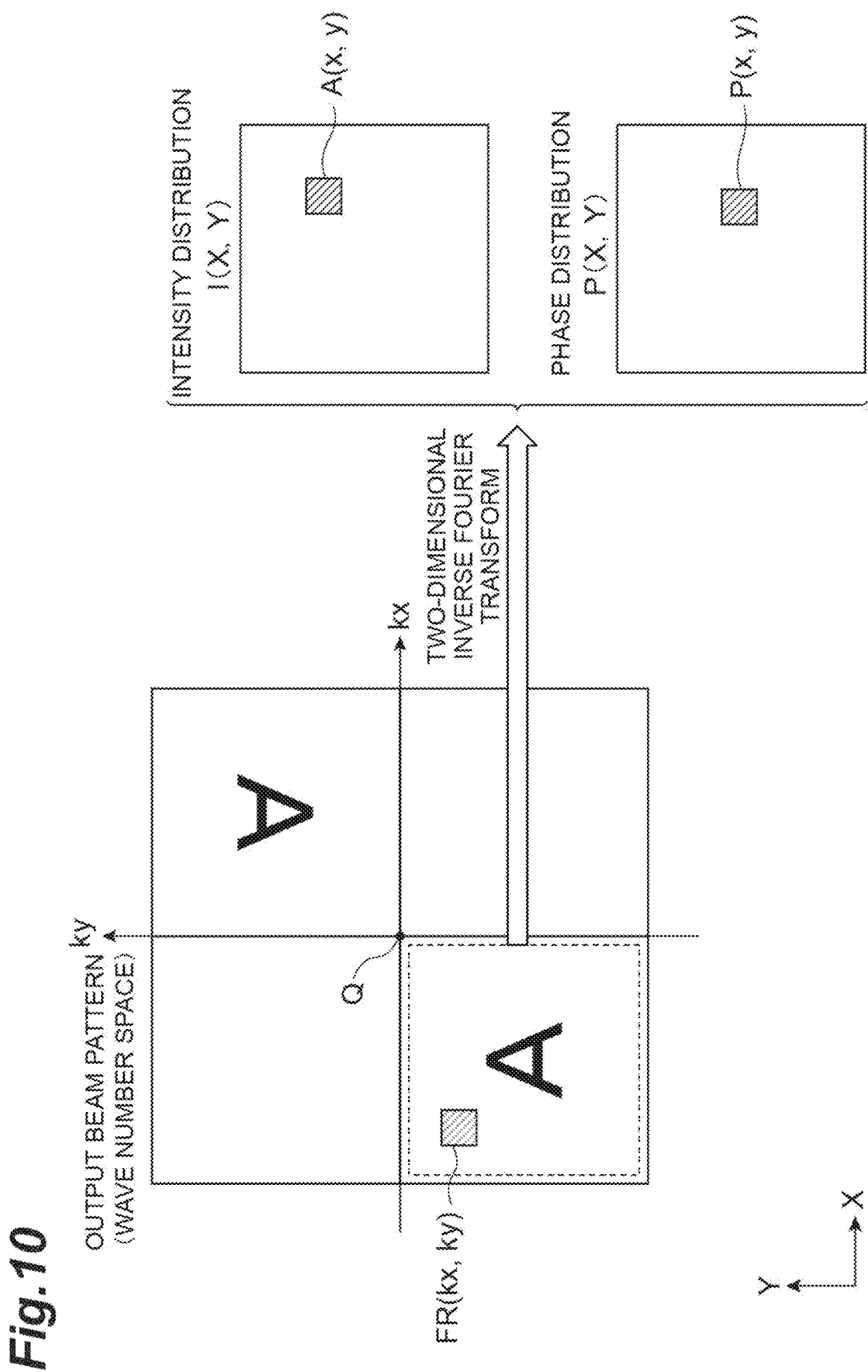
FIG. 10 is a view for explaining the relationship between an optical image obtained by imaging an output beam pattern of the light-emitting element 1A and a rotation angle distribution φ in the second region 132.

FIG. 10 is a view for explaining the relationship between an optical image obtained by imaging an output beam pattern of the light-emitting element 1A and the rotation angle distribution φ in the second region 132. A center Q of the output beam pattern is not necessarily positioned on an axis perpendicular to the main surface 20a of the substrate 20, but can be arranged on a perpendicular axis. For the sake of explanation, the center Q is assumed to be on an axis perpendicular to the main surface 20a. FIG. 10 shows four quadrants with the center Q as the origin. FIG. 10 shows a case in which optical images are obtained in the first quadrant and the third quadrant as an example, but images can be obtained in the second quadrant and the fourth quadrant or all the quadrants. In the present embodiment, as shown in FIG. 10, an optical image that is point symmetric with respect to the origin is obtained. FIG. 10 shows, as an example, a case where the character "A" is obtained in the third quadrant and a pattern with the character "A" rotated by 180 degrees is obtained in the first quadrant. Note that in the case of a rotationally symmetric optical image (e.g., cross, circle, double circle, and so on), they are observed as one optical image where they overlap.

The optical image of the output beam pattern of the light-emitting element 1A includes at least one of a spot, a straight line, a cross, a line drawing, a lattice pattern, a photograph, a stripe pattern, computer graphics (CG), and a character. Here, in order to obtain a desired optical image, the rotation angle φ (x, y) of the modified refractive index region 13b of the second region 132 is determined by the following procedure.

In the present embodiment, a desired optical image can be obtained by determining the rotation angle distribution φ by the following procedure. First, as a first precondition, in an XYZ orthogonal coordinate system defined by the Z-axis coincident with the normal direction and the X-Y plane including the X-axis and the Y-axis orthogonal to each other coincident with one surface of the phase modulation layer 13 including the plurality of modified refractive index regions 13b, a virtual square lattice composed of M1 (integer equal to or greater than 1)×N1 (integer equal to or greater than 1) unit constituent regions R each having a square shape is set on the X-Y plane.

Figure 11:
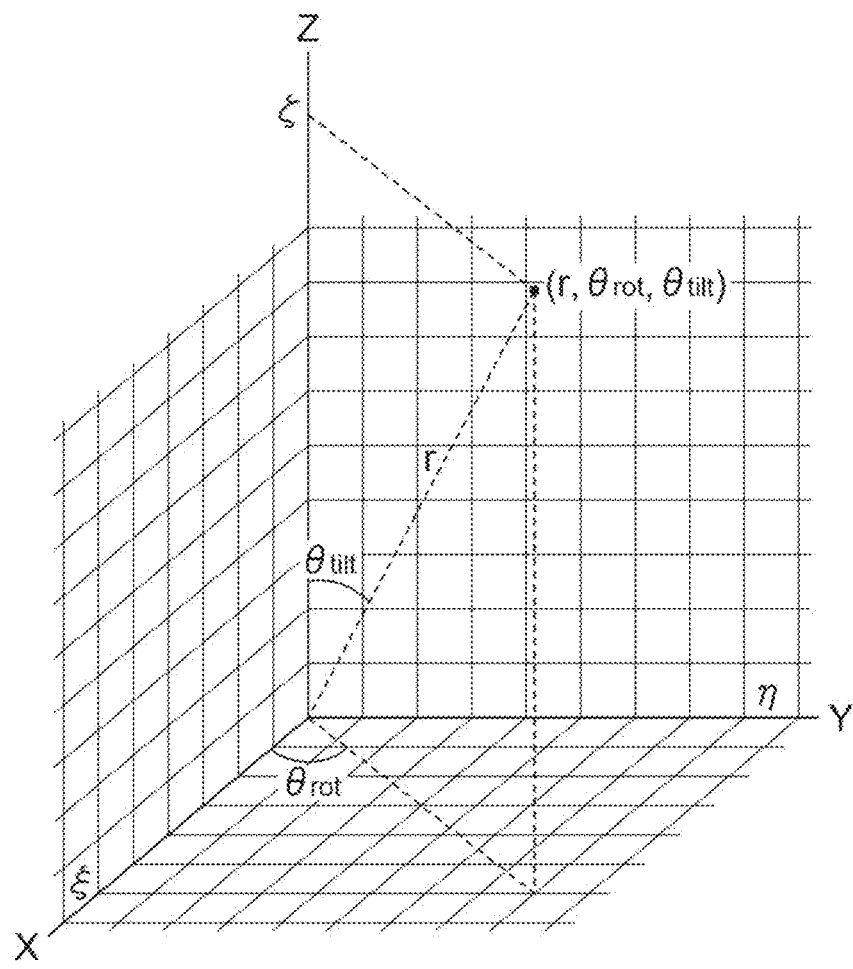
FIG. 11 is a view for explaining coordinate transformation from spherical coordinates (r, $\theta_{rot}$, $\theta_{tilt}$) to coordinates 0 in an XYZ orthogonal coordinate system.

As a second precondition, it is assumed that coordinates in the XYZ orthogonal coordinate system satisfy the relationship shown by the following Expressions (1) to (3) with respect to spherical coordinates (r, $\theta_{rot}$, $\theta_{tilt}$) defined by a length r of a moving radius, a tilt angle $\theta_{tilt}$ from the Z-axis, and a rotation angle $\theta_{rot}$ from the X-axis specified on the X-Y plane, as shown in FIG. 11. Note that FIG. 11 is a view for explaining coordinate transformation from the spherical coordinates (r, $\theta_{rot}$, $\theta_{tilt}$) to the coordinates O in the XYZ orthogonal coordinate system, in which the coordinates O express a design optical image on a predetermined plane that is set in the XYZ orthogonal coordinate system, which is a real space. When the beam pattern corresponding to the optical image outputted from the semiconductor light-emitting element 1A is a set of bright spots directed to the direction defined by the angles $\theta_{tilt}$ and $\theta_{rot}$, the angles $\theta_{tilt}$ and $\theta_{rot}$ are assumed to be converted into a coordinate value $k_x$ on a Kx-axis, which is a normalized wave number defined by the following Expression (4) and corresponds to the X-axis, and a coordinate value $k_y$ on a Ky-axis, which is a normalized wave number defined by the following Expression (5), corresponds to the Y-axis, and is orthogonal to the Kx-axis. The normalized wave number means a wave number normalized with the wave number 2 π/a corresponding to the lattice spacing of a virtual square lattice being 1.0. At this time, in the wave number space defined by the Kx-axis and the Ky-axis, a specific wave number range including the beam pattern corresponding to an optical image is constituted of M2 (integer equal to or greater than 1)×N2 (integer equal to or greater than 1) image regions FR each having a square shape. Note that the integer M2 does not necessarily coincide with the integer M1. Similarly, the integer N2 also does not necessarily coincide with the integer N1. Equations (4) and (5) are disclosed in the above-mentioned Non-Patent Document 1, for example.

$$\xi = r \sin\theta_{tilt} \cos\theta_{rot} \quad (1)$$

$$\eta = r \sin\theta_{tilt} \sin\theta_{rot} \quad (2)$$

$$\zeta = r \cos\theta_{tilt} \quad (3)$$

$$k_x = \frac{a}{\lambda} \sin\theta_{tilt} \cos\theta_{rot} \quad (4)$$

$$k_y = \frac{a}{\lambda} \sin\theta_{tilt} \sin\theta_{rot} \quad (5)$$

a: A lattice constant of the virtual square lattice
λ: An oscillation wavelength of the light-emitting element 1A As a third precondition, in the wave number space, a complex amplitude F (x, y) obtained by performing two-dimensional inverse discrete Fourier transform of each image region FR ($k_x$, $k_y$) specified by the coordinate component $k_x$ (integer equal to or greater than 0 and equal to or less than M2−1) in the Kx-axis direction and the coordinate component $k_y$ (integer equal to or greater than 0 and equal to or less than N2-1) in the Ky-axis direction into the unit constituent region R (x, y) on the X-Y plane specified by the coordinate component x (integer equal to or greater than 0 and equal to or less than M1−1) in the X-axis direction and the coordinate component y (integer equal to or greater than 0 and equal to or less than N1−1) in the Y-axis direction is given by the following Expression (6) with j being an imaginary unit. Let the amplitude term be A (x, y) and the phase term be P (x, y), this complex amplitude F (x, y) is defined by the following Expression (7). As a fourth precondition, the unit constituent region R (x, y) is defined by the s-axis and the t-axis, which are parallel to the X-axis and the Y-axis, respectively, and orthogonal to each other at the lattice point O (x, y) serving as the center of the unit constituent region R (x, y).

$$F(x,y) = \sum_{k_x=0}^{M2-1} \sum_{k_y=0}^{N2-1} FR(k_x, k_y) \exp\left[j2\pi\left(\frac{k_x}{M2}x + \frac{k_y}{N2}y\right)\right] \quad (6)$$

$$F(x,y) = A(x,y) \times \exp[jP(x,y)] \quad (7)$$

Under the first to fourth preconditions described above, the second region 132 of the phase modulation layer 13 is configured to satisfy the following first and second conditions. That is, the first condition is that the center of gravity G is arranged away from the lattice point O (x, y) in the unit constituent region R (x, y). The second condition is that in a state where the line segment length r (x, y) from the lattice point O (x, y) to the associated center of gravity G is set to a common value in each of the M1×N1 unit constituent regions R, the associated modified refractive index region 13b is arranged in the unit constituent region R (x, y) so that the angle φ (x, y) formed by the line segment connecting the lattice point O (x, y) and the associated center of gravity G and the s-axis satisfies the relationship as follows:

φ(x,y)=C×P(x,y)+B

C: Proportional constant, e.g., 180°/π
B: Discretionary constant, e.g., 0.

As a method of obtaining the intensity distribution and the phase distribution from the complex amplitude distribution obtained by inverse Fourier transform, for example, an intensity distribution I (x, y) can be calculated by using the abs function of "MATLAB", numerical analysis software of MathWorks, Inc., and a phase distribution P (x, y) can be calculated by using the angle function of MATLAB.

Here, points of attention will be given regarding a case where a general discrete Fourier transform (or fast Fourier transform) is used for calculation when the rotation angle φ (x, y) is obtained from the inverse Fourier transform result of the optical image and the arrangement of each modified refractive index region 13b is determined. When the optical image before the inverse Fourier transform is divided into four quadrants of A1, A2, A3, and A4 as shown in FIG. 12A, the resulting beam pattern becomes as shown in FIG. 12B. That is, in the first quadrant of the beam pattern, a pattern in which the pattern obtained by rotating the pattern in the first quadrant in FIG. 12A by 180 degrees and the pattern in the third quadrant in FIG. 12A are superimposed appears. In the second quadrant of the beam pattern, a pattern in which the pattern obtained by rotating the pattern in the second quadrant in FIG. 12A by 180 degrees and the pattern in the fourth quadrant in FIG. 12A are superimposed appears. In the third quadrant of the beam pattern, a pattern in which the pattern obtained by rotating the pattern in the third quadrant in FIG. 12A by 180 degrees and the pattern in the first quadrant in FIG. 12A are superimposed appears. In the fourth quadrant of the beam pattern, a pattern in which the pattern obtained by rotating the pattern in the fourth quadrant in FIG. 12A by 180 degrees and the pattern in the second quadrant in FIG. 12A are superimposed appears.

Therefore, when an optical image having a value (pattern) only in the first quadrant is used as an optical image (original optical image) before the inverse Fourier transform, the first quadrant of the original optical image appears in the third quadrant in the resulting beam pattern, and a pattern in which the first quadrant of the original optical image is rotated by 180 degrees appears in the first quadrant in the resulting beam pattern.

Thus, in the light-emitting element 1A, a desired beam pattern is obtained by phase-modulating the wavefront. It is possible to provide this beam pattern as not only a pair of unimodal beams (spots) but also a character shape, two or more identical shape spot groups, or a vector beam having a spatially non-uniform phase and intensity distribution.

Figure 13:
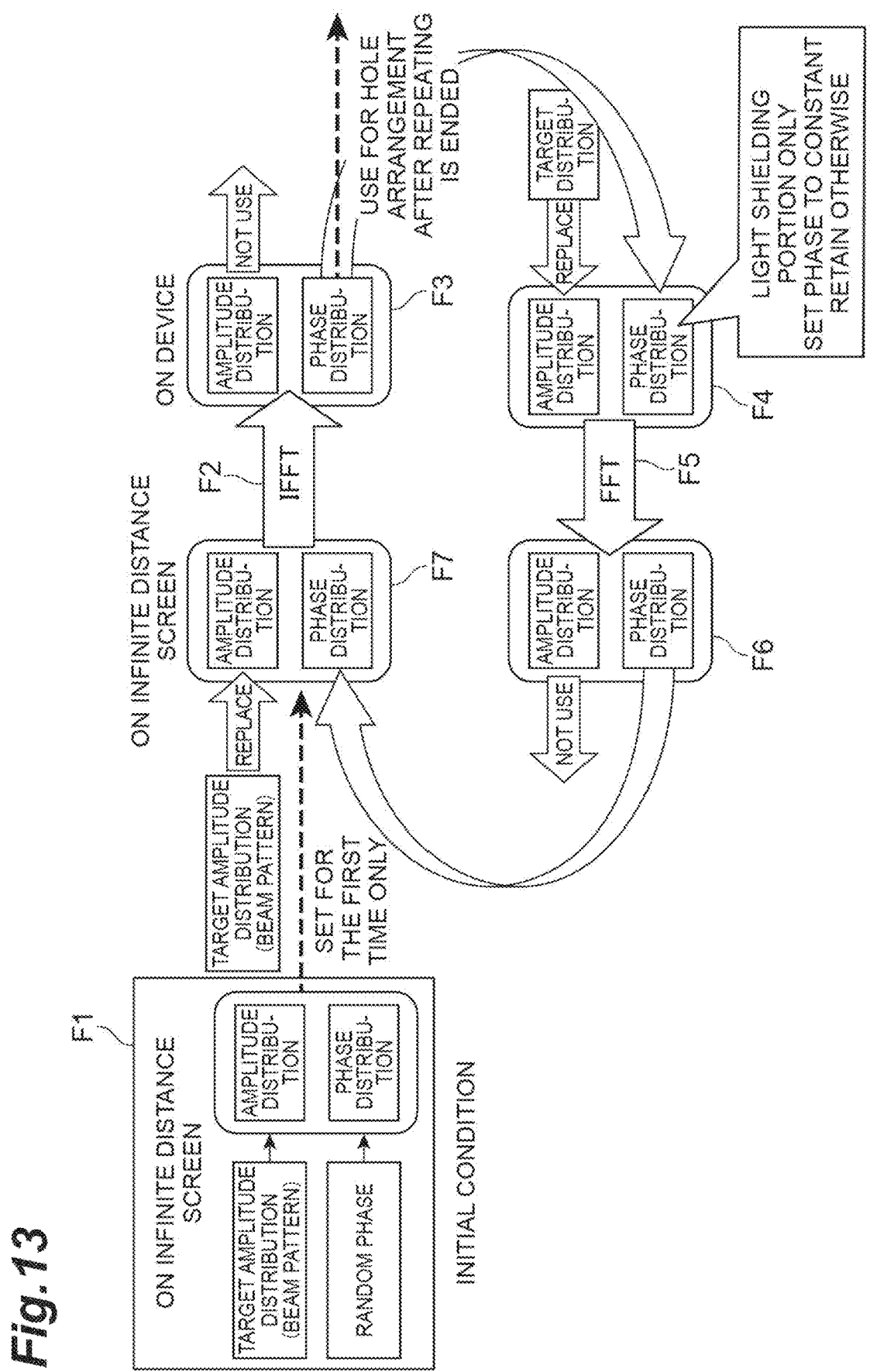
FIG. 13 is a conceptual view of an iterative algorithm used in the present embodiment.

FIG. 13 is a conceptual view of the iterative algorithm used in the present embodiment. This iterative algorithm is based on the GS method. First, a target amplitude distribution is obtained from the square root of a target intensity distribution (beam pattern) on an infinite distance screen (processing F1). At this time, the phase distribution is made random, and a complex amplitude distribution composed of a target amplitude distribution and a random phase distribution is made to be an initial condition. Next, inverse Fourier transform of this complex amplitude distribution is performed (processing F2). Thus, the complex amplitude distribution in the phase modulation layer 13 is obtained (processing F3).

Subsequently, the amplitude distribution (i.e. r (x, y)) and the phase distribution (i.e. φ (x, y)) of the complex amplitude distribution in the phase modulation layer 13 are each replaced with the target distribution. For example, the amplitude distribution is replaced with a target distribution having a constant value in the first region 131 and the second region 132, and the phase distribution is replaced with a target distribution having a constant value in the first region 131 and an original value retained in the second region 132 (processing F4).

Subsequently, Fourier transformation of the complex amplitude distribution including the amplitude distribution and the phase distribution after replacement is performed (processing F5). Thus, the complex amplitude distribution on the infinite distance screen is obtained (processing F6). Of the complex amplitude distribution, the amplitude distribution is replaced with the target amplitude distribution (beam pattern), and the phase distribution remains as it is (processing F7). By performing the inverse Fourier transform of the complex amplitude distribution including the amplitude distribution and the phase distribution (processing F2), the complex amplitude distribution in the phase modulation layer 13 is obtained again (processing F3). The above processing F2 to F7 are repeated a sufficient number of times. Then, of the complex amplitude distribution in the phase modulation layer 13 having been finally obtained, the phase distribution is used for arrangement of the modified refractive index region 13b in the phase modulation layer 13. This method enables the optical image to be completed from the distribution of the modified refractive index region 13b only of the second region 132. At this time, the phase distribution corresponding to the first region 131 has a constant value, but the modified refractive index region 13b positioned in the first region 131 does not contribute to the formation of the optical image. Therefore, in the virtual square lattice, the position of the center of gravity G of each modified refractive index region 13b positioned in the first region 131 may be arranged on the associated lattice point O, or may be arranged away from the associated lattice point O so as to have a certain rotation angle φ around the lattice point O.

Figure 14A:
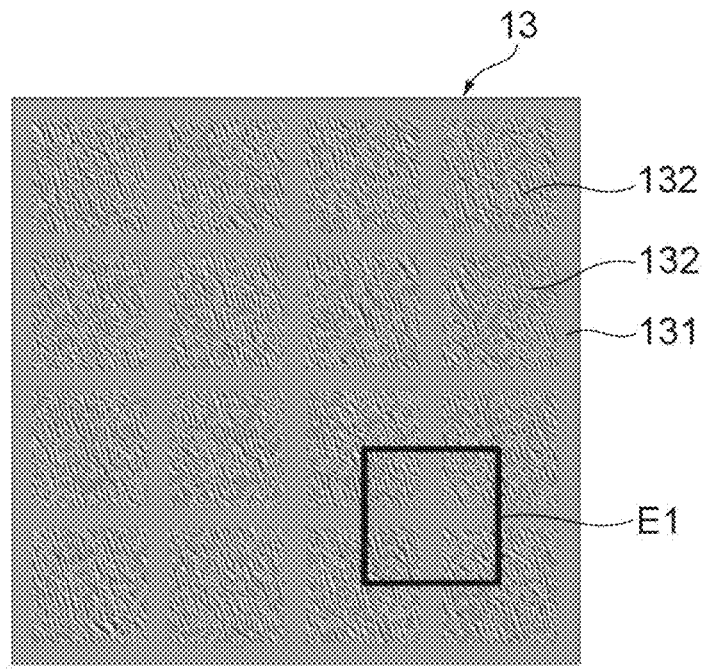
FIG. 14A is a view showing a distribution (i.e., phase distribution) of the rotation angle φ in the entire phase modulation layer 13 generated by iterating the above calculation 1000 times.
Figure 14B:
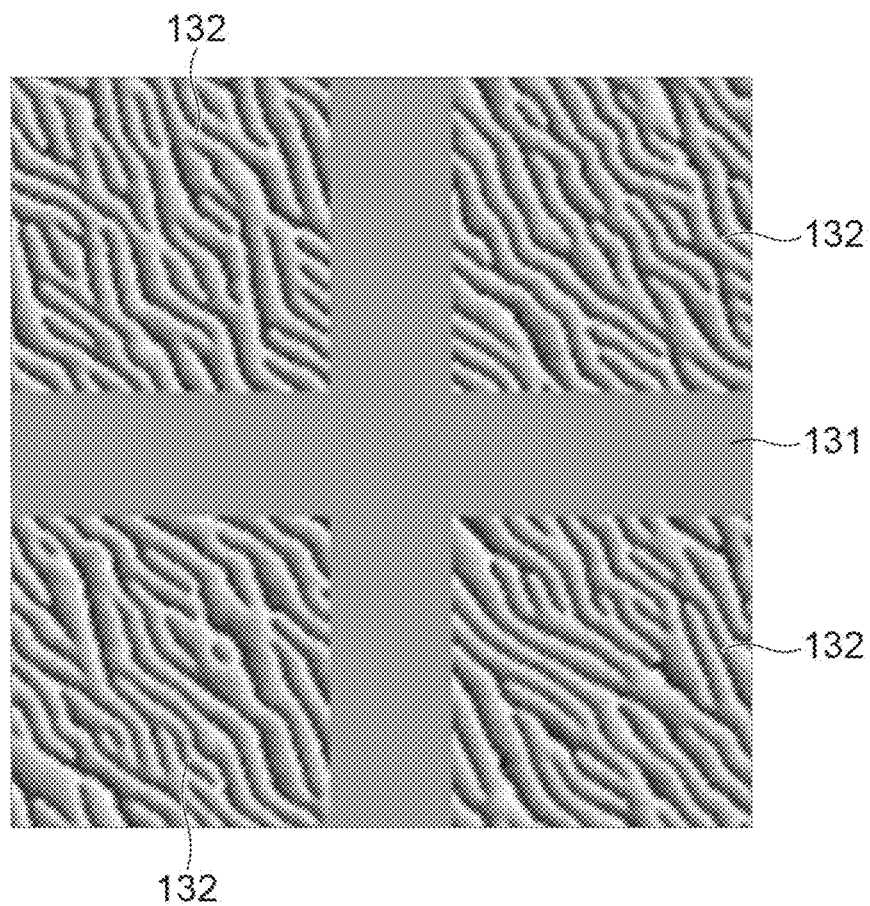
FIG. 14B is an enlarged view showing a part E1 of FIG. 14A.

FIG. 14A is a view showing the distribution (i.e., phase distribution) of the rotation angle φ in the entire phase modulation layer 13 generated by iterating the above calculation 1000 times. FIG. 14B is an enlarged view showing the part E1 of FIG. 14A. FIGS. 14A and 14B indicate the magnitude of the rotation angle φ by the tint of color. The rotation angle φ varies in the range of 0 to 2 π. FIGS. 14A and 14B indicate that in the first region 131, the tint of color is constant and the rotation angle φ is constant. In the second region 132, the tint of color constitutes a phase distribution corresponding to the inverse Fourier transform of the desired beam pattern, and is independently set for each unit constituent region R in accordance with the desired optical image.

The refractive index of the base layer 13a is preferably 3.0 to 3.5, and the refractive index of the modified refractive index region 13b is preferably 1.0 to 3.4. The average radius of each modified refractive index region 13b in the hole of the base layer 13a is, for example, 20 nm to 90 nm in a case of an optical output of the 940 nm band. The diffraction intensity changes by changing the size of each modified refractive index region 13b. This diffraction intensity is proportional to an optical coupling coefficient expressed by a coefficient when the inverse Fourier transform of the shape of the modified refractive index region 13b is performed. The optical coupling coefficient is described in Non-Patent Document 2, for example.

In the above structure, the material system, the film thickness, and the structure of the layer can be changed variously as long as the structure includes the active layer 14 and the phase modulation layer 13. Here, the scaling law holds for the so-called square lattice photonic crystal laser when the perturbation from the virtual square lattice is 0. That is, when the wavelength becomes a constant α times, a similar standing wave state can be obtained by multiplying the entire square lattice structure by a times. Similarly, also in the present embodiment, the structure of the phase modulation layer 13 can be determined by the scaling law according to the wavelength. Therefore, it is also possible to realize the light-emitting element 1A that outputs visible light by using the active layer 14 that emits light such as blue, green, and red, and applying the scaling law according to the wavelength.

Next, a manufacturing method for the light-emitting element 1A of the present embodiment will be described. FIGS. 15A to 18B are views showing each step in the manufacturing method for the light-emitting element 1A, and schematically show a cross section of the light-emitting element 1A in the middle of manufacturing. FIGS. 15A to 15C, 16A to 16C, 17A, 18A, and 18B schematically show cross sections corresponding to the cross sections (see FIG. 2) along the line II-II in FIG. 1, and FIGS. 17B and 17C schematically show cross sections corresponding to the cross sections (see FIG. 3) along the line III-III in FIG. 1. In the following description, the metal organic chemical vapor deposition (MOCVD) method or the molecular beam epitaxy method (MBE) is used for the epitaxial growth of each semiconductor layer. Trimethylaluminum (TMA) is used as the Al raw material. Trimethylgallium (TMG) and triethylgallium (TEG) are used as the gallium raw material. Trimethylindium (TMI) is used as the In raw material. Phosphine ($PH_3$) is used as the P raw material. Arsine ($AsH_3$) is used as the As raw material. Monosilane ($SiH_4$) or disilane ($Si_2H_6$) is used as a raw material for n-type impurities. Diethyl zinc (DEZn) is used as a raw material for p-type impurities.

Figure 15A:
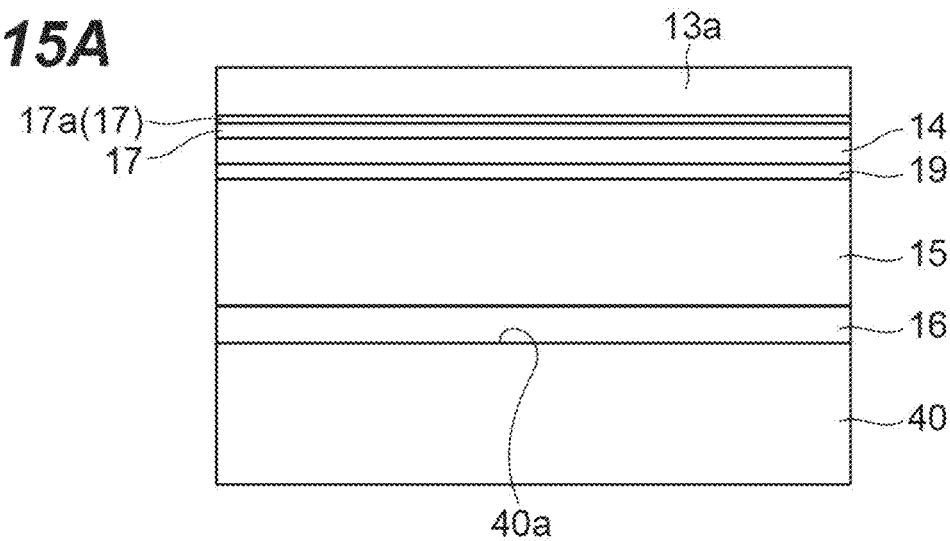
FIGS. 15A to 15C are views showing each step in the manufacturing method for the light-emitting element 1A, and schematically show a cross section of the light-emitting element 1A in the middle of manufacturing.

First, in the first step, a growth substrate 40 shown in FIG. 15A is prepared. The growth substrate 40 is a substrate that has a flat main surface 40a and has a lattice constant suitable for epitaxial growth of the semiconductor stack 10. For example, when the active layer 14 includes AlGaInP/GaInP, a GaAs substrate is used as the growth substrate 40. In that case, the off angle of the main surface 40a is 10°, for example. When the semiconductor stack 10 includes an InP compound semiconductor, an InP substrate is used as the growth substrate 40. When the semiconductor stack 10 includes a nitride compound semiconductor, a GaN substrate is used as the growth substrate 40.

In the next step, on the main surface 40a of the growth substrate 40, the layers from the front surface 10a of the semiconductor stack 10 to the base layer 13a of the phase modulation layer 13 are formed in order from the upper contact layer 16 side (upper cladding layer 15 side) (epitaxial growth). Specifically, as shown in FIG. 15A, first, the upper contact layer 16 grows on the main surface 40a of the growth substrate 40. Next, the upper cladding layer 15 grows on the main surface 40a (on the upper contact layer 16) of the growth substrate 40. The light guide layer 19 grows on the upper cladding layer 15. The active layer 14 grows on the upper cladding layer 15 (on the light guide layer 19). The light guide layer 17 including the carrier barrier layer 17a grows on the active layer 14. The base layer 13a of the phase modulation layer 13 grows on the active layer 14 (on the light guide layer 17). In the case where the phase modulation layer 13 is provided between the active layer 14 and the lower cladding layer 12, the base layer 13a is only required to be grown on the upper cladding layer 15 without forming the light guide layer 19, the active layer 14, and the light guide layer 17 at this stage.

Figure 15B:
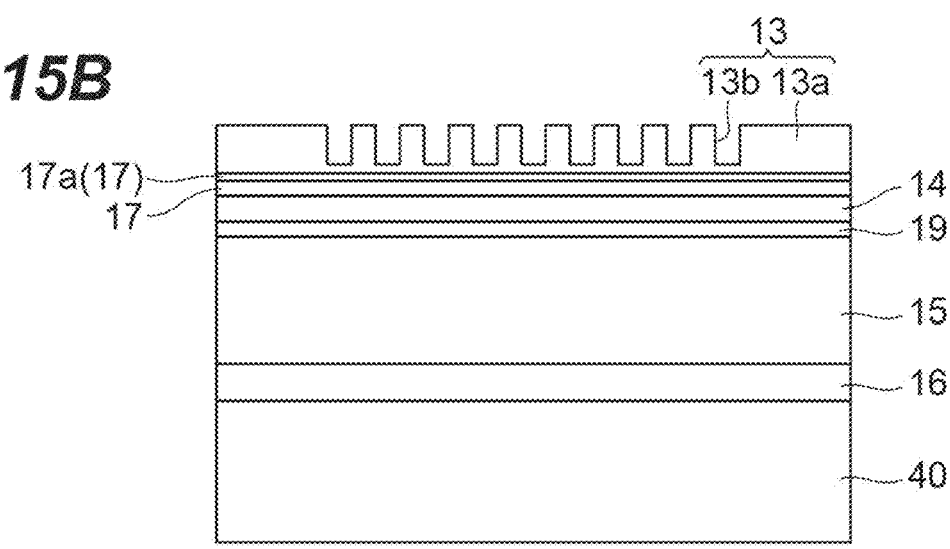

Next, as shown in FIG. 15B, a plurality of holes as the modified refractive index region 13b are formed in the base layer 13a. The plurality of holes can be formed by etching the base layer 13a, for example. Specifically, after a two-dimensional fine pattern is drawn by an electron beam exposure system on the resist applied on the base layer 13a, this resist is developed to form the two-dimensional fine pattern. Thereafter, using the resist as a mask, the two-dimensional fine pattern is transferred onto the base layer 13a by dry etching (after a plurality of holes are formed), and then the resist is removed. Note that dry etching may be performed after formation of an SiN layer or an SiO$_2$ layer on the base layer 13a by the plasma CVD before resist formation, formation of a resist mask on the formed layer, transfer of the fine pattern to the SiN layer or the SiO$_2$ layer by using reactive ion etching (RIE), and resist removal. In this case, resistance to dry etching can be enhanced. Thus, the phase modulation layer 13 including the plurality of modified refractive index regions 13b is formed.

Figure 15C:
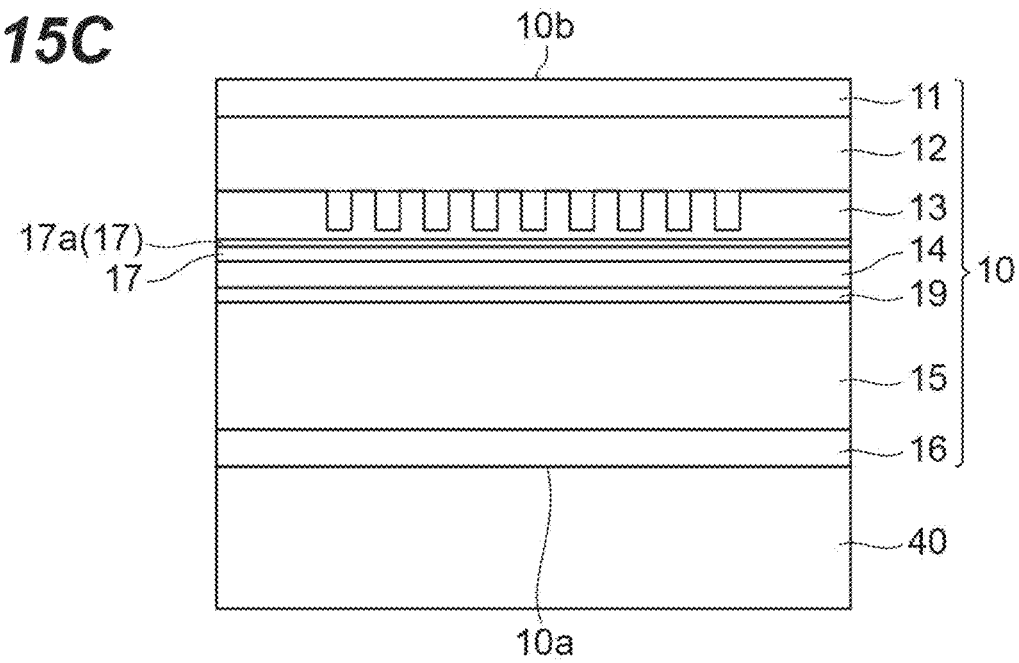

Subsequently, as shown in FIG. 15C, the remaining semiconductor layer of the semiconductor stack 10 is formed on the phase modulation layer 13 (epitaxial growth). That is, after the lower cladding layer 12 grows on the phase modulation layer 13, the lower contact layer 11 grows on the lower cladding layer 12. Thus, the semiconductor stack 10 is completed. At the time of the epitaxial growth of the lower cladding layer 12, the lower cladding layer 12 covers the plurality of holes, but a plurality of depressions (smooth unevenness) are generated on the growth surface of the lower cladding layer 12 due to the existence of the plurality of holes. Since the plurality of depressions are taken over also at the time of epitaxial growth of the lower contact layer 11, the back surface 10b of the semiconductor stack 10 includes the plurality of depressions. On the other hand, since the upper contact layer 16 grows before the phase modulation layer 13 is formed, the front surface of the upper contact layer 16, i.e., the front surface 10a of the semiconductor stack 10 takes over the flatness of the main surface 40a of the growth substrate 40. Therefore, the front surface 10a of the semiconductor stack 10 is flatter than the back surface 10b. In the case where the phase modulation layer 13 is provided between the active layer 14 and the lower cladding layer 12, after the light guide layer 19, the active layer 14, and the light guide layer 17 are formed (epitaxially grown) on the phase modulation layer 13, the lower cladding layer 12 and the lower contact layer 11 are only required to be provided on the active layer 14 (on the light guide layer 17). Also in this case, the front surface 10a of the semiconductor stack 10 becomes flatter than the back surface 10b.

Figure 16A:
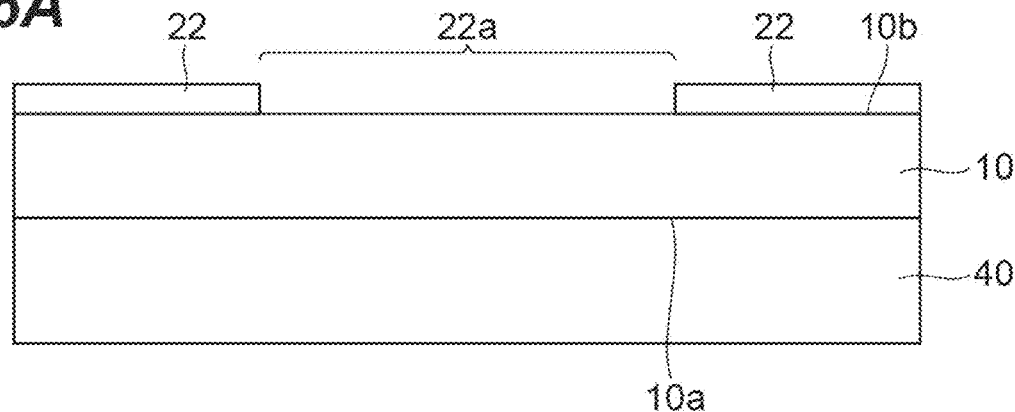
FIGS. 16A to 16C are views showing each step in the manufacturing method for the light-emitting element 1A, and schematically show a cross section of the light-emitting element 1A in the middle of manufacturing.

Subsequently, as shown in FIG. 16A, the insulation layer 22 having the opening 22a is formed on the growth surface (back surface 10b) of the semiconductor stack 10. Specifically, first, an insulation film is formed on the entire surface of the semiconductor stack 10. As the method of forming the insulation film, for example, sputtering targeting the constituent material, plasma CVD, or the like can be employed. Next, an etching mask having an opening in the center portion is formed on the front surface of the insulation film. The center portion of the insulation film is etched via the opening of this etching mask, whereby the semiconductor stack 10 is exposed. This etching may be either dry etching or wet etching. Thereafter, the etching mask is removed from the insulation film. Thus, the insulation layer 22 having the opening 22a is formed.

Figure 16B:
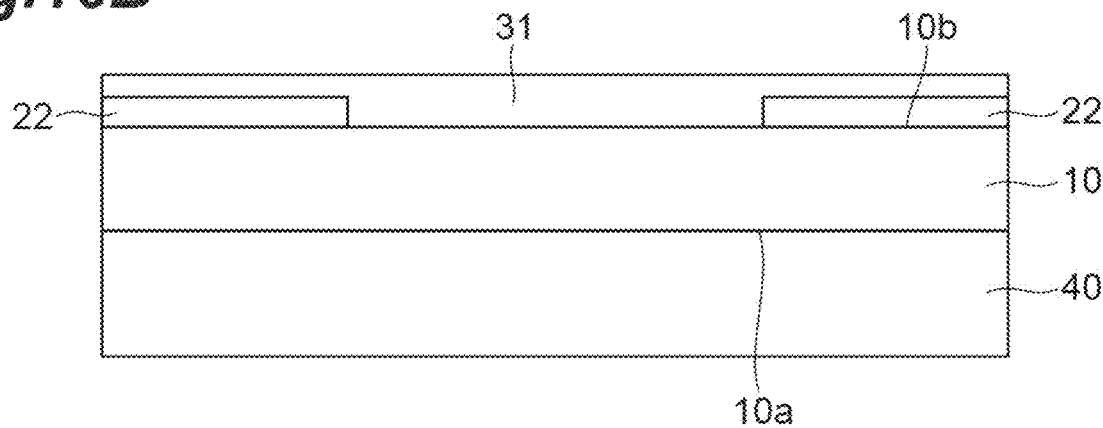
Figure 16C:
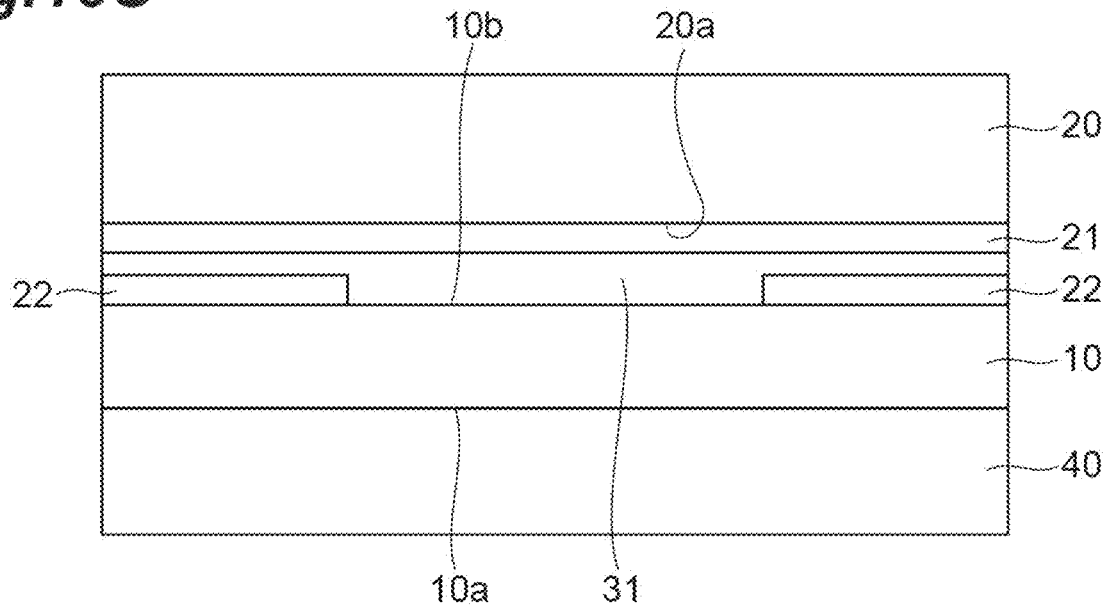

Subsequently, as shown in FIG. 16B, the first electrode 31 is formed on the semiconductor stack 10 so as to cover the opening 22a of the insulation layer 22. Specifically, first, an underlying metal film is formed on the insulation layer 22 and the semiconductor stack 10 in the opening 22a of the insulation layer 22. The underlying metal film contains Ti, for example. Next, the remaining layer (e.g., Au layer) of the first electrode 31 is formed on the underlying metal film by, for example, vapor deposition or plating. Thus, the first electrode 31 in contact with the semiconductor stack 10 via the opening of the insulation layer 22 is formed. Thereafter, as shown in FIG. 16C, the main surface 20a of the substrate 20 and the first electrode 31 are pasted (bonded) to each other via the bonding layer 21. More specifically, the main surface 20a of the substrate 20 is spin-coated with Cyclotene to form the bonding layer 21. Thereafter, after the bonding layer 21 and the first electrode 31 are brought into close contact with each other, the bonding layer 21 and the first electrode 31 are heated (e.g., at 250° C. for 30 minutes) while being pressurized at, for example, 2 MPa, thereby curing the bonding layer 21.

Figure 17A:
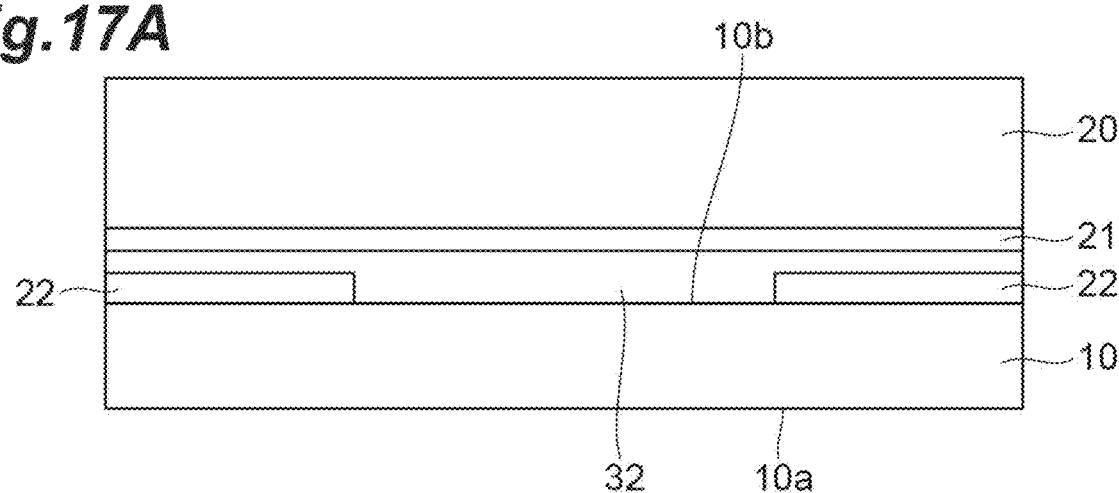
FIGS. 17A to 17C are views showing each step in the manufacturing method for the light-emitting element 1A, and schematically show a cross section of the light-emitting element 1A in the middle of manufacturing.
Figure 17B:
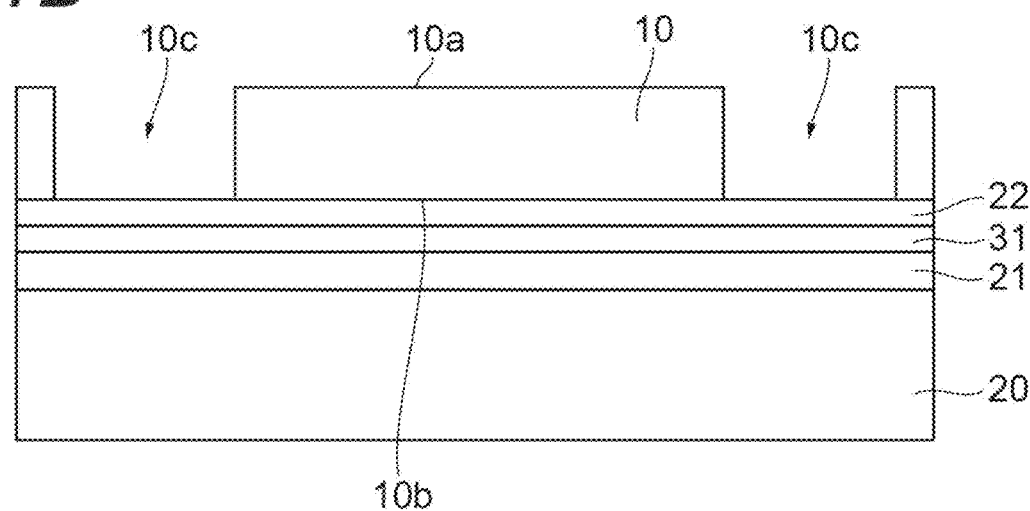
Figure 17C:
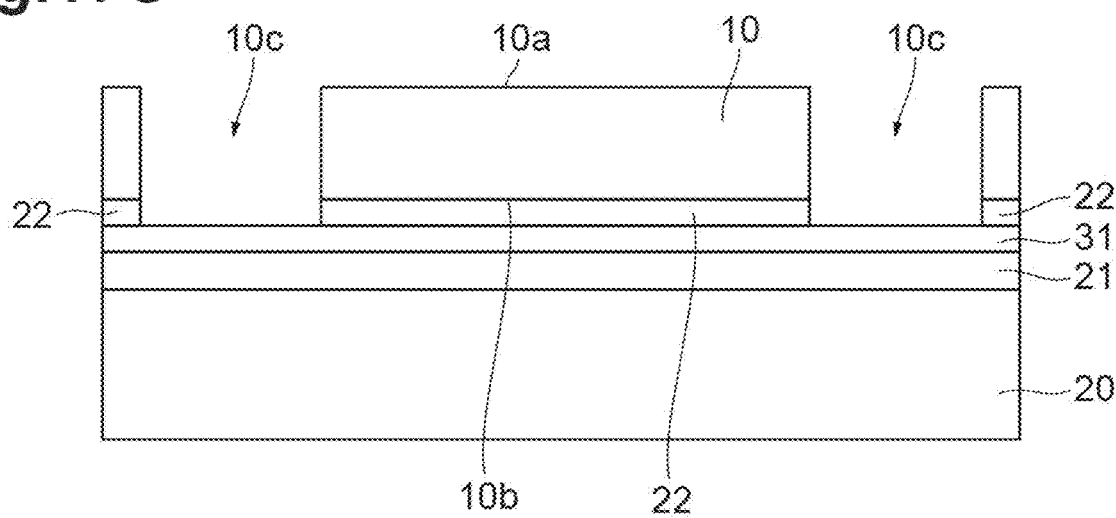

Subsequently, as shown in FIG. 17A, the growth substrate 40 is removed. In this step, for example, the growth substrate 40 is removed by etching. Specifically, the upper contact layer 16 of the semiconductor stack 10 is used as an etch stop layer, and the growth substrate 40 is removed by wet etching. Before the etching, the growth substrate 40 may be thinned by another method such as polishing (may be either a mechanical method or a chemical method). By this step, the flat front surface 10a of the semiconductor stack 10 appears. In this step, as an example, after the growth substrate 40 is thinned to, for example, 20 μm by polishing, wet etching is performed with a mixed solution of sulfuric acid, hydrogen peroxide water, and water.

Subsequently, as shown in FIGS. 17B and 17C, the recess portion 10c is formed in the semiconductor stack 10 and the insulation layer 22, whereby the first electrode 31 is exposed. In this step, first, as shown in FIG. 17B, an opening is formed in the semiconductor stack 10. Specifically, an etching mask having an opening in the formation region (e.g., four corners of the rectangular front surface 10a) of the recess portion 10c is formed on the front surface 10a of the semiconductor stack 10. The insulation layer 22 is exposed by etching the semiconductor stack 10 via the opening of the etching mask. Note that this etching may be either dry etching or wet etching, but when the heat resistance of the bonding layer 21 is low, wet etching is desirable. Next, as shown in FIG. 17C, an opening is formed in the insulation layer 22. That is, the insulation layer 22 is etched by changing the etching gas or etchant and using again the etching mask used for etching of the semiconductor stack 10. The etching method (dry etching or wet etching) of the semiconductor stack 10 and the insulation layer 22 may be different from each other. Thus, the recess portion 10c is formed in the semiconductor stack 10 and the insulation layer 22, and the first electrode 31 is exposed. Thereafter, the etching mask is removed from the semiconductor stack 10.

Figure 18A:
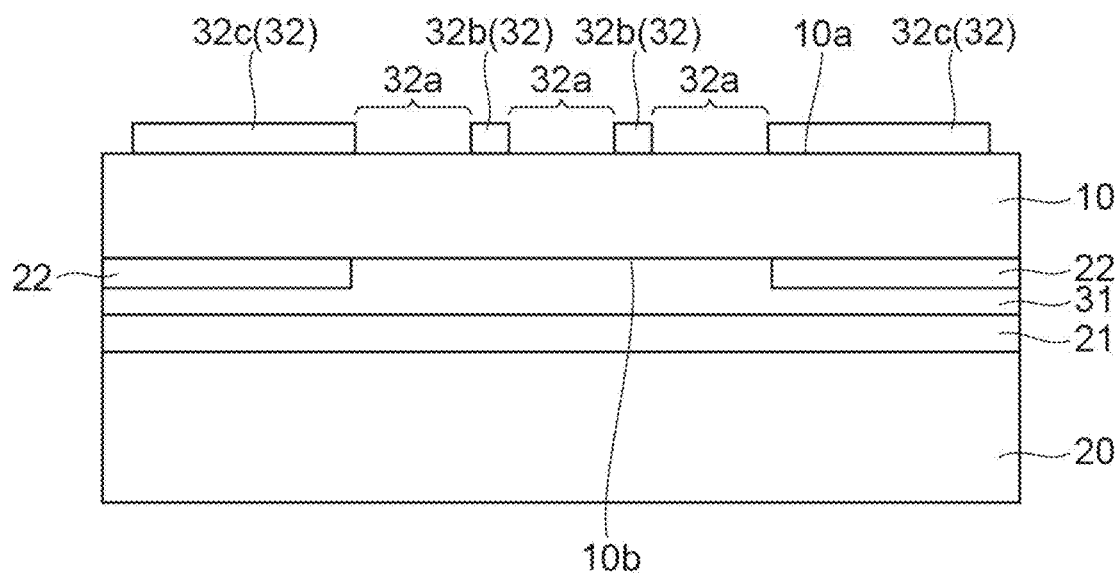
FIGS. 18A and 18B are views showing each step in the manufacturing method for the light-emitting element 1A, and schematically show a cross section of the light-emitting element 1A in the middle of manufacturing.

Subsequently, as shown in FIG. 18A, the second electrode 32 is formed on the front surface 10a of the semiconductor stack 10. Specifically, a mask having an opening corresponding to the planar shape of the second electrode 32 is formed on the front surface 10a of the semiconductor stack 10, and a metal to be a material of the second electrode 32 is formed by vapor deposition or sputtering on the entire surface of the mask and the front surface 10a including the inside of the opening of the mask. Specifically, Ti and Au are formed in this order. Then, the second electrode 32 can be formed by removing the mask together with the metal deposited on the mask.

Figure 18B:
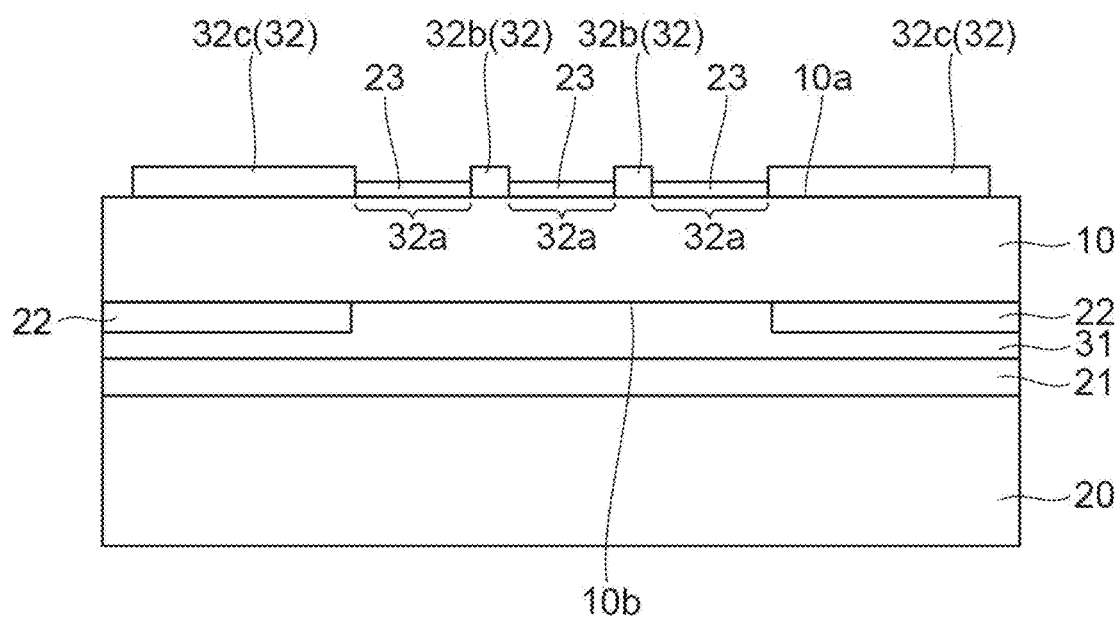

Subsequently, as shown in FIG. 18B, the antireflection film 23 is formed on the front surface 10a of the semiconductor stack 10 exposed from the opening 32a of the second electrode 32. The antireflection film 23 is formed by, for example, sputtering, plasma CVD, or the like, similarly to the insulation layer 22 described above. Through the above steps, the light-emitting element 1A of the present embodiment is manufactured.

The effect obtained by the light-emitting element 1A of the present embodiment described above will be described. In the light-emitting element 1A of the present embodiment, the gravity center portion of each modified refractive index region 13b is set away from the lattice point O associated with the virtual square lattice, and the rotation angle φ (x, y) around the associated lattice point O is set according to the phase distribution corresponding to the optical image. According to such a structure, light for forming an optical image of a discretionary shape can be outputted as the S-iPM laser along a direction (normal direction) perpendicular to the main surface 20a of the substrate 20 or the tilt direction intersecting the normal direction, or both the normal direction and the tilt direction. In this light-emitting element 1A, the front surface 10a of the semiconductor stack 10 is flatter than the back surface 10b, and the substrate 20 is bonded to the back surface 10b side of the semiconductor stack 10 via the bonding layer 21. Therefore, since light for forming an optical image can be outputted from the front surface 10a of the relatively flat semiconductor stack 10, a clear optical image can be obtained. Furthermore, by outputting optical image formation light from the front surface 10a of the semiconductor stack 10, light absorption in the substrate 20 can be reduced, and reduction in light output efficiency can be effectively suppressed.

The phase modulation layer 13 includes the first region 131 overlapping the second electrode 32 as viewed from the thickness direction, and the second region 132 other than the first region 131. Then, the optical image is completed as a single beam pattern including only the light components having passed through the second electrode 32 from the second region 132. Thus, without using light outputted from the first region 131 of the phase modulation layer 13 shielded by the second electrode 32, it is possible to complete an optical image using only light from the second region 132 not shielded. As a result, it is possible to effectively suppress deterioration of the quality of the optical image due to the second electrode 32 blocking a part of the light outputted from the phase modulation layer 13.

In particular, when optical image formation light is outputted from the front surface 10a on the upper cladding layer 15 side as in the present embodiment, the distance between the second electrode 32 on the front surface 10a side and the active layer 14 is sometimes not sufficiently ensured. In such a case, in the method of providing only one opening of the second electrode 32, the current concentrates in the peripheral portion of the active layer 14 immediately below the second electrode 32, and it becomes difficult to diffuse the current to the vicinity of the center portion of the active layer 14. In such a situation, the opening area of the second electrode 32 has to be narrowed (the number of modified refractive index regions 13b in the opening, i.e., in the optical output plane is reduced), and the resolution of the optical image is reduced. For such a problem, according to the light-emitting element 1A of the present embodiment, it is possible to provide a plurality of openings (e.g., in a lattice shape) in the second electrode 32 while suppressing deterioration in the quality of the optical image, and hence it is possible to easily diffuse current to the vicinity of the center portion of the active layer 14. Therefore, the resolution of the optical image can be improved by increasing the number of the modified refractive index regions 13b in the optical output surface by making the optical output surface large.

Figure 19A:
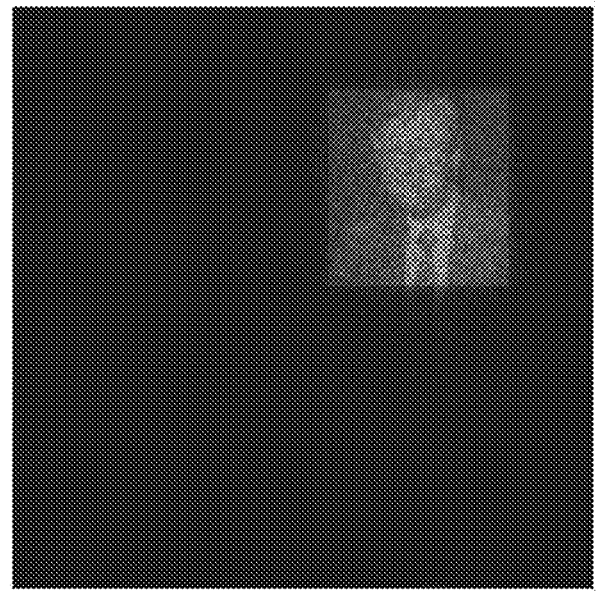
FIG. 19A shows, as a comparative example, an example of an optical image in a case where the phase modulation layer 13 has a phase distribution corresponding to the optical image on the entire first region 131 and second region 132.
Figure 19B:
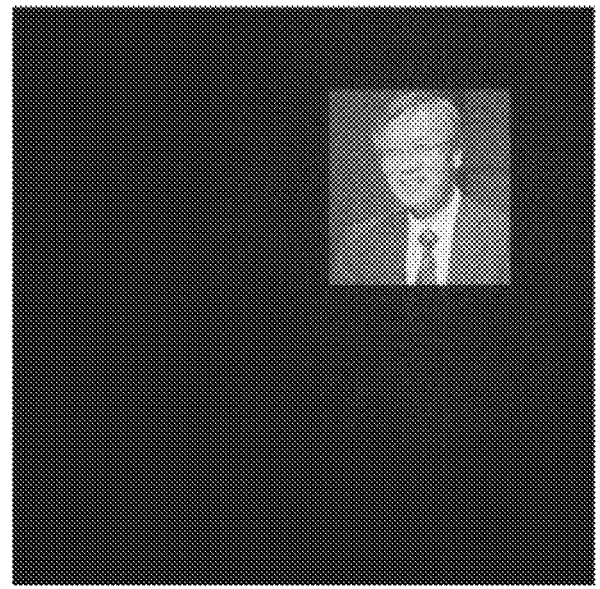
FIG. 19B shows an example of an optical image obtained by the phase modulation layer 13 of one embodiment.

FIG. 19A shows, as a comparative example, an example of an optical image in the case where the phase modulation layer 13 has the phase distribution corresponding to the optical image on the entire first region 131 and second region 132. This example is an optical image on an infinitely distant screen obtained by performing Fourier transform of the complex amplitude distribution calculated while retaining the phase distribution in the processing A4 of FIG. 13 as it is, under the condition that the intensity of the portion overlapping the second electrode 32 is 0 and the intensity of the other portion is 1. FIG. 19B shows an example of an optical image obtained by the phase modulation layer 13 of the present embodiment. This example is an optical image on an infinitely distant screen obtained by performing Fourier transform of the complex amplitude distribution obtained in the processing A4 shown in FIG. 13 under the condition that the intensity of the portion overlapping the second electrode 32 is 0 and the intensity of the other portion is 1. Referring to FIG. 19A, it is indicated that the quality of the optical image is significantly deteriorated due to lack of information caused by shielding by the second electrode 32. On the other hand, referring to FIG. 19B, it is indicated that a high-quality optical image free from omission of information is obtained.

As in the present embodiment, the active layer 14 may contain Ga, In, and P as compositions. In this case, for example, a GaAs substrate is preferably used as the growth substrate 40. However, the GaAs remarkably absorbs light in a wavelength region of, for example, 650 to 710 nm generated in the active layer 14. Therefore, if the light-emitting element is completed without removing the GaAs substrate on which the semiconductor stack 10 is formed, the optical output efficiency is significantly reduced when optical image formation light is outputted from the back surface side of the GaAs substrate. Furthermore, since the flatness of the growth surface of the semiconductor stack 10 is low as described above, the clarity of the optical image is impaired if optical image formation light is outputted from the semiconductor stack 10 side. On the other hand, in the light-emitting element 1A of the present embodiment, since optical image formation light is outputted from the flat front surface 10a (i.e., surface opposite side to the growth surface) side of the semiconductor stack 10, a clear optical image can be efficiently obtained even when the active layer 14 contains Ga, In, and P as compositions.

As in the present embodiment, the bonding layer 21 may contain a resin. On the front surface of the first electrode 31 formed on the back surface 10b of the semiconductor stack 10 having low flatness (much unevenness), unevenness taken over from the back surface 10b is easily generated. When the bonding layer 21 contains a resin, the resin before curing enters the unevenness, and hence the first electrode 31 having the unevenness on the front surface and the flat main surface 20a of the substrate 20 can be firmly bonded together without any gap.

As in the present embodiment, the planar shape of the second electrode 32 may include the plurality of openings 32a. Thus, the optical image can be taken out from the front surface 10a of the semiconductor stack 10 while bringing the current density in the active layer 14 more uniform. In this light-emitting element 1A, the optical image is completed as a single beam pattern constituted by only the light components that have passed through the second electrode 32 from the second region 132, and hence even if the second electrode 32 has such a shape, deterioration in the quality of the optical image due to a part of the light outputted from the phase modulation layer 13 being blocked by the second electrode 32 can be suppressed.

As in the present embodiment, the planar shape of the second electrode 32 may be a lattice shape. When the second electrode 32 has such a planar shape, the second electrode 32 can be uniformly and evenly arranged on the front surface 10a (optical image output surface) of the semiconductor stack 10. Thus, the optical image formation light can be taken out from the front surface 10a of the semiconductor stack 10 while bringing the current density in the active layer 14 more uniform. Since a current can be sufficiently supplied to the vicinity of the center portion of the active layer 14, the area of the light output surface can be further widened. A current can be sufficiently supplied to the vicinity of the center portion of the active layer 14 even without thickening the upper cladding layer 15. Furthermore, in this light-emitting element 1A, the optical image is completed as a single beam pattern constituted by only the light components that have passed through the second electrode 32 from the second region 132, and hence even if the second electrode 32 has such a shape, deterioration in the quality of the optical image due to a part of the light outputted from the phase modulation layer 13 being blocked by the second electrode 32 can be suppressed.

As in the present embodiment, the light-emitting element 1A may have the recess portion 10c extending from the front surface 10a of the semiconductor stack 10 to the first electrode 31. This allows the first electrode 31 to be exposed on the bottom surface of the recess portion 10c, and hence it is possible to easily perform electrical connection (e.g., wire bonding) to the first electrode 31 sandwiched between the semiconductor stack 10 and the substrate 20.

As in the present embodiment, the center of gravity G of each modified refractive index region 13b positioned in the first region 131 may be arranged on the associated lattice point O, or may be arranged away from the associated lattice point O and the rotation angle about the lattice point O may be set to an angle irrelevant to the optical image. Since the light outputted from the first region 131 is shielded by the second electrode 32, the center of gravity G of the plurality of modified refractive index regions 13b in the first region 131 may be arranged in any manner, but this arrangement makes it easy to form the phase modulation layer 13. Since the center of gravity G of each modified refractive index region 13b positioned in the first region 131 does not contribute to the formation of the optical image, the center of gravity G of each modified refractive index region 13b may have a random rotation angle φ (x, y) while keeping the distance r (x, y) from, for example, the associated lattice point O constant, or the center of gravity G of each modified refractive index region 13b may coincide with the associated lattice point O by setting r (x, y) to 0. As will be described later, according to the findings of the present inventor, the closer the center of gravity G of the plurality of modified refractive index regions 13b is to the associated lattice point O, the lower the current (oscillation threshold current) necessary for laser oscillation can be. Therefore, the center of gravity G of each modified refractive index region 13b positioned in the first region 131 is arranged on the associated lattice point O, whereby the oscillation threshold current can be effectively reduced.

As in the present embodiment, in the effective area (portion overlapping the current supply unit 32b), the width W1 of the first region 131 may be larger than the width W2 of the second electrode 32 (see FIGS. 2 and 5). Since the width W1 is larger than the width W2, the second electrode 32 can be avoided from shielding the second region 132 even if the formation position of the second electrode 32 deviates slightly from the design position. Therefore, it is possible to effectively suppress deterioration of the quality of the optical image due to the second electrode 32 shielding the second region 132.

The manufacturing method for the light-emitting element 1A according to the present embodiment includes: a step of growing the semiconductor stack 10 on the growth substrate 40 in order from the upper contact layer 16 side (upper cladding layer 15 side); a step of forming the first electrode 31 on the semiconductor stack 10; a step of bonding the main surface 20a of the substrate 20 to the first electrode 31 via the bonding layer 21; a step of removing the growth substrate 40; and a step of forming the second electrode 32 on the front surface 10a of the semiconductor stack 10. As described above, when the phase modulation layer 13 is formed, unevenness is generated on the upper surface of the phase modulation layer 13, and the unevenness sometimes affects the flatness of the growth surface (corresponding to the back surface 10b in the present embodiment) of the semiconductor stack 10. On the other hand, the surface of the semiconductor stack 10 opposite to the growth surface (corresponding to the front surface 10a in the present embodiment) takes over the flatness of the main surface 40a of the growth substrate 40. In this manufacturing method, after the main surface 20a of the substrate 20 is bonded to the first electrode 31 via the bonding layer 21, the growth substrate 40 is removed. Thus, the flat front surface 10a of the semiconductor stack 10 opposite to the growth surface is exposed. By using this front surface 10a as the optical image output surface, it is possible to obtain a clear optical image while suppressing reduction in light output efficiency.

As in the present embodiment, when the growth substrate 40 is removed by etching, the upper contact layer 16 may be used as an etch stop layer. Thus, the growth substrate 40 can be accurately removed while leaving the flat front surface 10a of the semiconductor stack 10.

According to the design method for the phase modulation layer 13 according to the present embodiment, the arrangement of the center of gravity G of the modified refractive index region 13b such that the optical image can be completed only by the light component from the second region 132 can be easily calculated by iterative calculation. In the present embodiment, in the processing A4, the amplitude distribution (i.e. r (x, y)) and the phase distribution (i.e. φ (x, y)) of the complex amplitude distribution in the phase modulation layer 13 are each replaced with the target distribution. For example, by such processing, it is possible to give a constraint condition such that the rotation angle φ around the lattice point O is set to a value irrelevant to the formation of the optical image in a state where the position of the center of gravity G of each modified refractive index region 13b positioned in the first region 131 is on the associated lattice point O or away from the associated lattice point O.

Figure 20A:
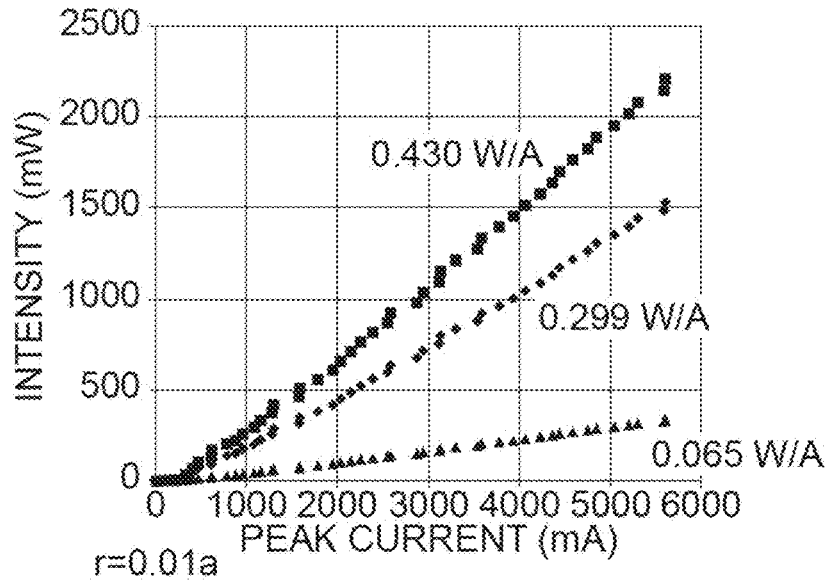
FIGS. 20A to 20C are graphs showing the result of examining the relationship between the peak current and the output light intensity while changing the distance between a center of gravity G and a lattice point O of the modified refractive index region 13b.
Figure 20B:
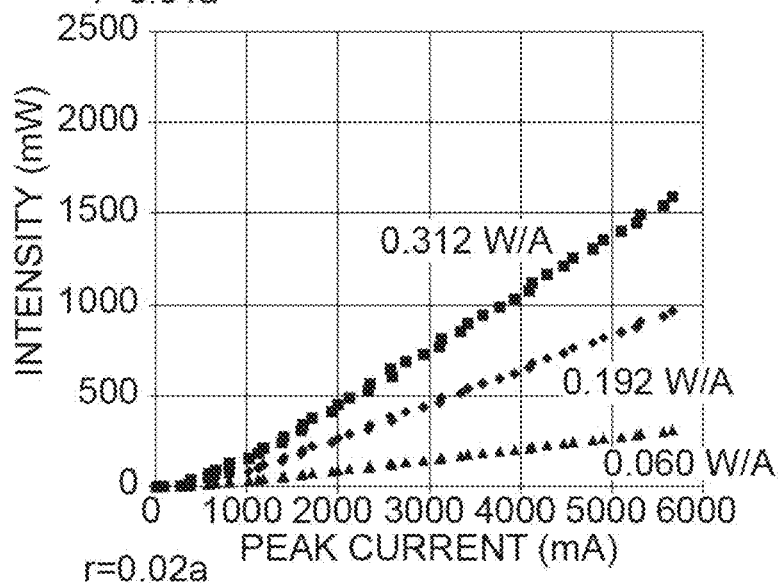
Figure 20C:
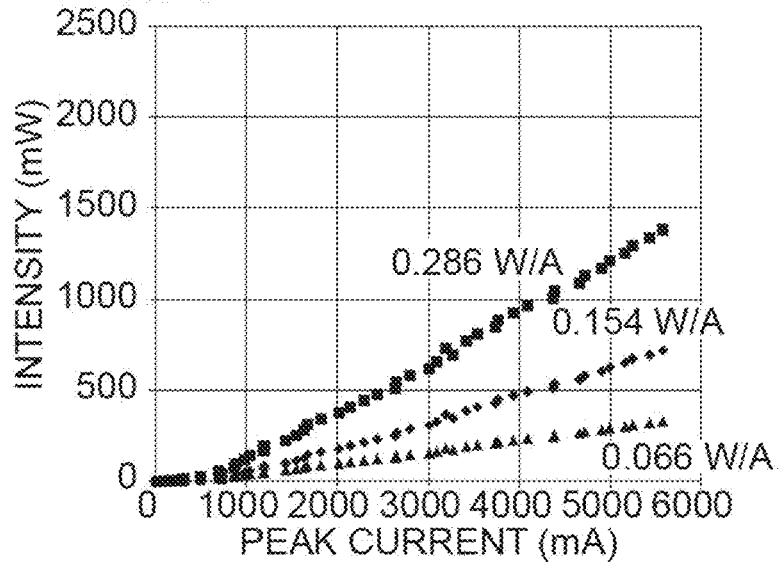
Figure 21A:
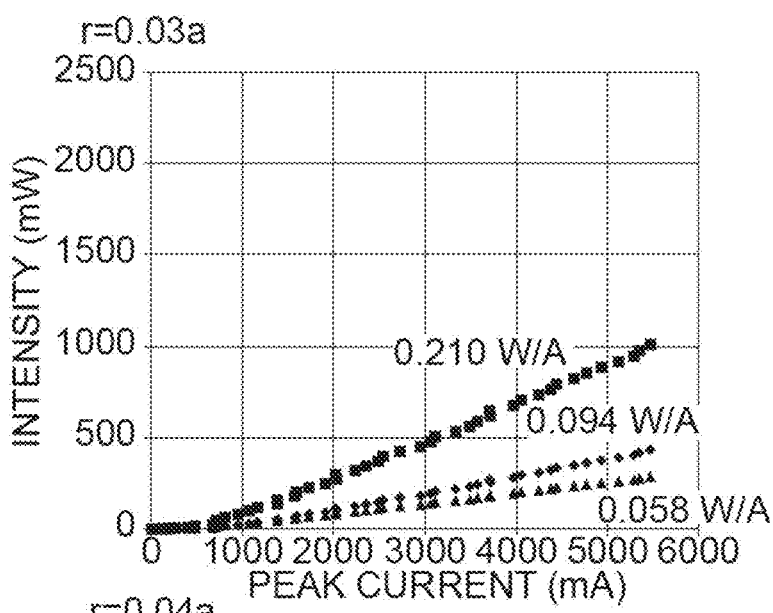
FIGS. 21A to 21C are graphs showing the result of examining the relationship between the peak current and the output light intensity while changing the distance between the center of gravity G and the lattice point O of the modified refractive index region 13b.
Figure 21B:
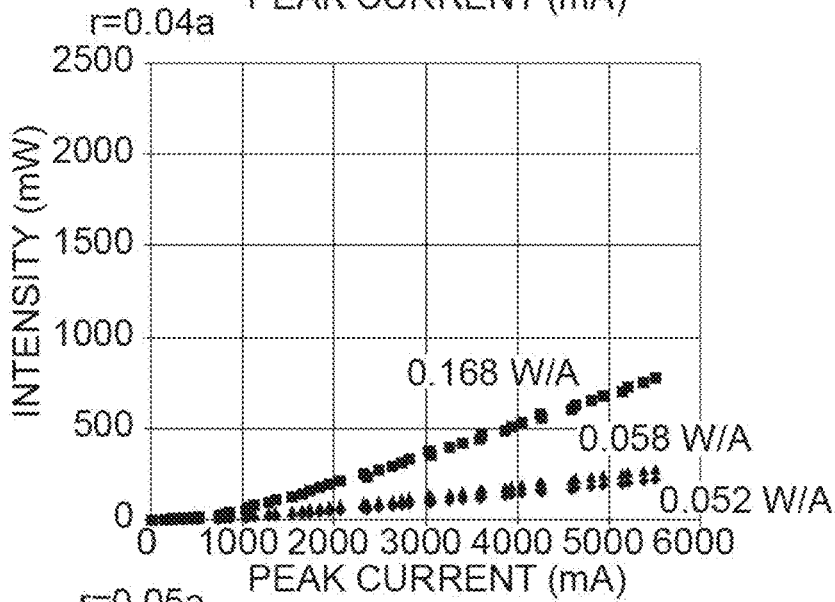
Figure 21C:
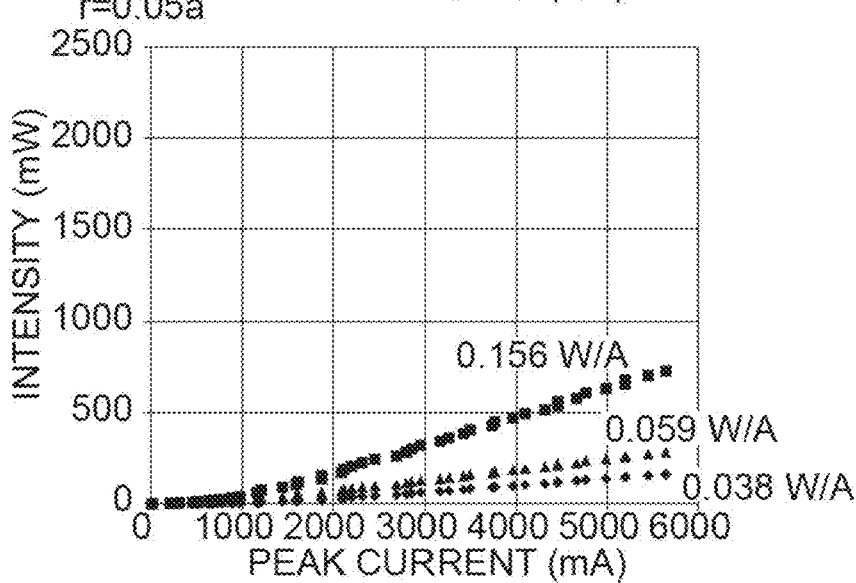
Figure 22A:
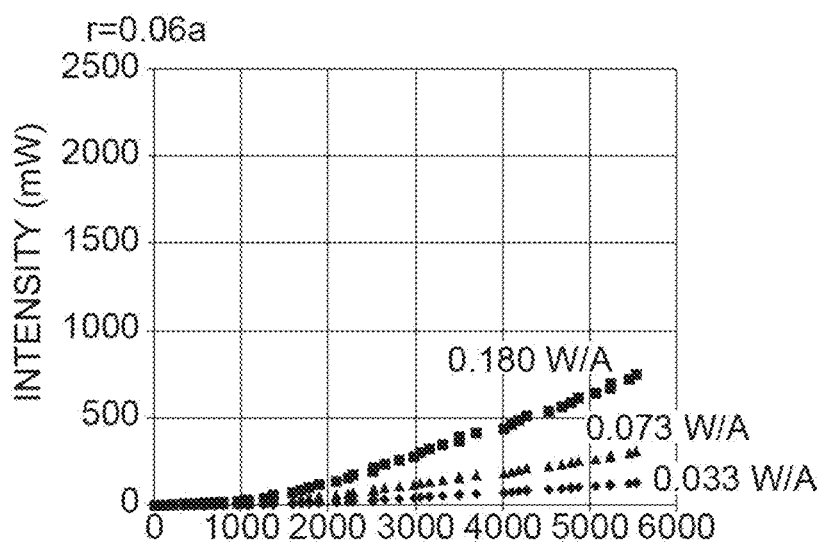
FIGS. 22A to 22C are graphs showing the result of examining the relationship between the peak current and the output light intensity while changing the distance between the center of gravity G and the lattice point O of the modified refractive index region 13b.
Figure 22B:
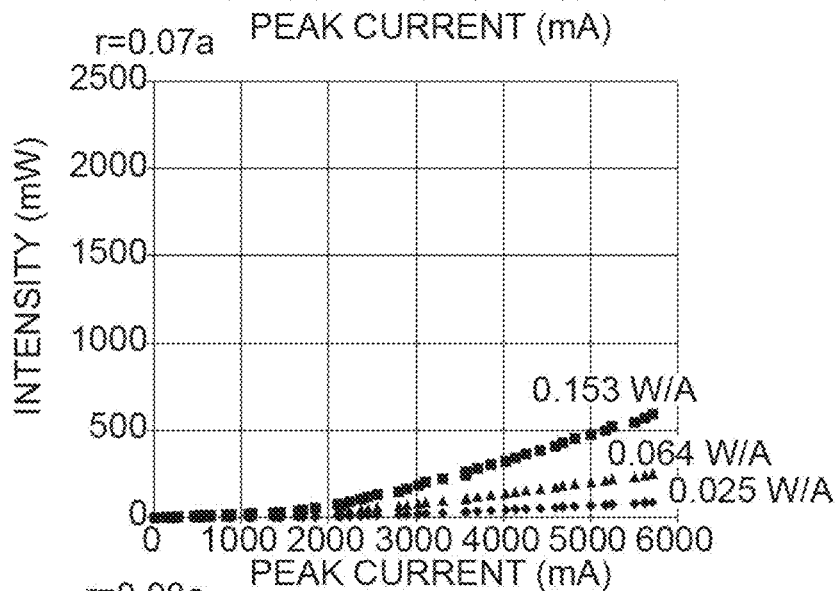
Figure 22C:
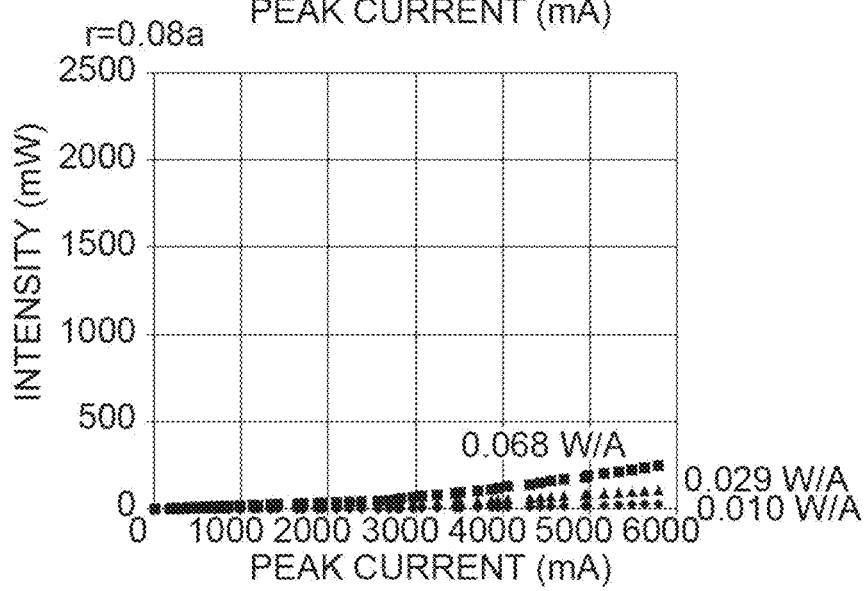
Figure 23:
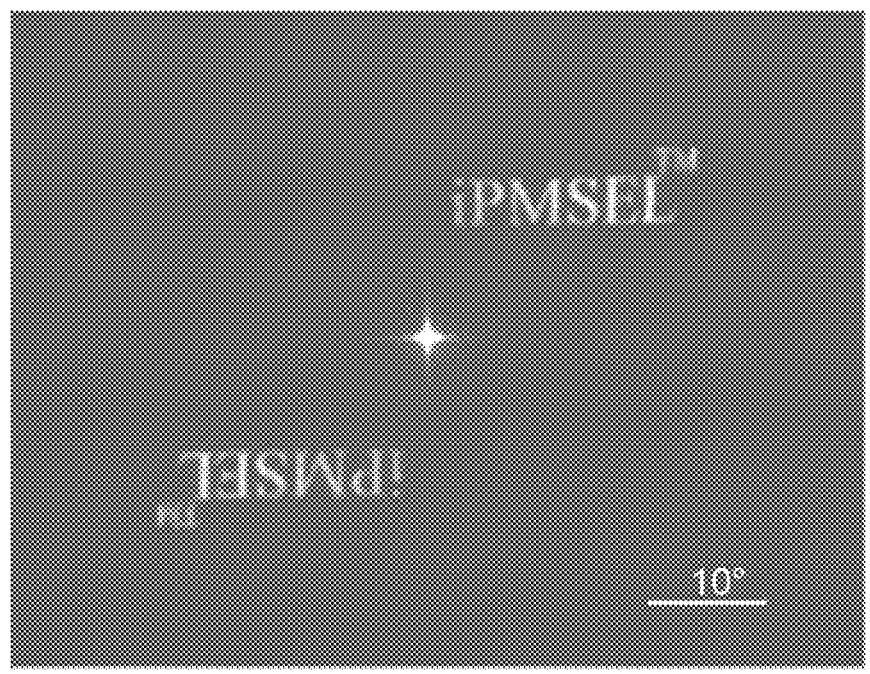
FIG. 23 shows an optical image used to calculate the graphs of FIGS. 20A to 22C.

According to the findings of the present inventor, the closer the center of gravity of each modified refractive index region 13b is to the associated lattice point O, the lower the current (oscillation threshold current) necessary for laser oscillation can be. FIGS. 20A to 22C are graphs showing the result of examining the relationship between the peak current and the output light intensity while changing the distance between the center of gravity G and the lattice point O of the modified refractive index region 13b. In these figures, the vertical axis indicates the light intensity (unit: mW), and the horizontal axis indicates the peak current (unit: mA). The rhombic plot shows the light intensity of the zero-order light, the triangle plot shows the light intensity of the signal light (each), and the square plot shows the total light intensity. FIGS. 20A to 20C show the case where the distance r (x, y) between the center of gravity G and the lattice point O is 0 (i.e., the center of gravity G and the lattice point O coincide with each other), the case where the distance r (x, y) is 0.01a, and the case where the distance r (x, y) is 0.02a, respectively. FIGS. 21A to 21C show the case where the distance r (x, y) is 0.03a, the case where the distance r (x, y) is 0.04a, and the case where the distance r (x, y) is 0.05a, respectively. FIGS. 22A to 22C show the case where the distance r (x, y) is 0.06a, the case where the distance r (x, y) is 0.07a, and the case where the distance r (x, y) is 0.08a, respectively. Note that a is a lattice constant of a virtual square lattice. FIG. 23 shows an optical image used to calculate the graphs of FIGS. 20A to 22C.

FIGS. 20A to 22C indicate that the larger the distance r (x, y) is, the more a ratio ($In_1/In_0$) of the light intensity $In_0$ of the zero-order light and the light intensity $In_1$ of the signal light increases. That is, the larger the distance r (x, y) is, the more the light intensity of the signal light can be increased with respect to the zero-order light. On the other hand, the shorter the distance r (x, y) is, the larger the light intensity is obtained with a smaller current. That is, the shorter the distance r (x, y) is, the higher the optical output efficiency is, and the lower the current (oscillation threshold current) required for laser oscillation can be. When the distance r (x, y) is 0, the oscillation threshold current becomes the lowest. In the second region 132, a certain distance r (x, y) is necessary for forming an optical image. However, since the first region 131 does not contribute to the formation of an optical image, the distance r (x, y) can be discretionally selected. Therefore, if the center of gravity G of each modified refractive index region 13b positioned in the first region 131 is arranged on the associated lattice point O, the oscillation threshold current can be effectively reduced.

In the second region 132, the distance r (x, y) between each lattice point O of the virtual square lattice and the center of gravity G of the associated modified refractive index region 13b is desirably a constant value throughout the entire second region 132. Thus, when the phase distribution in the entire second region 132 is equally distributed up to 0 to 2π (rad), the center of gravity G of the modified refractive index region 13b coincides with the lattice point O of the square lattice on average. Therefore, the two-dimensional distribution Bragg diffraction effect in the second region 132 approaches the two-dimensional distribution Bragg diffraction effect in the case where the modified refractive index region 13b is arranged on each lattice point O of the square lattice, and hence the formation of the standing wave becomes easy and threshold current reduction for oscillation can be expected.

First Modified Example

Figure 24:
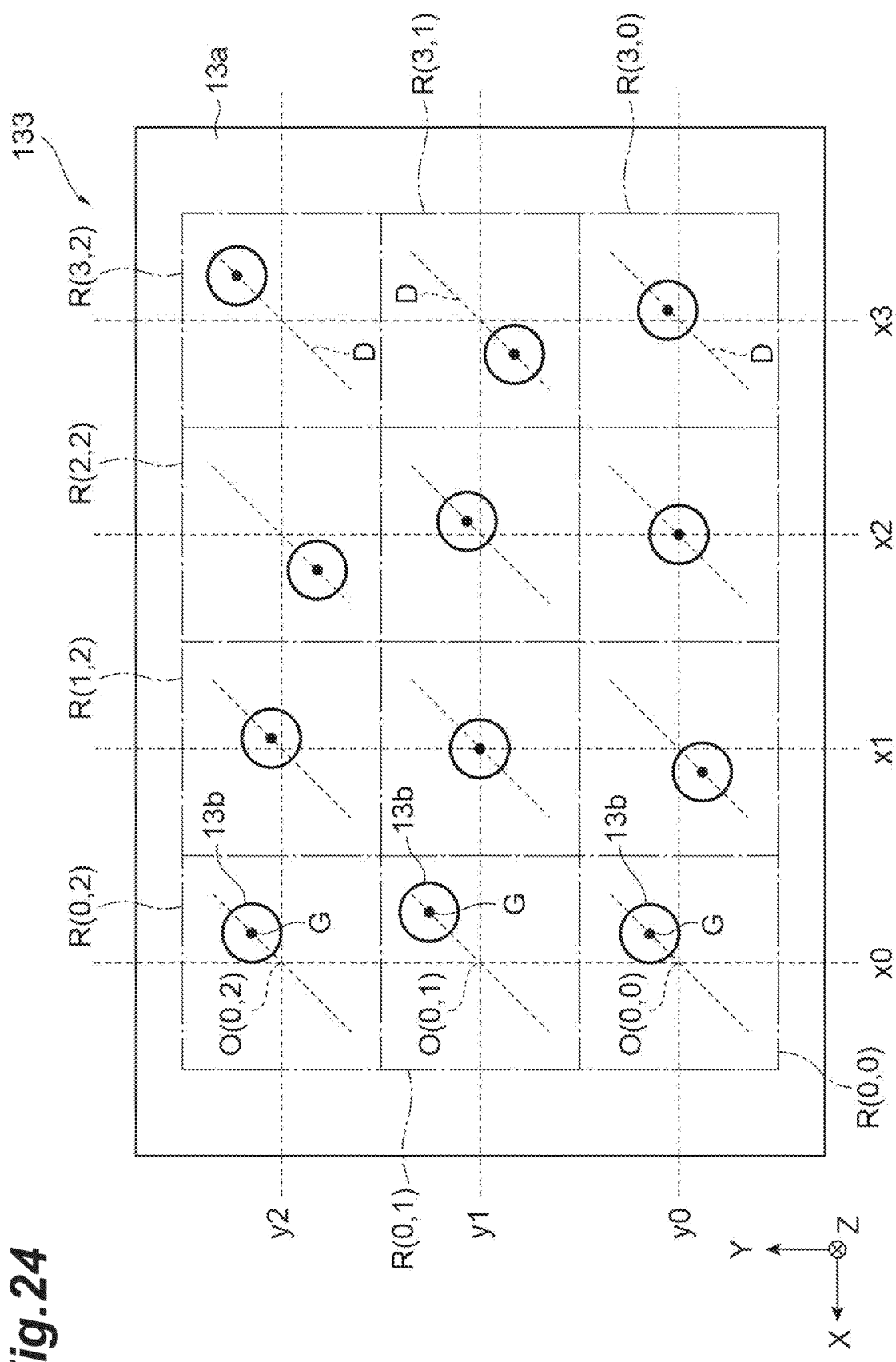
FIG. 24 is a plan view of a second region 133 according to a first modified example.
Figure 25:
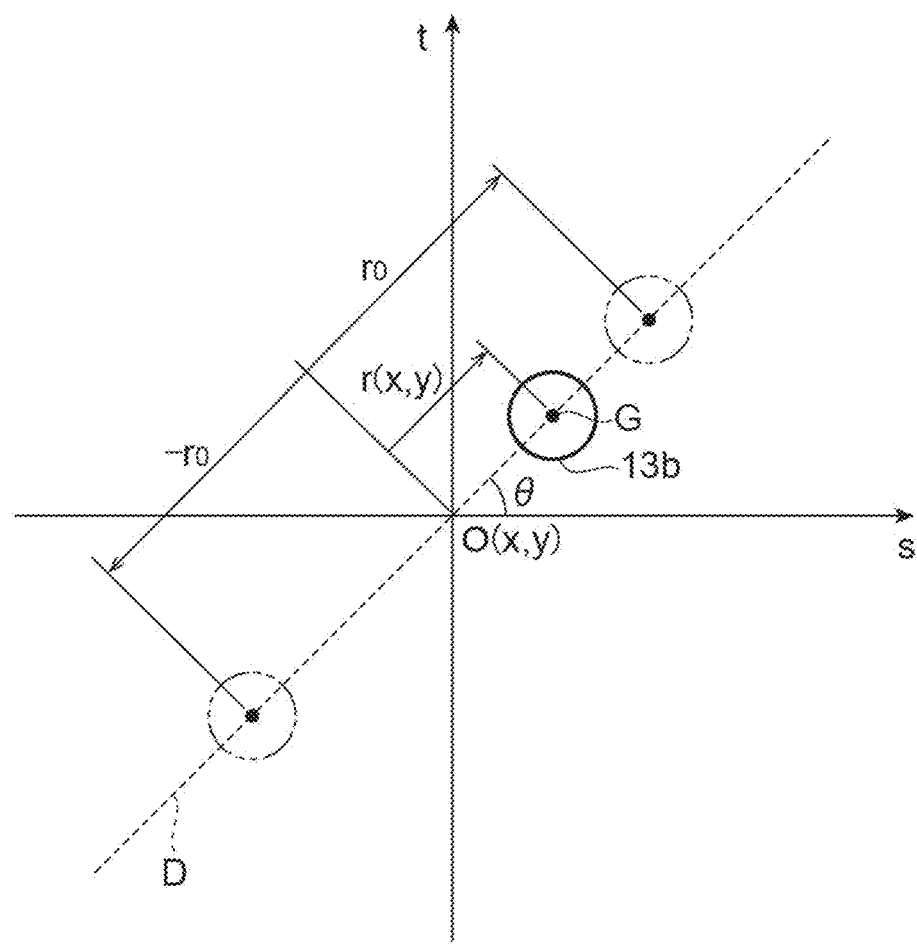
FIG. 25 is a view showing the positional relationship of the modified refractive index region 13b in the second region 133.

FIG. 24 is a plan view of the second region 133 according to the first modified example of the embodiment. FIG. 25 is a view showing the positional relationship of the modified refractive index region 13b in the second region 133. The second region 132 of the above embodiment may be replaced with the second region 133 of the present modified example. As shown in FIGS. 24 and 25, in the second region 133 of the present modified example, the center of gravity G of each modified refractive index region 13b is arranged on a straight line D. In the unit constituent region R (x, y), the straight line D is a straight line passing through the lattice point O (x, y) and tilted with respect to each side of the square lattice. In other words, the straight line D is a straight line tilted with respect to both the X-axis and the Y-axis. The position in the unit constituent region R (x, y) is specified by the s-axis parallel to the X-axis and the t-axis parallel to the Y-axis. The tilt angle of the straight line D with respect to one side (s-axis) of the square lattice is θ. The tilt angle θ is constant in the second region 133. The tilt angle θ satisfies 0°<θ<90°, and θ=45° in one example. Alternatively, the tilt angle θ satisfies 180°<θ<270°, and θ=225° in one example. When the tilt angle θ satisfies 0°<θ<90° or 180°<θ<270°, the straight line D extends from the first quadrant to the third quadrant of the coordinate plane (unit constituent region R (x, y)) defined by the s-axis and the t-axis. Alternatively, the tilt angle θ satisfies 90°<θ<180°, and θ=135° in one example. Alternatively, the tilt angle θ satisfies 270°<θ<360°, and θ=315° in one example. When the tilt angle θ satisfies 90°<θ<180° or 270°<θ<360°, the straight line D extends from the second quadrant to the fourth quadrant of the unit constituent region R (x, y). Thus, the tilt angle θ is an angle excluding 0°, 90°, 180°, and 270°. Here, let the distance between the lattice point O (x, y) and the center of gravity G be r (x, y). When the distance r (x, y) is a positive value, the center of gravity G is positioned in the first quadrant (or the second quadrant). When the distance r (x, y) is a negative value, the center of gravity G is positioned in the third quadrant (or the fourth quadrant). When the distance r (x, y) is 0, the lattice point O and the center of gravity G coincide with each other.

In the unit constituent region R (x, y) shown in FIG. 24, the distance r (x, y) between the center of gravity G of the associated modified refractive index region 13b and the lattice point O (x, y) is individually set according to the phase pattern corresponding to the desired optical image (the plurality of modified refractive index regions 13b are individually set). The phase pattern, i.e., the distribution of the distance r (x, y) has a specific value for each position determined by the values of the x component and y component, but is not necessarily expressed by a specific function. The distribution of the distance r (x, y) is determined from the phase distribution extracted from the complex amplitude distribution obtained by performing inverse Fourier transform of the desired optical image. That is, when the phase P (x, y) at a certain coordinate (x, y) shown in FIG. 25 is $P_0$, the distance r (x, y) is set to 0. When the phase P (x, y) is $\pi+P_0$, the distance r (x, y) is set to a maximum value $r_0$. When the phase P (x, y) is $-\pi+P_0$, the distance r (x, y) is set to a maximum value $-r_0$. For the intermediate phase P (x, y), the distance r (x, y) is set so that r (x, y)={P (x, y)$-P_0$}$\times r_0/\pi$ is true. Here, the initial phase $P_0$ can be discretionary set. Let the lattice spacing of the virtual square lattice be a, the maximum value $r_0$ of r (x, y) is within the range of, for example, $$0 \le r_0 \le \frac{a}{\sqrt{2}}. \tag{8}$$

When the complex amplitude distribution is obtained from a desired optical image, the reproducibility of the target output beam pattern is improved by applying a repetition algorithm such as the Gerchberg-Saxton (GS) method commonly used at the time of calculation of hologram generation.

In the present modified example, a desired optical image can be obtained by determining the distribution of the distances r (x, y) of the plurality of modified refractive index regions 13b positioned in the second region 133. Under the first to fourth preconditions similar to those in the above embodiment, the second region 133 is configured to satisfy the following conditions. That is, the associated modified refractive index region 13b is arranged in the unit constituent region R (x, y) so that the distance r (x, y) from the lattice point O (x, y) to the center of gravity G of the associated modified refractive index region 13b satisfies the relationship as follows:

$$r(x,y)=C\times(P(x,y)-P_0)$$

C: Proportional constant, e.g., $r_0/\pi$
$P_0$: Discretionary constant, e.g., 0.

That is, the distance r (x, y) is set to 0 when the phase P (x, y) at a certain coordinate (x, y) is $P_0$, set to the maximum value $r_0$ when the phase P (x, y) is $\pi+P_0$, and set to the minimum value $-r_0$ when the phase P (x, y) is $-\pi+P_0$. When it is desired to obtain a desired optical image, it is preferable to perform inverse Fourier transform of the optical image and to give the distribution of the distance r (x, y) corresponding to the phase P (x, y) of its complex amplitude to the plurality of modified refractive index regions 13b. The phase P (x, y) and the distance r (x, y) may be proportional to each other.

Similarly to the above embodiment, as a method of obtaining the intensity distribution and the phase distribution from the complex amplitude distribution obtained by inverse Fourier transform, for example, an intensity distribution I(x, y) can be calculated by using the abs function of "MATLAB", numerical analysis software of MathWorks, Inc., and a phase distribution P (x, y) can be calculated by using the angle function of MATLAB. Note that the points of attention regarding a case where a general discrete Fourier transform (or fast Fourier transform) is used for calculation when the phase distribution P (x, y) is obtained from the inverse Fourier transform result of the optical image and the distance r (x, y) of each modified refractive index region 13b is determined are the same as those in the embodiment described above.

In the present modified example, the center of gravity G of each modified refractive index region 13b is arranged on the straight line D passing through the lattice point O of the virtual square lattice and tilted with respect to the square lattice. The distance r (x, y) between the center of gravity G of each modified refractive index region 13b and the associated lattice point O is individually set in accordance with the optical image. According to such a structure, similarly to the above embodiment having a rotation angle corresponding to the optical image around the lattice point O to which the center of gravity G of each modified refractive index region 13b is associated, as the S-iPM laser, it is possible to output light forming an optical image of a discretionary shape along both the Z-axis direction and the tilt direction intersecting the Z-axis direction.

Second Modified Example

Figure 26E:
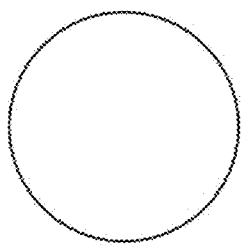
FIGS. 26A to 26G are views showing examples of the planar shape on the X-Y plane of the modified refractive index region 13b.
Figure 26D:
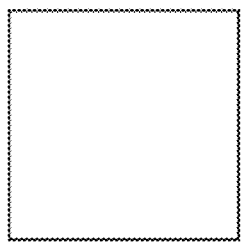
Figure 26G:
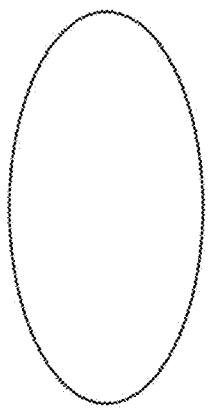
Figure 26C:
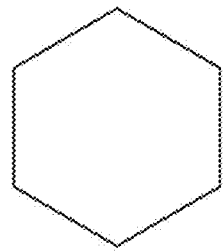
Figure 26B:
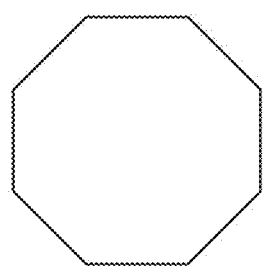
Figure 26F:
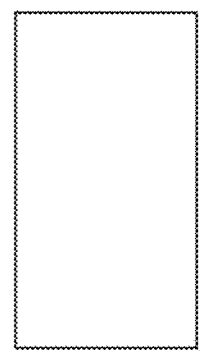
Figure 26A:
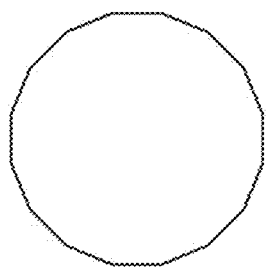
Figure 27A:
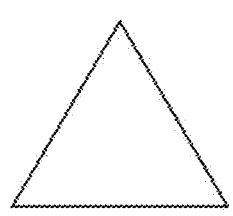
FIGS. 27A to 27K are views showing examples of the planar shape on the X-Y plane of the modified refractive index region 13b.
Figure 27B:
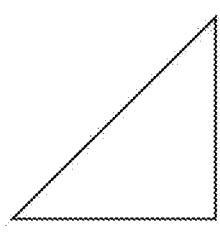
Figure 27C:
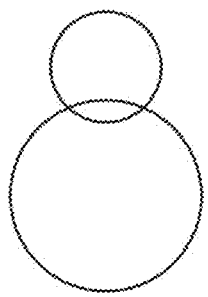
Figure 27D:
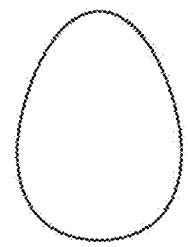
Figure 27E:
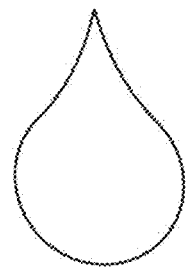
Figure 27F:
Figure 27G:
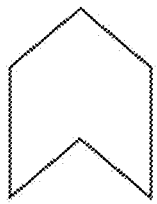
Figure 27H:
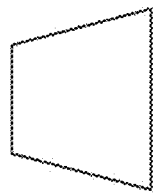
Figure 27I:
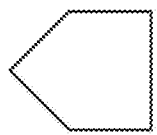
Figure 27J:
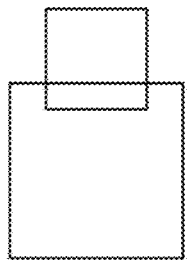
Figure 27K:
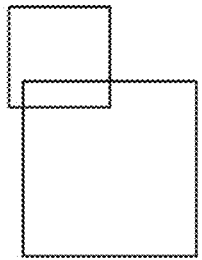

FIGS. 26A to 26G and FIGS. 27A to 27K are views showing examples of the planar shape on the X-Y plane of the modified refractive index region 13b. In the above embodiment and the first modified example, the planar shape of the modified refractive index region 13b on the X-Y plane is circular. However, the modified refractive index region 13b may have a planar shape other than a circular shape. For example, the planar shape of the modified refractive index region 13b on the X-Y plane may have mirror image symmetry (line symmetry). Here, mirror image symmetry (line symmetry) means that, across a certain straight line on the X-Y plane, the planar shape of the modified refractive index region 13b located on one side of the straight line and the planar shape of the modified refractive index region 13b located on the other side of the straight line can be mirror image symmetrical (line symmetrical) with each other. Examples of shapes having mirror image symmetry (line symmetry) include a perfect circle shown in FIG. 26A, a square shown in FIG. 26B, a regular hexagon shown in FIG. 26C, a regular octagon shown in FIG. 26D, a regular hexadecagon shown in FIG. 26E, a rectangle shown in FIG. 26F, and an ellipse shown in FIG. 26G Thus, when the planar shape of the modified refractive index region 13b on the X-Y plane has mirror image symmetry (line symmetry), the modified refractive index region 13b has a simple planar shape in each unit constituent region R of the virtual square lattice of the phase modulation layer 13, and hence the direction and position of the center of gravity G of the modified refractive index region 13b from the lattice point O can be determined with high accuracy, and patterning with high accuracy becomes possible.

The planar shape of the modified refractive index region 13b on the X-Y plane may be a shape not having a rotational symmetry of 180°. Examples of such shapes include an equilateral triangle shown in FIG. 27A, an isosceles right triangle shown in FIG. 27B, a shape shown in FIG. 27C in which two circles or ellipses partially overlap, a shape (oval shape) shown in FIG. 27D deformed so that the dimension in the minor axis direction in the vicinity of one end along the major axis of an ellipse is smaller than the dimension in the minor axis direction in the vicinity of the other end, a shape (teardrop shape) shown in FIG. 27E in which one end along the major axis of an ellipse is deformed into a pointed end projecting along the major axis direction, an isosceles triangle shown in FIG. 27F, a shape (arrow head shape) shown in FIG. 27G in which one side of a rectangle is recessed in a triangular shape and the opposite side is pointed in a triangular shape, a trapezoid shown in FIG. 27H, a pentagon shown in FIG. 27I, a shape shown in FIG. 27J in which two rectangles partially overlap each other, and a shape shown in FIG. 27K in which two rectangles partially overlap each other and have no mirror image symmetry.

Thus, since the planar shape of the modified refractive index region 13b on the X-Y plane does not have the rotational symmetry of 180°, a higher optical output can be obtained.

FIGS. 28A to 28K and 29 are views showing other examples of planar shapes of the modified refractive index region 13b on the X-Y plane. In this example, a plurality of modified refractive index regions 13c different from the plurality of modified refractive index regions 13b are further provided. Each modified refractive index region 13c includes a second refractive index medium having a refractive index different from that of the first refractive index medium of the base layer 13a. The modified refractive index region 13c, similarly to the modified refractive index region 13b, may be a hole or may be configured by embedding a compound semiconductor in the hole. The modified refractive index regions 13c are provided corresponding one-to-one to the modified refractive index regions 13b. In each unit constituent region R constituting the virtual square lattice, the center of gravity G obtained by combining the modified refractive index regions 13b and 13c is, similarly to the above embodiment, separated from the associated lattice point O, and the rotation angle φ (x, y) around the lattice point O is set to a value according to the phase distribution corresponding to the optical image (first array condition). Alternatively, the center of gravity G obtained by combining the modified refractive index regions 13b and 13c is positioned on the straight line D crossing the associated lattice point O, similarly to the first modified example. Any modified refractive index region 13c is included in the range of the unit constituent region R.

The planar shape of the modified refractive index region 13c is, for example, circular, but similar to the modified refractive index region 13b, it can have various shapes. FIGS. 28A to 28K show examples of the planar shape and relative relationship of the modified refractive index region 13c on the X-Y plane. FIGS. 28A and 28B show forms in which the modified refractive index regions 13c have figures of the same shape. FIGS. 28C and 28D show forms in which the modified refractive index regions 13c have figures of the same shape partially overlapping each other. FIG. 28E shows a form in which the modified refractive index region 13c has figures of the same shape that is rotated. FIG. 28F shows a form in which the modified refractive index region 13c has figures of shapes different from each other. FIG. 28G shows a form in which the modified refractive index region 13c has figures of shapes different from each other and the modified refractive index region 13c is spaced.

As shown in FIGS. 28H to 28K, the modified refractive index region 13b may be configured to include two regions 13b1 and 13b2 spaced apart from each other. At this time, it is considered that the center of gravity obtained by combining the regions 13b1 and 13b2 corresponds to the center of gravity of the single modified refractive index region 13b. In this case, as shown in FIGS. 28H and 28K, the regions 13b1 and 13b2 and the modified refractive index region 13c may have figures of the same shapes as each other. Alternatively, as shown in FIGS. 28I and 28J, two of the regions 13b1 and 13b2 and the modified refractive index region 13c may be different from the other.

Figure 29:
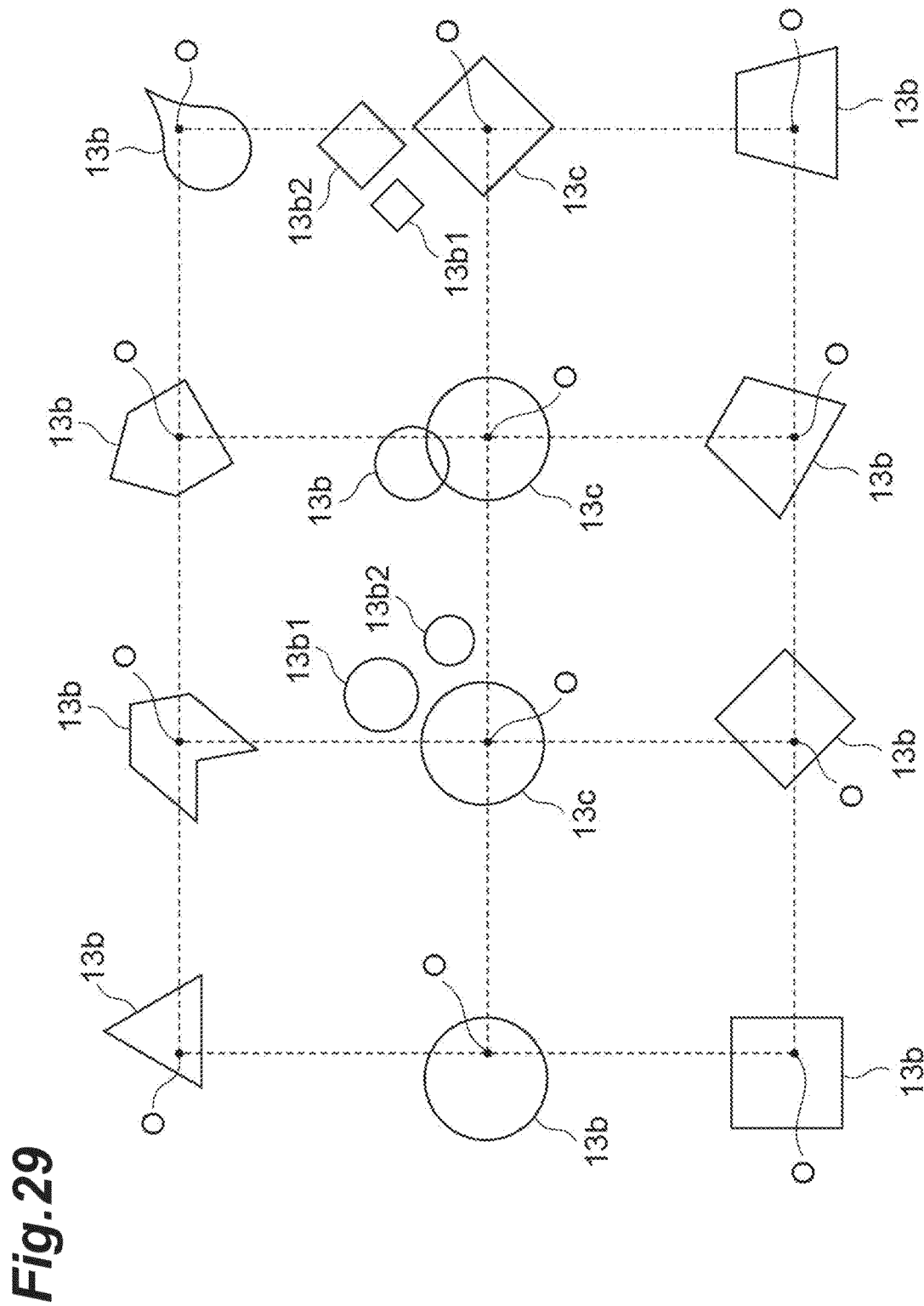
FIG. 29 is a view showing another example of a planar shape of the modified refractive index region 13b on the X-Y plane.

The planar shapes on the X-Y plane of the modified refractive index region 13b may be identical to each other between lattice points of the virtual square lattice. That is, the modified refractive index regions 13b have the identical figure at all the lattice points, and may be able to overlap on each other between the lattice points by a translation operation or a translation operation and a rotation operation. In that case, it is possible to suppress the modified example in the phase angle caused by the modified example in the planar shape, and the beam pattern can be outputted with high accuracy. Alternatively, the planar shapes of the modified refractive index regions 13b on the X-Y plane may not necessarily be the identical among the lattice points, and as shown in FIG. 29 for example, the shapes may be different from each other between adjacent lattice points.

Third Modified Example

Figure 30:
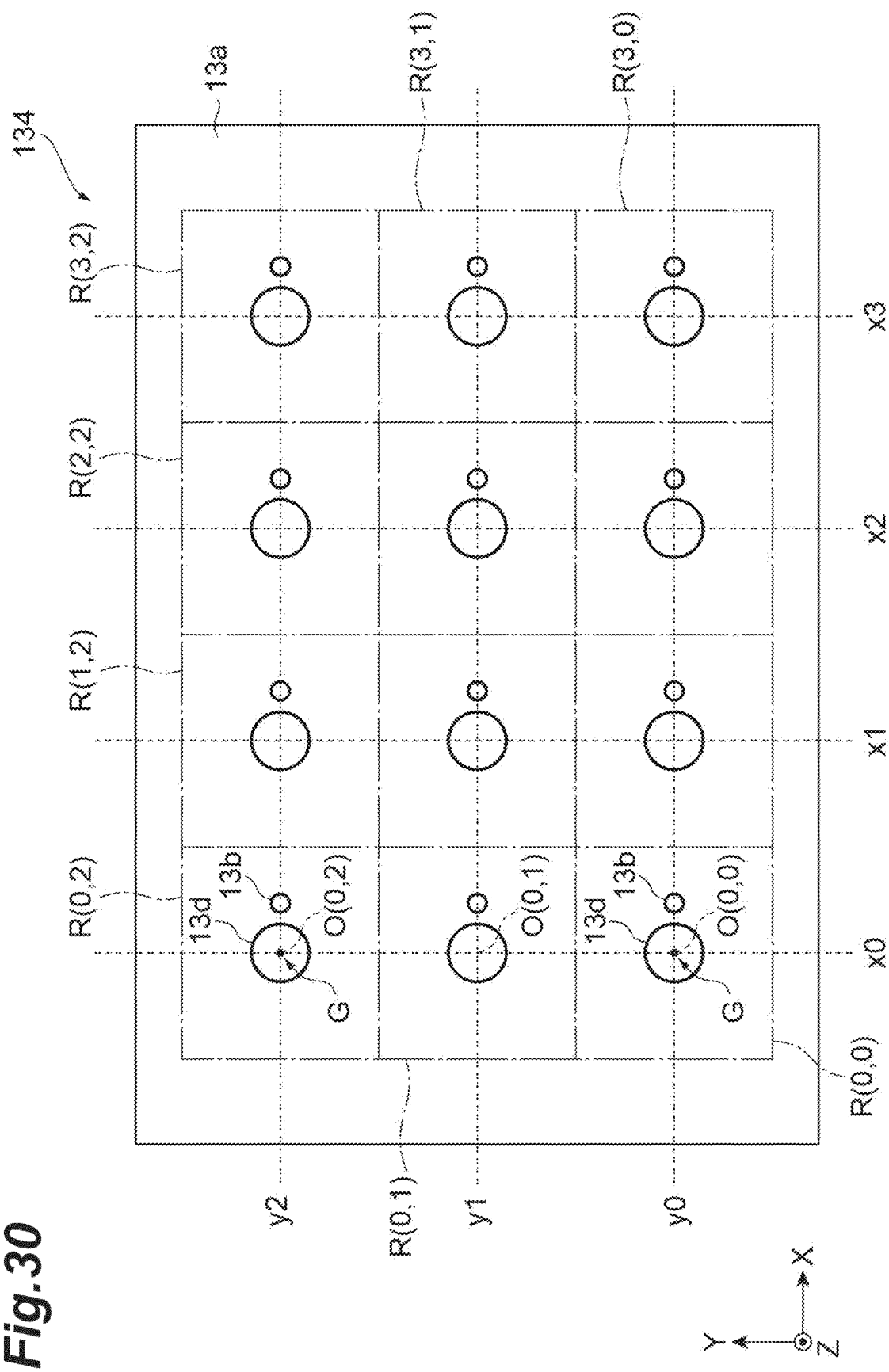
FIG. 30 is a plan view of a second region 134 according to a third modified example.
Figure 31:
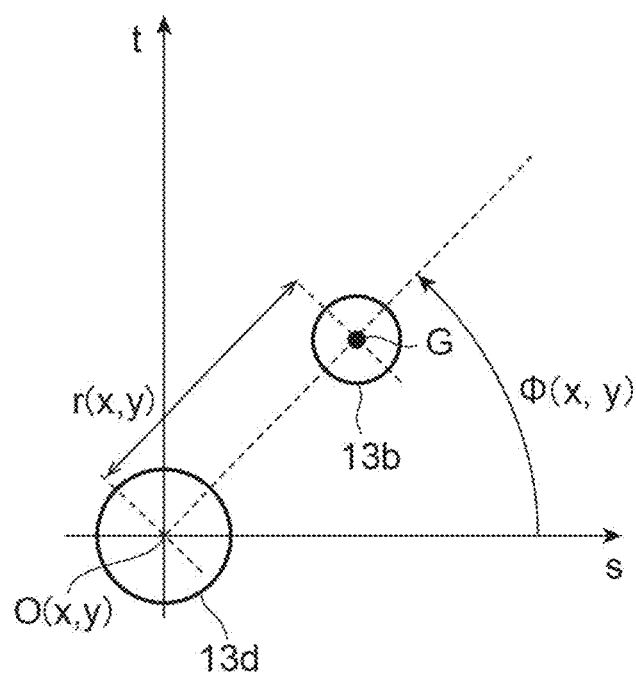
FIG. 31 is a view showing the positional relationship of the modified refractive index region 13b in the second region 134.

FIG. 30 is a plan view of the second region 134 according to the third modified example. The second region 132 of the above embodiment may be replaced with the second region 134 of the present modified example. The second region 134 of the present modified example is further provided with a plurality of modified refractive index regions 13d different from the plurality of modified refractive index regions 13b in addition to the configuration of the second region 132 of the above embodiment. The array of each modified refractive index region 13d includes a periodic structure and includes a second refractive index medium having a refractive index different from that of the first refractive index medium of the base layer 13a. The modified refractive index region 13d, similarly to the modified refractive index region 13b, may be a hole or may be configured by embedding a compound semiconductor in the hole. Here, as shown in FIG. 31, also in the present modified example, in the unit constituent region R (x, y), let the angle formed by the direction from the lattice point O (x, y) toward the center of gravity G of the modified refractive index region 13b and the s-axis (axis that specifies the position in the unit constituent region R and is parallel to the X-axis) be φ (x, y). When the rotation angle φ is 0°, the direction of the vector connecting the lattice point O and the center of gravity G coincides with the positive direction of the s-axis. Let the length of the vector connecting the lattice point O and the center of gravity G be r (x, y). In one example, r (x, y) is constant (over the entire second region 134) regardless of the values of the x component and y component.

Each modified refractive index region 13d is provided corresponding one-to-one to each modified refractive index region 13b (one is assigned to each unit constituent region R). In the unit constituent region R (x, y), the modified refractive index region 13d is positioned on the associated lattice point O (x, y), and in one example, the center of gravity of each modified refractive index region 13d coincides with the lattice point O (x, y). The planar shape of the modified refractive index region 13d is, for example, circular, but similar to the modified refractive index region 13b, it can have various shapes.

Figure 32:
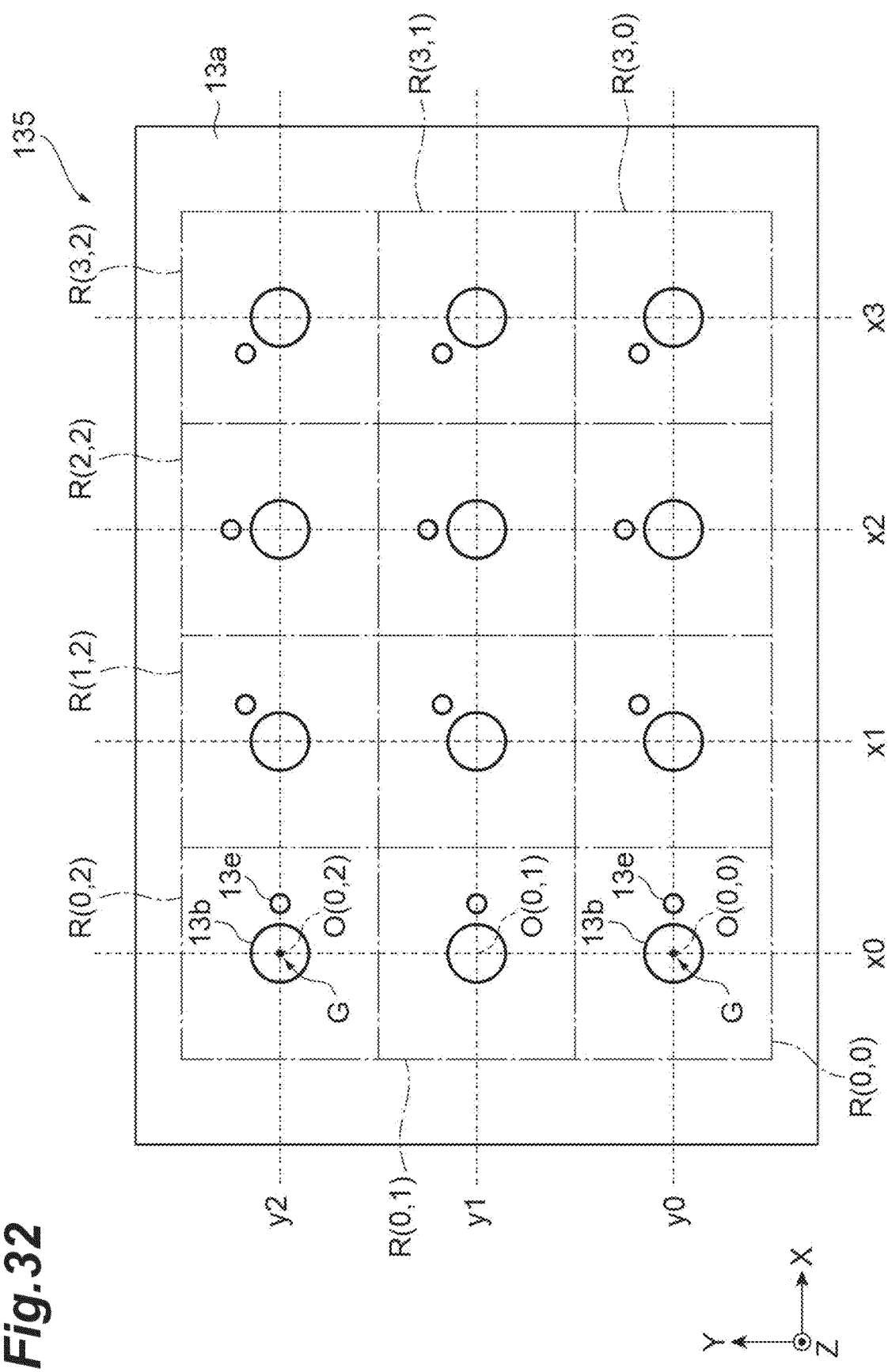
FIG. 32 is a plan view of a first region 135 in the third modified example.

FIG. 32 is a plan view of the first region 135 in the present modified example. The first region 131 of the above embodiment may be replaced with the first region 135 of the present modified example. The first region 135 of the present modified example is further provided with a plurality of modified refractive index regions 13e different from the plurality of modified refractive index regions 13b in addition to the configuration (see FIG. 8) of the first region 131 of the above embodiment. In the unit constituent region R (x, y), the center of gravity of the modified refractive index region 13e is apart from the lattice point O (x, y) and the rotation angle around the lattice point O (x, y) is set to a value not contributing to optical image formation. The modified refractive index regions 13b and 13e may partially overlap each other or may be separated from each other. FIG. 31 shows the case where the planar shapes of the modified refractive index regions 13b and 13e are circular. However, various shapes as shown in FIGS. 28A to 28K, for example, can be applied to the planar shapes of the modified refractive index regions 13b and 13e.

Fourth Modified Example

Figure 33A:
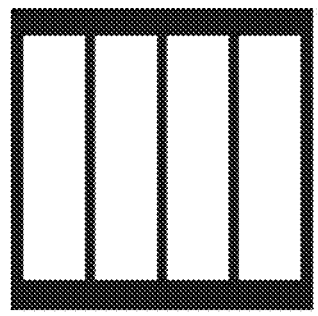
FIGS. 33A to 33F are views showing other examples of planar shapes of a second electrode 32.
Figure 33B:
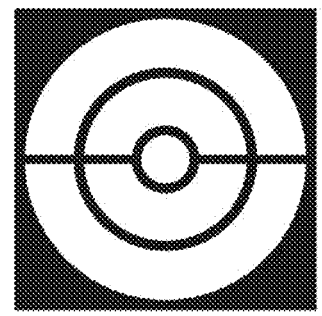
Figure 33C:
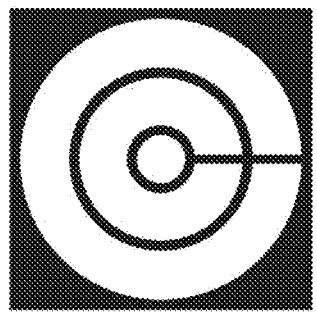

FIGS. 33A to 33F and 34A to 34G are views showing other examples of planar shapes of the second electrode 32. FIG. 33A shows a stripe shape in which a plurality of linear electrode portions extending in the X-axis direction (or Y-axis direction) are aligned along the Y-axis direction (or X-axis direction). These electrode portions are coupled to each other at both ends via another pair of electrode portions extending in the Y-axis direction (or X-axis direction). FIGS. 33B and 33C show shapes in which a plurality of annular electrode portions having diameters different from each other are arranged concentrically (so as to have a common center). The plurality of electrode portions are coupled to each other by a radially extending linear electrode portion. The plurality of linear electrode portions may be provided as shown in FIG. 33B, and only one linear electrode portion may be provided as shown in FIG. 33C.

Figure 33D:
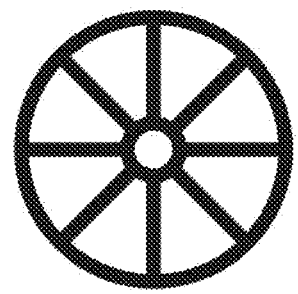
Figure 33E:
Figure 33F:
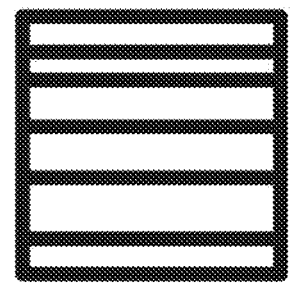

FIG. 33D shows a shape in which a plurality of linear electrode portions radiate from a certain central point. These electrode portions are coupled to each other at both ends via a pair of annular electrode portions centered on the center point. FIG. 33E shows a case where the plurality of linear electrode portions of FIG. 33A are tilted with respect to the X-axis direction (or the Y-axis direction). FIG. 33F shows a case where the spacing between the plurality of linear electrode portions of FIG. 33A is not constant (non-periodic).

Figure 34A:
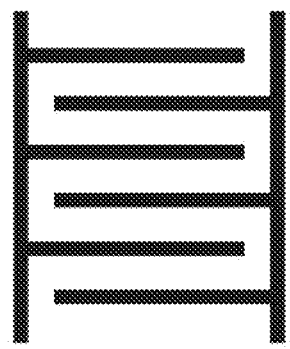
FIGS. 34A to 34G are views showing other examples of planar shapes of the second electrode 32.
Figure 34B:
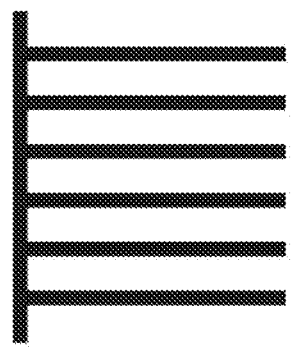

FIG. 34A shows a form in which two interdigitated electrodes in which a plurality of linear electrode portions extending in the X-axis direction (or Y-axis direction) are aligned along the Y-axis direction (or X-axis direction), one end of which is coupled to each other via another electrode portion extending in the Y-axis direction (or X-axis direction) face each other. The plurality of linear electrode portions of one interdigitated electrode and the plurality of linear electrode portions of the other interdigitated electrode are alternately arranged along the Y-axis direction (or the X-axis direction). FIG. 34B shows a shape including only one interdigitated electrode shown in FIG. 34A.

Figure 34C:
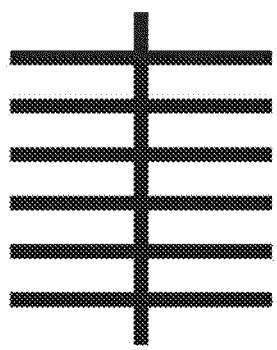
Figure 34D:
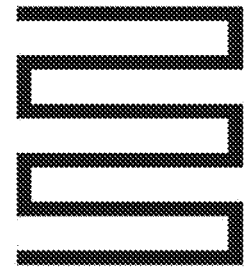
Figure 34E:
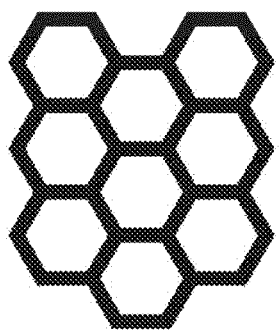
Figure 34F:
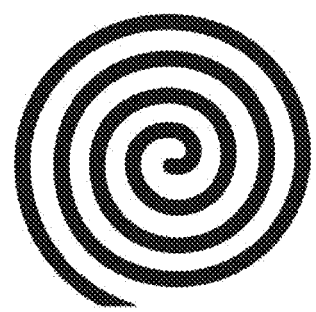
Figure 34G:
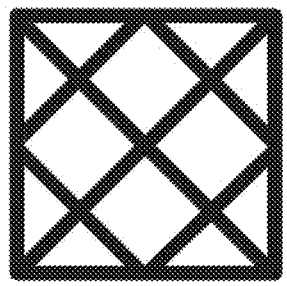

FIG. 34C shows a fishbone shape in which a plurality of linear electrode portions extending in the X-axis direction (or Y-axis direction) are aligned along the Y-axis direction (or X-axis direction), a center portion of which is coupled to each other via another electrode portion extending in the Y-axis direction (or X-axis direction) face each other. FIG. 34D shows a rectangular waveform in which a plurality of linear electrode portions extending in the X-axis direction (or Y-axis direction) are alternately coupled at one end and the other end. FIG. 34E shows a honeycomb shape in which a plurality of hexagonal unit structures are aligned two-dimensionally. FIG. 34F shows a spiral shape. FIG. 34G shows an oblique mesh shape in which a square lattice frame is tilted with respect to the X-axis direction and the Y-axis direction.

Figure 35A:
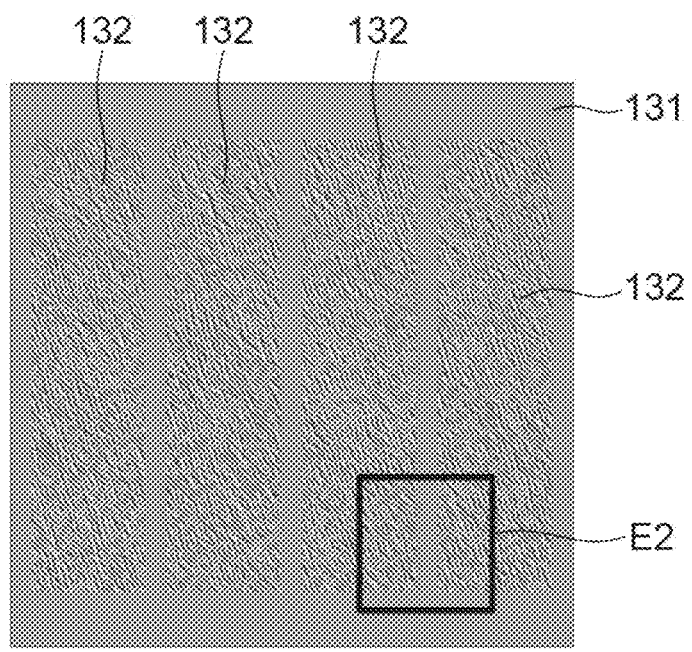
FIG. 35A is a view showing the distribution of the rotation angle φ in the entire current supply unit 32b in a case where the second electrode 32 has a stripe shape.
Figure 35B:
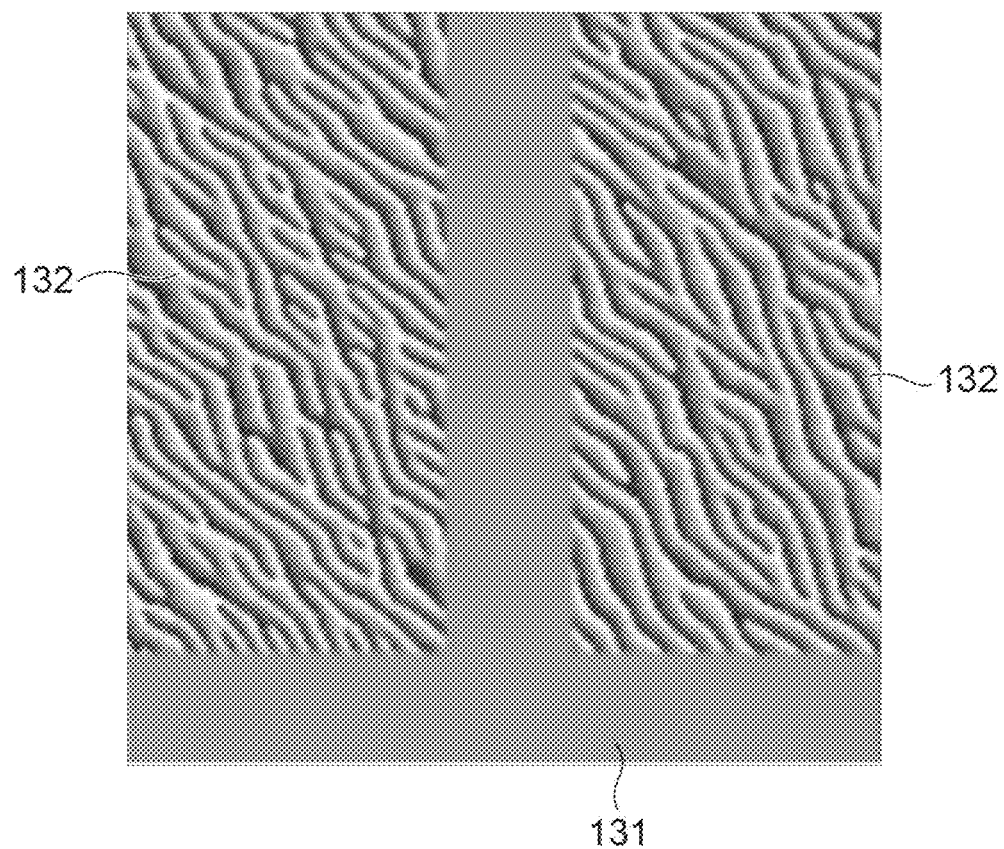
FIG. 35B is an enlarged view showing a part E2 of FIG. 35A.
Figure 36A:
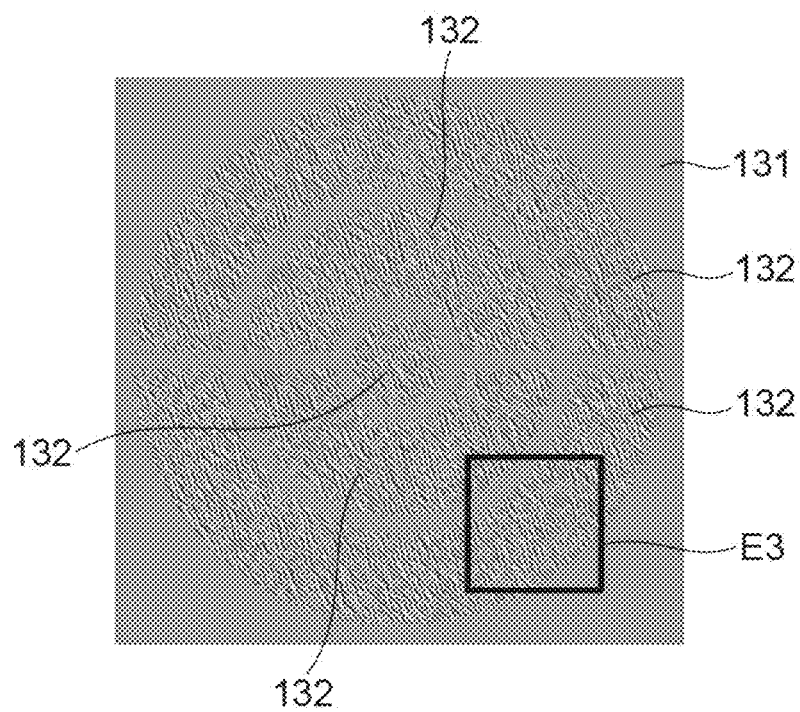
FIG. 36A is a view showing the distribution of the rotation angle φ in the entire current supply unit 32b in a case where the second electrode 32 has a concentric shape.
Figure 36B:
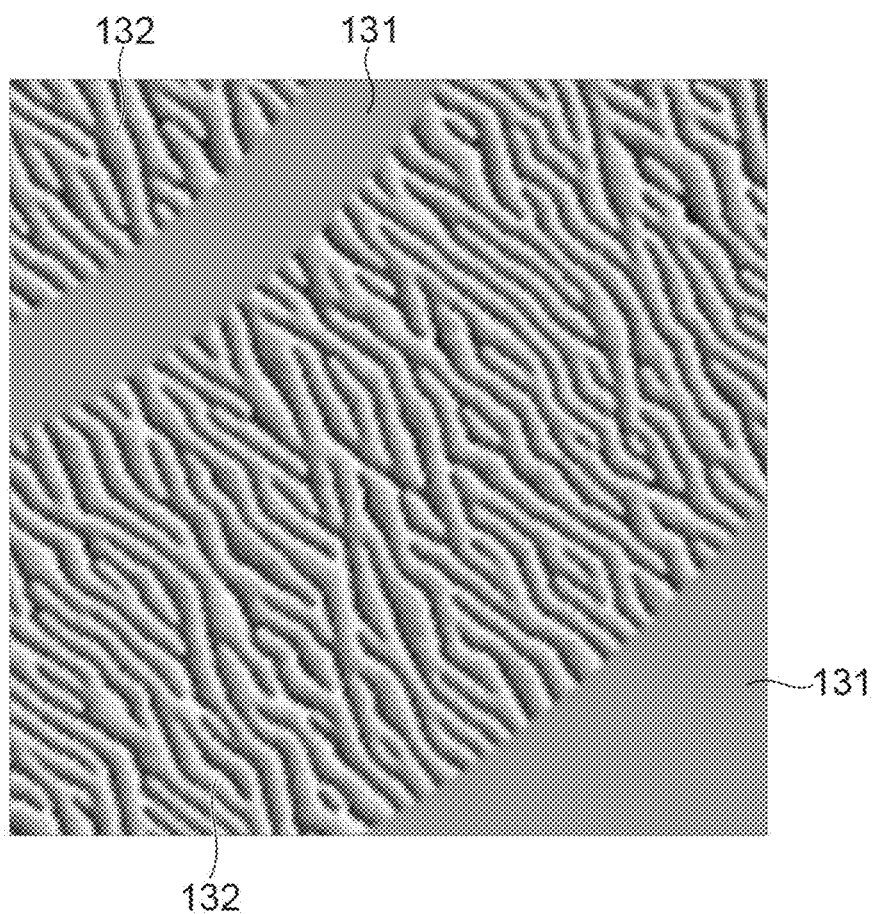
FIG. 36B is an enlarged view showing a part E3 of FIG. 36A.

FIG. 35A is a view showing a distribution (i.e., phase distribution) of the rotation angle φ in the entire current supply unit 32b when the second electrode 32 has the stripe shape shown in FIG. 34A. FIG. 35B is an enlarged view showing the part E2 of FIG. 35A. FIG. 36A is a view showing the distribution of the rotation angle φ in the entire current supply unit 32b in the case where the second electrode 32 has a concentric shape shown in FIG. 34B. FIG. 36B is an enlarged view showing the part E3 of FIG. 36A. FIGS. 35A, 35B, 36A and 36B indicate the magnitude of the rotation angle φ by the tint of color.

The planar shape of the second electrode 32 is not limited to the lattice shape as in the above-described embodiment, but may be various shapes as shown in the present modified example, for example. FIGS. 33A to 33F, 34E, and 34G each have a shape including a plurality of openings. FIGS. 33A, 33E, 33F, and 34A to 34D each have a shape including a plurality of slits. According to any one of the configurations shown in FIGS. 33A to 33F and 34A to 34G, the optical image can be taken out from the front surface 10a of the semiconductor stack 10 while bringing the current density in the active layer 14 more uniform. Each shape includes a portion positioned above the vicinity of the center portion of the active layer 14, and can efficiently disperse the current in the center portion of the active layer 14. In the above embodiment, the optical image is completed as a single beam pattern constituted by only the light components that have passed through the second electrode 32 from the second region 132, and hence even if the second electrode 32 has these shapes, deterioration in the quality of the optical image due to a part of the light outputted from the phase modulation layer 13 being blocked by the second electrode 32 can be suppressed.

Furthermore, in the case of the stripe shape shown in FIG. 33A, 33E, or 33F, even if the positional deviation between the second electrode 32 and the phase modulation layer 13 in the direction along the longitudinal direction of the linear electrode portion becomes large, the overlap between the second electrode 32 and the second region 132 can be suppressed, and hence the positional accuracy of the second electrode 32 can have a margin. Furthermore, as for the current supply to the center portion of the active layer 14, an effect equivalent to that of the lattice shape can be achieved with a coverage smaller than that of the lattice shape (i.e., aperture ratio larger than the lattice shape), and hence the light take-out efficiency can be increased and the resolution of the optical image can be enhanced. The same is true for the interdigitated electrode shown in FIG. 34A or FIG. 34B or the fishbone shape shown in FIG. 34C. In the case of the concentric shape shown in FIGS. 33B and 33C, it is possible to reduce a window function noise. Here, the window function noise is a diffraction pattern generated by periodically arranging the openings. This diffraction pattern is generated along the periodic structure when the periodic structure is aligned one-dimensionally or two-dimensionally. On the other hand, when the periodic structures are aligned concentrically, the diffraction pattern is dispersed in all directions perpendicular to the circumference, and hence the peak value of the window function noise can be reduced.

Fifth Modified Example

Figure 37:
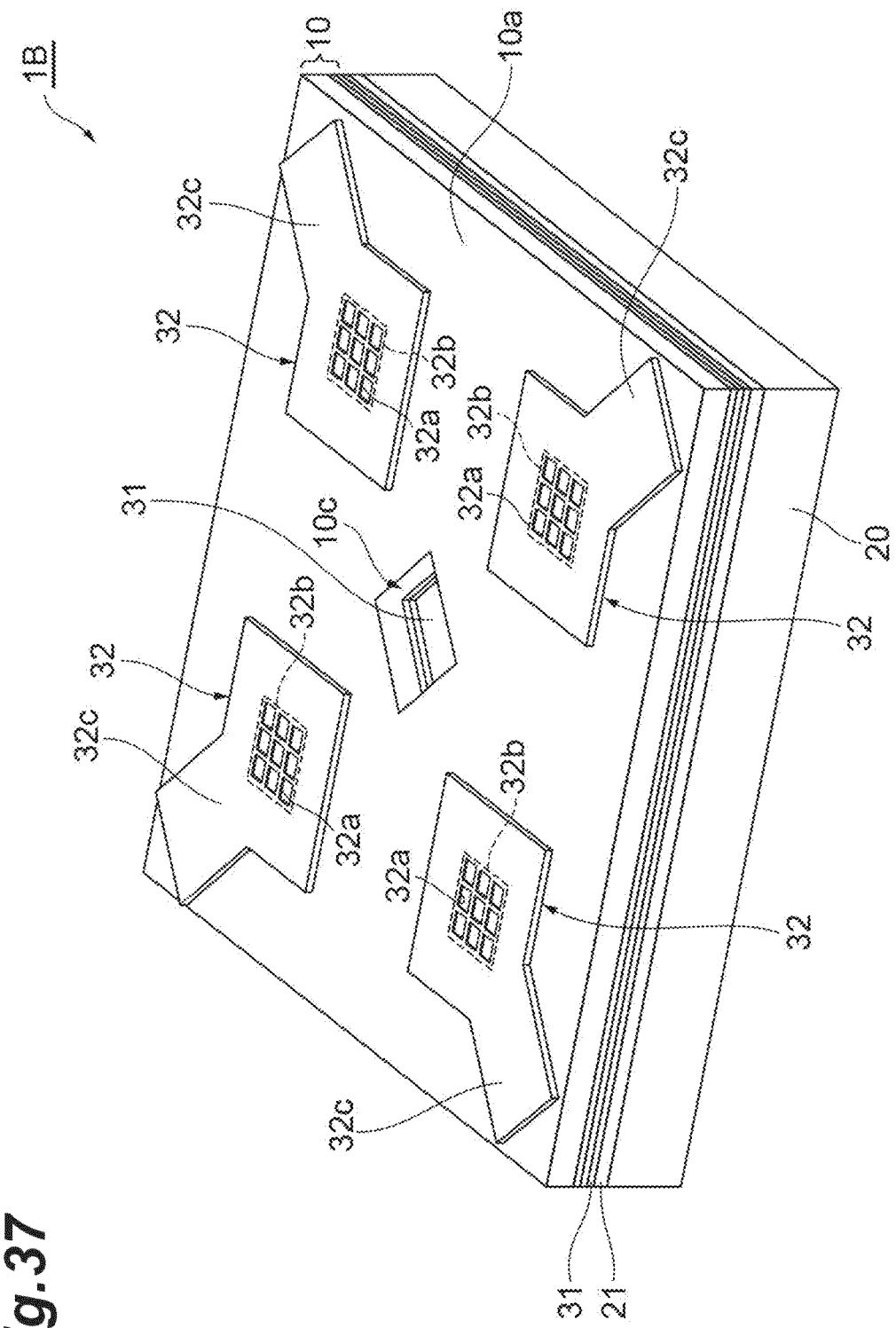
FIG. 37 is a perspective view showing an appearance of a light-emitting element 1B according to a fifth modified example.

FIG. 37 is a perspective view showing an appearance of the light-emitting element 1B according to the fifth modified example. This light-emitting element 1B includes a plurality of (FIG. 37 illustrates four light-emitting elements) second electrodes 32. These second electrodes 32 are arranged at four corners on the rectangular front surface 10a of the semiconductor stack 10, for example. Each second electrode 32 has the current supply unit 32b similarly to that in the above embodiment, and each current supply unit 32b has a square lattice shape having a plurality of openings. Therefore, this light-emitting element 1B outputs an optical image from the four corners of the rectangular front surface 10a. Inside the light-emitting element 1B not illustrated, the second region 132 of the phase modulation layer 13 is provided corresponding to the opening 32a of each current supply unit 32b. Each of these second electrodes 32 has one bonding pad unit 32c, and each bonding pad unit 32c extends from each current supply unit 32b toward a corresponding corner of the rectangular front surface 10a.

Only one recess portion 10c of the present modified example is formed in the center portion of the front surface 10a. That is, a common recess portion 10c is provided to the plurality of second electrodes 32. Then, a current for generating a plurality of optical images each output through the plurality of current supply units 32b is supplied through a portion of the first electrode 31 exposed in this common recess portion 10c. Even the structure of the light-emitting element 1B of the present modified example can also achieve the same effect as that of the above-described embodiment.

Sixth Modified Example

Figure 38:
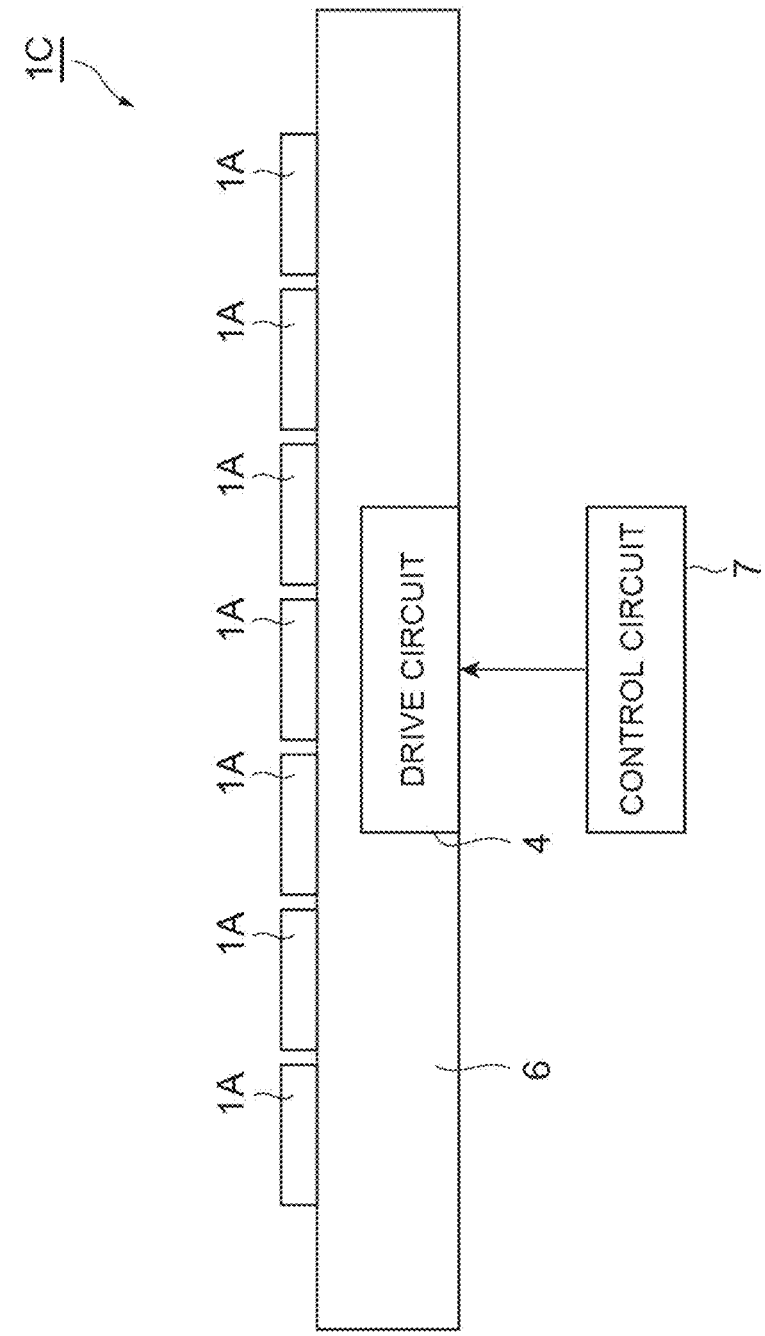
FIG. 38 is a view showing the configuration of a light-emitting apparatus 1C according to a sixth modified example.

FIG. 38 is a view showing the configuration of the light-emitting apparatus 1C according to the sixth modified example. This light-emitting apparatus 1C includes a support substrate 6, a plurality of light-emitting elements 1A arrayed one-dimensionally or two-dimensionally on the support substrate 6, and a drive circuit 4 that individually drives the plurality of light-emitting elements 1A. The configuration of each light-emitting element 1A is the same as that of the above embodiment or any modified example. However, the plurality of light-emitting elements 1A may include a light-emitting element 1A that outputs an optical image in a red wavelength region, a light-emitting element 1A that outputs an optical image in a blue wavelength region, and a light-emitting element 1A that outputs an optical image in a green wavelength region. The light-emitting element 1A that outputs an optical image in the red wavelength region is comprised of, for example, a GaAs semiconductor. The light-emitting element 1A that outputs an optical image in the blue wavelength region and the light-emitting element 1A that outputs an optical image in the green wavelength region are comprised of, for example, a nitride semiconductor. The drive circuit 4 is provided on the back surface or inside of the support substrate 6, and individually drives the light-emitting elements 1A. In response to an instruction from a control circuit 7, the drive circuit 4 supplies a drive current to the individual light-emitting elements 1A.

As in the present modified example, by providing the plurality of individually driven light-emitting elements 1A and taking out a desired optical image from each light-emitting element 1A, it is possible to preferably realize a head-up display or the like by appropriately driving necessary elements for a module in which the light-emitting elements 1A corresponding to a plurality of patterns in advance are aligned. The plurality of light-emitting elements 1A include the light-emitting element 1A that outputs an optical image in the red wavelength region, the light-emitting element 1A that outputs an optical image in the blue wavelength region, and the light-emitting element 1A that outputs an optical image in the green wavelength region, whereby a color head-up display or the like can be preferably realized. The light-emitting element 1A may be replaced with the light-emitting element 1B of the fifth modified example.

Seventh Modified Example

Figure 39:
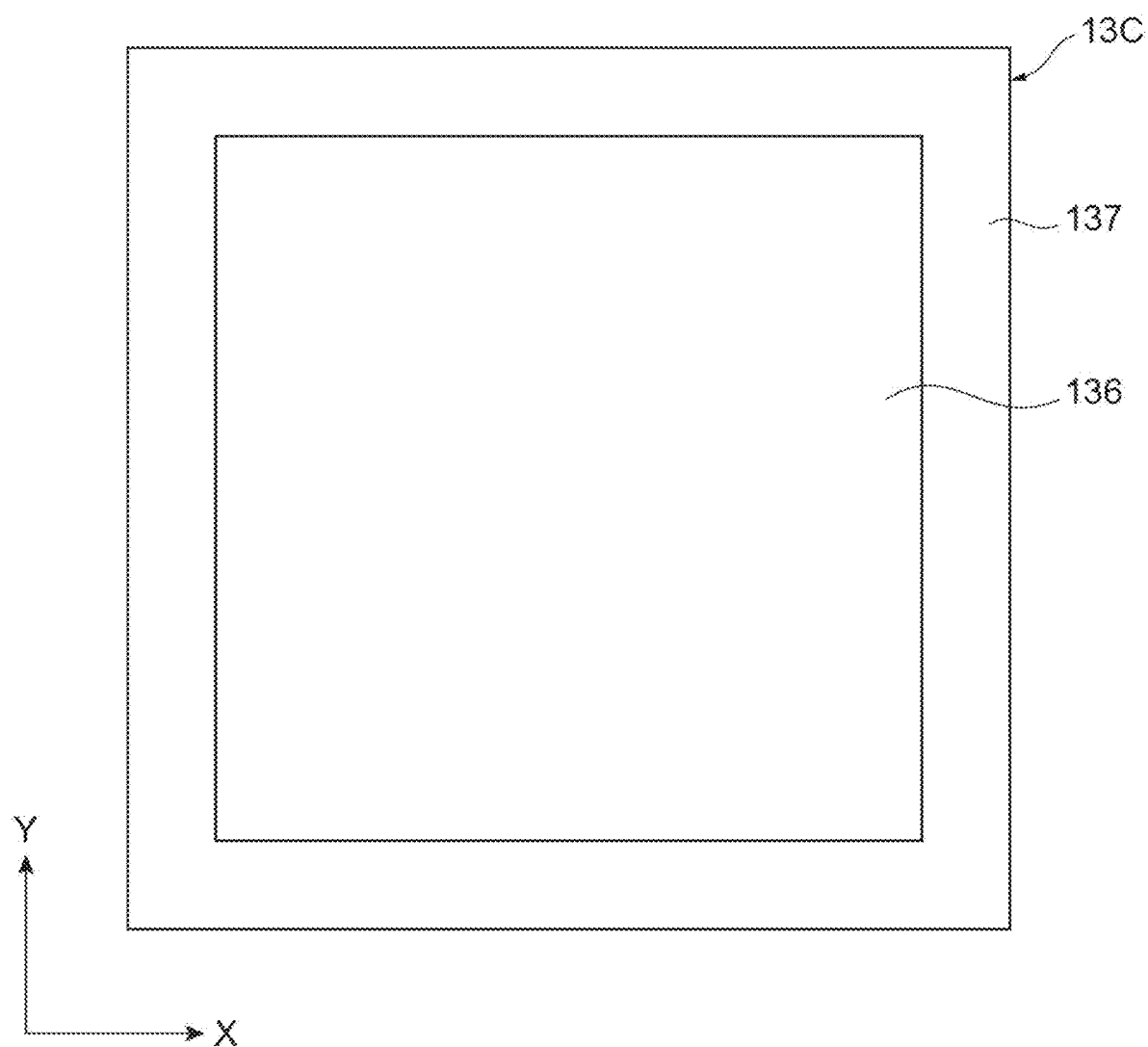
FIG. 39 is a view showing a modified example example of the phase modulation layer, and shows a form viewed from the layer thickness direction.

FIG. 39 is a view showing a modified example example of the phase modulation layer, and shows the form viewed from the layer thickness direction. A phase modulation layer 13C according to the present modified example further has a region 137 in the vicinity of the center portion of the phase modulation layer 13 shown in FIG. 5, i.e., the outer periphery portion of a region (effective area) 136 inclusive of the first region 131 and the second region 132. In the region 137, similarly to the example shown in FIG. 8, the modified refractive index region 13b is provided on each lattice point O of the square lattice. The shape and size of the modified refractive index region 13b of the region 137 are the identical to those of the modified refractive index region 13b of the region 136. The lattice constant of the square lattice of the region 137 is equal to the lattice constant of the square lattice of the region 136. Thus, by surrounding the region 136 by the region 137 in which the modified refractive index region 13b is provided on each lattice point O of the square lattice, light leakage in the in-plane direction can be suppressed, and reduction in threshold current can be expected.

The light-emitting element, the manufacturing method for a light-emitting element, and the phase modulation layer designing method according to the present invention are not limited to the above-described embodiment and modified examples, and various other modified examples are possible. For example, a laser element including a compound semiconductor of GaAs, InP, and nitride (in particular, GaN) is illustrated in the above embodiment and examples. However, the present invention can be applied to a light-emitting element including various semiconductor materials other than these.

The growth substrate is completely removed in the above embodiment. However, a part of the growth substrate may remain and the remaining growth substrate may be used as a second contact layer. In that case, the semiconductor stack includes a part of the growth substrate, and the front surface of the flat semiconductor stack is constituted of the growth substrate.

When unevenness is generated at the interface between the first electrode and the semiconductor stack, a light absorbing layer may be provided between the first electrode and the semiconductor stack. This reduces light with disturbed phase reflected from the first electrode from being mixed into the optical image, and can give a clearer optical image.

If an etch stop layer is not required when the growth substrate is etched, the second contact layer may be omitted from the semiconductor stack.

The recess portion is formed on the front surface side of the semiconductor stack in the above embodiment. However, a recess portion may be formed on the back surface side of the semiconductor stack (i.e., back surface side of the support substrate), and the first electrode may be exposed on the bottom surface of the recess portion. In that case, the recess portion penetrates the bonding layer. The formation of the recess portion may be omitted if the support substrate has conductivity and the support substrate can be electrically connected with the first electrode.

REFERENCE SIGNS LIST 1A, 1B . . . Light-emitting element; 1C . . . Light-emitting apparatus; 4 . . . Drive circuit; . . . 6 . . . Support substrate; 7 . . . Control circuit; 9 . . . Light-emitting unit; 10 . . . Semiconductor stack; 10a . . . Front surface; 10b . . . Back surface; 10c . . . Recess portion; 11 . . . Lower contact layer; 12 . . . Lower cladding layer; 13, 13C . . . Phase modulation layer; 13a . . . Base layer; 13b, 13c, 13d, 13e . . . Modified refractive index region;

13b1, 13b2 ... Region; 14 ... Active layer; 15 ... Upper cladding layer; 16 ... Upper contact layer; 17 ... Light guide layer; 17a ... Carrier barrier layer; 19 ... Light guide layer; 20 ... Substrate; 20a ... Main surface; 21 ... Bonding layer; 22 ... Insulation layer; 22a ... Opening; 23 ... Antireflection film; 31 ... First electrode; 32 ... Second electrode; 32a ... Opening; 32b ... Current supply unit; 32c ... Bonding pad unit; 40 ... Growth substrate; 40a ... Main surface; 131, 135 ... First region; 132, 133, 134 ... Second region; 136, 137 ... Region; D ... Straight line; FR ... Image region; G ... Center of gravity; O ... Lattice point; and R ... Unit constituent region.

The invention claimed is:

1. A light-emitting element, comprising:
a substrate having a main surface;
a light-emitting unit configured to output light for forming an optical image along a normal direction of the main surface or a tilt direction intersecting the normal direction, or both the normal direction and the tilt direction; and
a bonding layer provided between the substrate and the light-emitting unit, and bonding the main surface of the substrate and the light-emitting unit, wherein
the light-emitting unit has:
a semiconductor stack having a back surface and a front surface positioned on an opposite side of the bonding layer with respect to the back surface, the semiconductor stack including a first cladding layer of a first conductivity type provided between the back surface and the front surface, a second cladding layer of a second conductivity type provided between the first cladding layer and the front surface, an active layer provided between the first cladding layer and the second cladding layer, and a phase modulation layer provided between the first cladding layer and the second cladding layer;
a first electrode in contact with the back surface of the semiconductor stack; and
a second electrode in contact with the front surface of the semiconductor stack, and wherein
the phase modulation layer includes a base layer and a plurality of modified refractive index regions each having a refractive index different from a refractive index of the base layer, and includes:
a first region having been set to have a size including an entire part positioned in an effective area of the second electrode when viewed from a thickness direction from the front surface toward the back surface of the semiconductor stack, the effective area defined as an area where the light for forming the optical image is outputted; and
a second region other than the first region,
on a virtual square lattice set on a reference plane of the phase modulation layer orthogonal to the thickness direction, each of the plurality of modified refractive index regions is associated with any one of lattice points of the virtual square lattice, and a center of gravity of each specific modified refractive index region included in the plurality of modified refractive index regions and positioned in the second region is arranged on the reference plane according to a first array condition or a second array condition,
the first array condition is defined in such a manner that the center of gravity of each specific modified refractive index region is separated from the associated lattice point, and a rotation angle around the associated lattice point, which is defined by an angle formed by a line segment extending from the associated lattice point to the center of gravity and the virtual square lattice, is individually set according to a phase distribution for forming the optical image,
the second array condition is defined in such a manner that the center of gravity of each specific modified refractive index region is positioned on a straight line passing through the associated lattice point in a tilting state with respect to the virtual square lattice, and a distance from the associated lattice point to the center of gravity is individually set according to the phase distribution,
the light for forming the optical image is outputted from the front surface of the semiconductor stack, and the optical image is completed as a single beam pattern including only light components having passed through the second electrode from the second region, and
in a specific region on the main surface of the substrate overlapping the effective area when viewed along the thickness direction, a first variation amount of a first distance from the main surface to the front surface of the semiconductor stack at a plurality of first points aligned along a first straight line on the main surface, and a second variation amount of a second distance from the main surface to the back surface of the semiconductor stack at the plurality of first points satisfy a relationship: (first variation amount)<(second variation amount), and a third variation amount of the first distance at a plurality of second points aligned along a second straight line on the main surface intersecting the first straight line, and a fourth variation amount of the second distance at the plurality of second points satisfy a relationship: (third variation amount)<(fourth variation amount).

2. The light-emitting element according to claim 1, wherein the active layer includes Ga, In, and P as compositions.

3. The light-emitting element according to claim 1, wherein the bonding layer includes a resin.

4. The light-emitting element according to claim 1, wherein a planar shape of the second electrode when viewed along the thickness direction includes a plurality of openings.

5. The light-emitting element according to claim 1, wherein a planar shape of the second electrode when viewed along the thickness direction includes a plurality of slits.

6. The light-emitting element according to claim 1, wherein a planar shape of the second electrode when viewed along the thickness direction is a lattice shape, a stripe shape, a concentric shape, a radial shape, or an interdigitated shape.

7. The light-emitting element according to claim 1, further comprising a recess portion extending from the front surface to the first electrode.

8. The light-emitting element according to claim 1, wherein a center of gravity of each modified refractive index region positioned in the first region among the plurality of modified refractive index regions is arranged on the associated lattice point, or a rotation angle around the associated lattice point is individually set to an angle irrelevant to formation of the optical image in a state of being separated from the associated lattice point.

9. The light-emitting element according to claim 1, wherein a width W1 of the first region defined along a direction orthogonal to the thickness direction and a width W2 of the part of the second electrode positioned in the effective area when viewed from the thickness direction satisfy a relationship: W1>W2.

10. The light-emitting element according to claim 1, wherein the semiconductor stack further includes a contact layer provided between the second cladding layer and the second electrode in a state of being in contact with the second electrode.

11. A method for manufacturing the light-emitting element defined in claim 1, comprising:
- a step of preparing a growth substrate;
- a step of sequentially growing layers constituting the semiconductor stack on the growth substrate so that the second cladding layer comes into contact with the growth substrate;
- a step of forming the first electrode on the semiconductor stack such that the semiconductor stack is sandwiched between the growth substrate and the first electrode;
- a step of bonding the main surface of the substrate to the first electrode via the bonding layer;
- a step of removing the growth substrate; and
- a step of forming the second electrode on the front surface of the semiconductor stack such that the semiconductor stack is sandwiched between the first electrode and the second electrode.

12. A method for manufacturing the light-emitting element defined in claim 10, comprising:
- a step of preparing a growth substrate;
- a step of sequentially growing layers constituting the semiconductor stack on the growth substrate so that the contact layer comes into contact with the growth substrate;
- a step of forming the first electrode on the semiconductor stack such that the semiconductor stack is sandwiched between the growth substrate and the first electrode;
- a step of bonding the main surface of the substrate to the first electrode via the bonding layer;
- a step of removing the growth substrate by etching by using the contact layer as an etch stop layer; and
- a step of forming the second electrode on the front surface of the semiconductor stack such that the semiconductor stack is sandwiched between the first electrode and the second electrode.

13. A method for designing the phase modulation layer of the light-emitting element defined in claim 1, wherein
under a constraint condition defined in such a manner that a position of the center of gravity of each modified refractive index region positioned in the first region among the plurality of modified refractive index regions has a certain rotation angle on the associated lattice point or around the associated lattice point in a state of being away from the associated lattice point, a position of the center of gravity of each modified refractive index region positioned in the second region among the plurality of modified refractive index regions is calculated by iterative calculation based on the optical image to be formed.

* * * * *